United States Patent
Hussein

(10) Patent No.: US 10,333,044 B2
(45) Date of Patent: Jun. 25, 2019

(54) PHONONIC METAMATERIALS ADAPTED FOR REDUCED THERMAL TRANSPORT

(71) Applicant: The Regents of the University of Colorado, a body corporate, Denver, CO (US)

(72) Inventor: Mahmoud I. Hussein, Superior, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/956,289

(22) Filed: Apr. 18, 2018

(65) Prior Publication Data

US 2018/0309039 A1    Oct. 25, 2018

Related U.S. Application Data

(63) Continuation-in-part of application No. 15/289,921, filed on Oct. 10, 2016, which is a continuation-in-part
(Continued)

(51) Int. Cl.
*H01L 35/04* (2006.01)
*H01L 35/34* (2006.01)
(Continued)

(52) U.S. Cl.
CPC .............. *H01L 35/04* (2013.01); *G02B 1/002* (2013.01); *G10K 11/162* (2013.01);
(Continued)

(58) Field of Classification Search
CPC ......... H01L 35/04; H01L 35/16; H01L 35/20; H01L 35/22; H01L 35/26; H01L 35/30; H01L 35/32; H01L 35/34
See application file for complete search history.

(56) References Cited

U.S. PATENT DOCUMENTS 8,957,299 B2    2/2015  Kim et al.
9,417,465 B2    8/2016  Hussein et al.
(Continued)

OTHER PUBLICATIONS

C.J. Vineis, A. Shakouri, A. Majumdar, and M.G. Kanalzidis, Adv. Mater. 22, 3970 (2010), 11 pages.
(Continued)

*Primary Examiner* — Cuong Q Nguyen
(74) *Attorney, Agent, or Firm* — FisherBroyles, LLP; Thomas J. Osborne, Jr.

(57) ABSTRACT

Phononic metamaterials and methods for reducing the group velocities and the thermal conductivity in at least partially crystalline base material are provided, such as for thermoelectric energy conversion. In one implementation, a method for reducing thermal conductivity through an at least partially crystalline base material is provided. In another implementation, a phononic metamaterial structure is provided. The phononic metamaterial structure in this implementation includes: an at least partially crystalline base material configured to allow a plurality of phonons to move to provide thermal conduction through the base material; and at least one material coupled (e.g., as an inclusion, extending substructure, outer matrix, a coating to heavy inner inclusion, etc.) to the at least partially crystalline base material via at least one relatively compliant or soft material (e.g., graphite, rubber or polymer). The inclusion, extending substructure matrix or coating material is configured to generate at least one vibration mode by the oscillation of at least one atom within the resonating material to interact with the plurality of phonons moving within the base material and slow group velocities of at least a portion of the interacting phonons and reduce thermal conductivity through the base material.

25 Claims, 49 Drawing Sheets

Related U.S. Application Data of application No. 15/238,711, filed on Aug. 16, 2016, now abandoned, which is a continuation-in-part of application No. 14/247,228, filed on Apr. 7, 2014, now Pat. No. 9,417,465.

(60) Provisional application No. 61/809,399, filed on Apr. 7, 2013.

(51) Int. Cl.
    *H01L 35/26*     (2006.01)
    *G02B 1/00*     (2006.01)
    *H01L 35/14*     (2006.01)
    *G10K 11/162*     (2006.01)
    *G10K 11/172*     (2006.01)
    *B82B 1/00*     (2006.01)
    *B82Y 20/00*     (2011.01)
    *B82Y 30/00*     (2011.01)

(52) U.S. Cl.
CPC ............ *G10K 11/172* (2013.01); *H01L 35/14* (2013.01); *H01L 35/26* (2013.01); *H01L 35/34* (2013.01); *B82B 1/005* (2013.01); *B82Y 20/00* (2013.01); *B82Y 30/00* (2013.01); *Y10S 977/833* (2013.01); *Y10S 977/932* (2013.01)

(56) References Cited

U.S. PATENT DOCUMENTS

| | | |
|---|---|---|
| 2002/0172820 A1 | 11/2002 | Majumdar et al. |
| 2003/0049444 A1 | 3/2003 | Dai et al. |
| 2007/0230135 A1 | 10/2007 | Feger et al. |
| 2008/0173344 A1 | 7/2008 | Zhang et al. |
| 2009/0277609 A1 | 11/2009 | Chang et al. |
| 2010/0003516 A1 | 1/2010 | Majumdar et al. |
| 2010/0139289 A1 | 6/2010 | Barker et al. |
| 2010/0214034 A1 | 8/2010 | Peng et al. |
| 2012/0097204 A1 | 4/2012 | Yu et al. |
| 2016/0359096 A1 | 12/2016 | Yang et al. |
| 2017/0077375 A1* | 3/2017 | Moon ................ H01L 35/34 |
| 2018/0097167 A1* | 4/2018 | Nishide ............. H01L 35/20 |
| 2018/0257937 A1* | 9/2018 | Ren .................. H01L 35/16 |
| 2019/0019935 A1* | 1/2019 | Nishide ............. H01L 35/26 |

OTHER PUBLICATIONS

J. Tang, H.-T. Wang, D. H. Lee, M. Fardy, Z. Huo, T. P. Russell, and P. Yang, Nano Lett. 10, 4279 (2010), 5 pages.

J. K. Yu, S. Mitrovic, D. Tham, J. Varghese, and J. R. Heath, Nat. Nanotechnol. 5, 718 (2010), 4 pages.

B. L. Davis and M. I. Hussein, AIP Adv. 1, 041701 (2011), 16 pages.

J. B. Pendry, A. J. Holden, D. J. Robbins, and W. J. Stewart, IEEE Trans. Microwave Theory Tech. 47, 2075 (1999), 10 pages.

D. R. Smith, W. J. Padilla, D. C. Vier, S.C. Nemat-Nasser, and S. Schultz, Phys. Rev. Lett. 84,4184 (2000), 4 pages.

S. Y. Liu, X. X. Zhang, Y.W. Mao, Y. Y. Zhu, Z. Y. Yang, C. T. Chan, and P. Sheng, Science 289, 1734 {2000), 4 pages.

International Search Report and Written Opinion dated Oct. 28, 2014 in co-pending International Application No. PCT/US2014/033237 filed Apr. 7, 2014, 10 pages.

\* cited by examiner

2D NANOPHONONIC METAMATERIALS WITH 1D RESONATORS
2A: ORDERED RESONATORS, SINGLE-SIDED
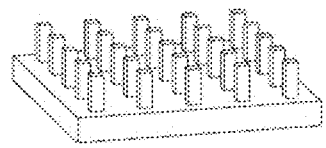
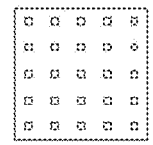
2B: ORDERED RESONATORS, DOUBLE-SIDED
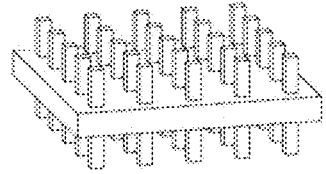
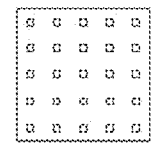
2C: ORDERED RESONATORS, EMPTY SPACE BETWEEN GROUPS OF RESONATORS
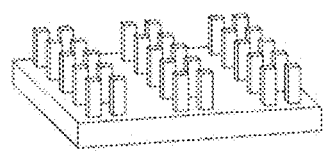
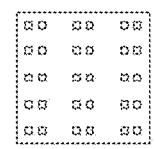
2D: ORDERED RESONATORS, MULTIPLE RESONATORS OF DIFFERENT HEIGHTS PER UNIT CELL
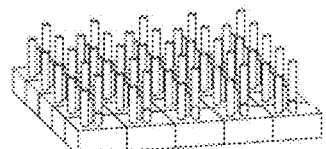
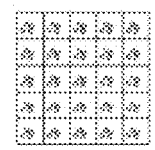
2E: ORDERED RESONATORS, MULTIPLE RESONATORS OF DIFFERENT THICKNESSES PER UNIT CELL
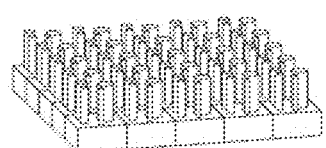
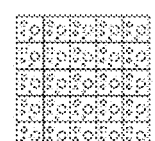
FIG. 2

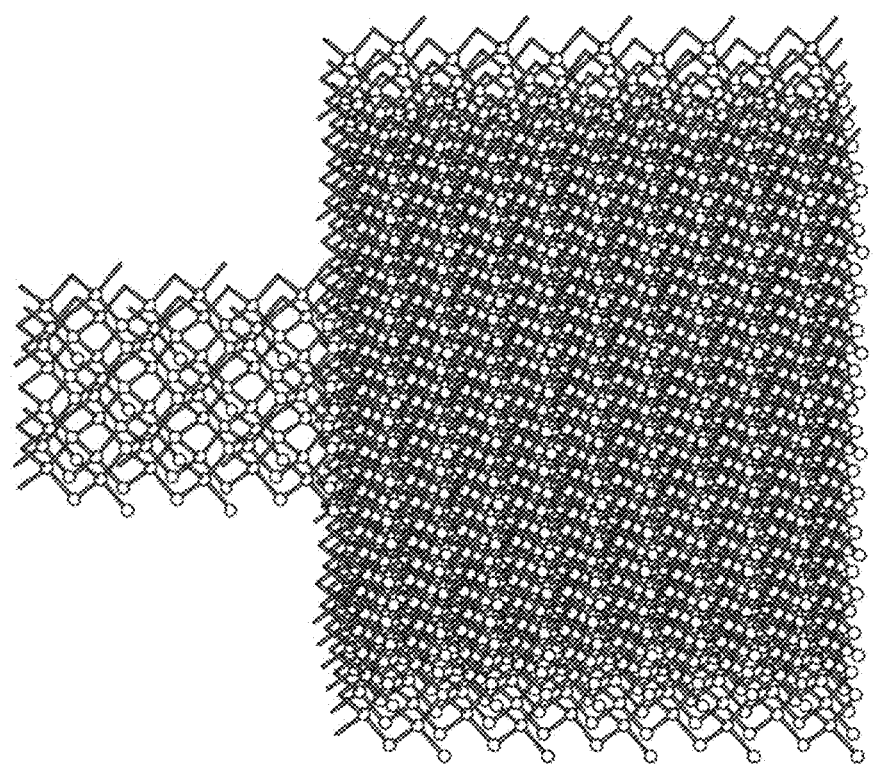

2D NANOPHONONIC METAMATERIALS WITH 1D RESONATORS
(CONTINUED)

A: RESONATORS ORDERED IN POSITION AND HEIGHT, RANDOM IN THICKNESS

B: RESONATORS ORDERED IN POSITION AND THICKNESS, RANDOM IN HEIGHT

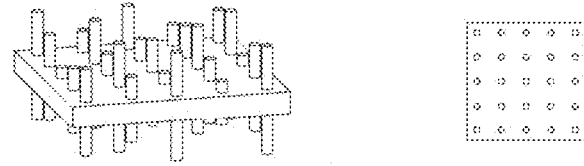

C: RESONATORS RANDOM IN POSITION AND HEIGHT, ORDERED IN THICKNESS

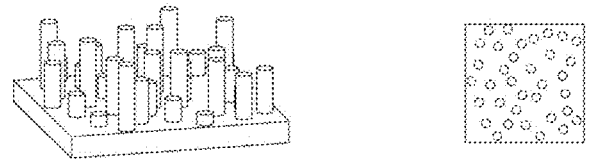

D: RESONATORS RANDOM IN POSITION AND THICKNESS, ORDERED IN HEIGHT

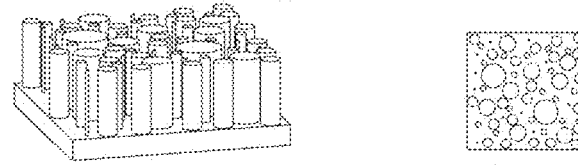

E: RESONATORS RANDOM IN POSITION, HEIGHT AND IN THICKNESS

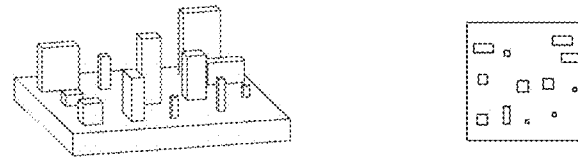

F: STACKED 2D NANOPHONONIC METAMATERIAL (E.G., STACKED THIN-FILMS WITH COLUMNS IN BETWEEN)

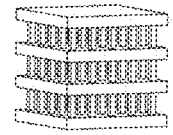

FIG. 9

2D NANOPHONONIC METAMATERIALS WITH EMBEDDED RESONATORS
A: INTERNAL LOCALIZED RESONATOR
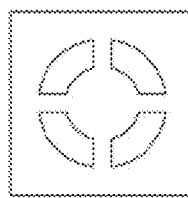
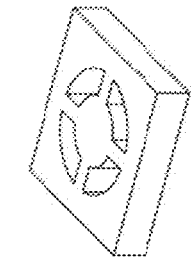
B: RESONATOR CONSISTING OF AN INCLUSION MADE OUT OF A MATERIAL SIGNIFICANTLY MORE COMPLIANT THAN THE BASE MATERIAL
FIG. 10

2D NANOPHONONIC METAMATERIALS WITH 2D RESONATORS
A: ORDERED, WALL-LIKE RESONATORS ALIGNED ALONG A SINGLE DIRECTION
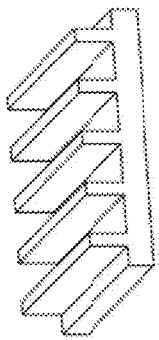 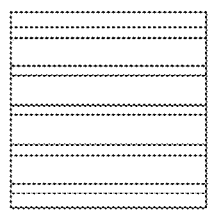
B: ORDERED, WALL-LIKE RESONATORS ALIGNED ALONG MULTIPLE DIRECTIONS
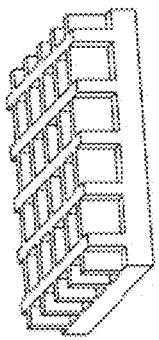 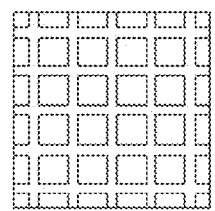
FIG. 11

1D NANOPHONONIC METAMATERIALS WITH 1D RESONATORS
A: ORDERED, UNIFORM HEIGHT OF PILLARS IN THE UNIT CELL
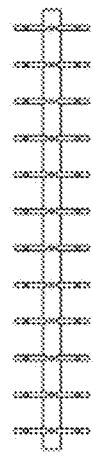 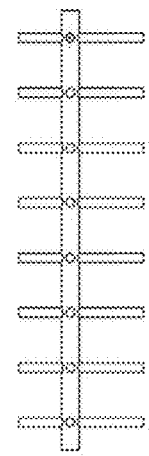
B: ORDERED, MULTIPLE HEIGHTS OF PILLARS IN THE UNIT CELL
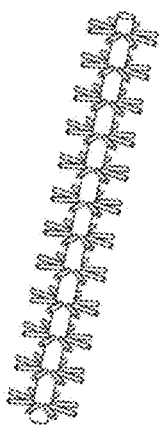 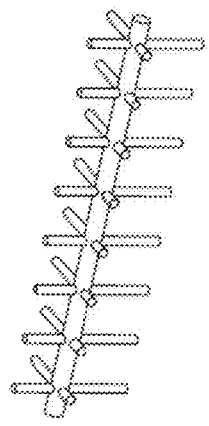
FIG. 12

1D NANOPHONONIC METAMATERIALS WITH 2D RESONATORS
A: ORDERED, DISK-LIKE RESONATORS WITH UNIFORM RADIUS
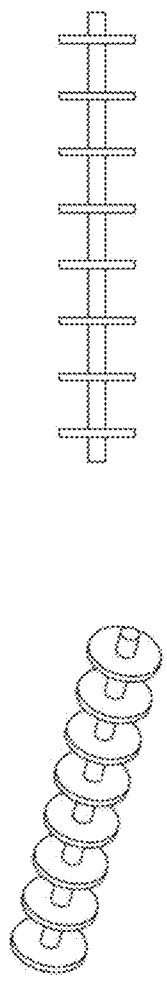
B: ORDERED, DISK-LIKE RESONATORS WITH MULTIPLE RADII IN THE UNIT CELL
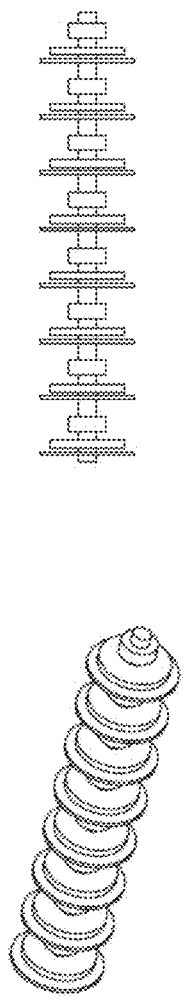
FIG. 13

3D NANOPHONONIC METAMATERIALS WITH EMBEDDED RESONATOR
A: INTERNAL LOCALIZED RESONATOR
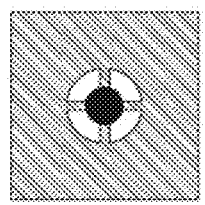
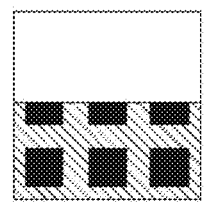
B: RESONATOR CONSISTING OF AN INCLUSION MADE OUT OF A MATERIAL SIGNIFICANTLY MORE COMPLIANT THAN THE BASE MATERIAL
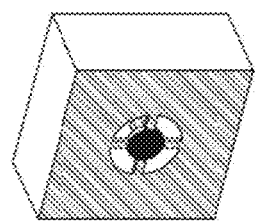
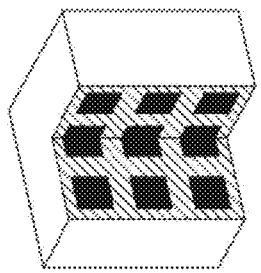
FIG. 14

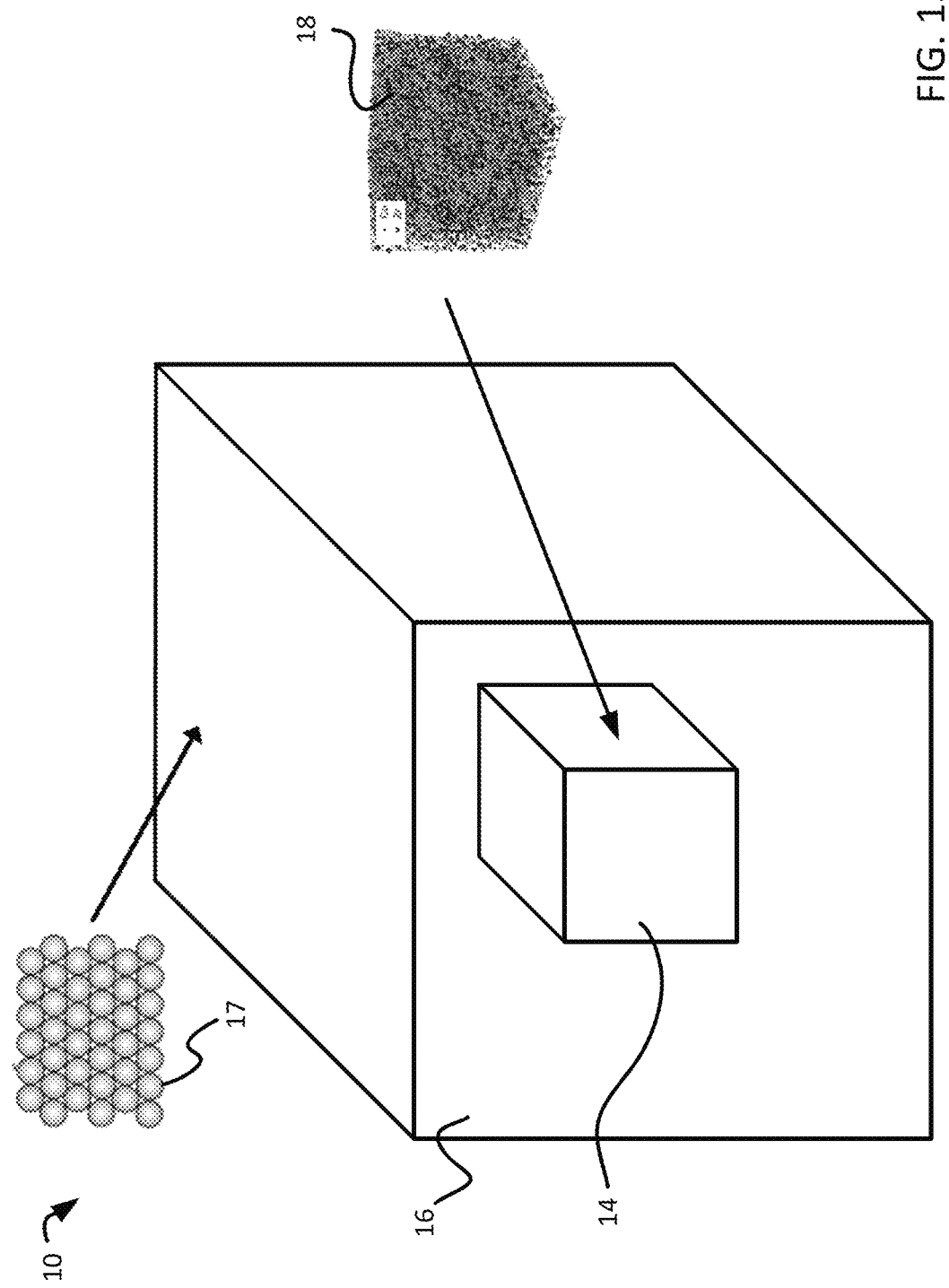

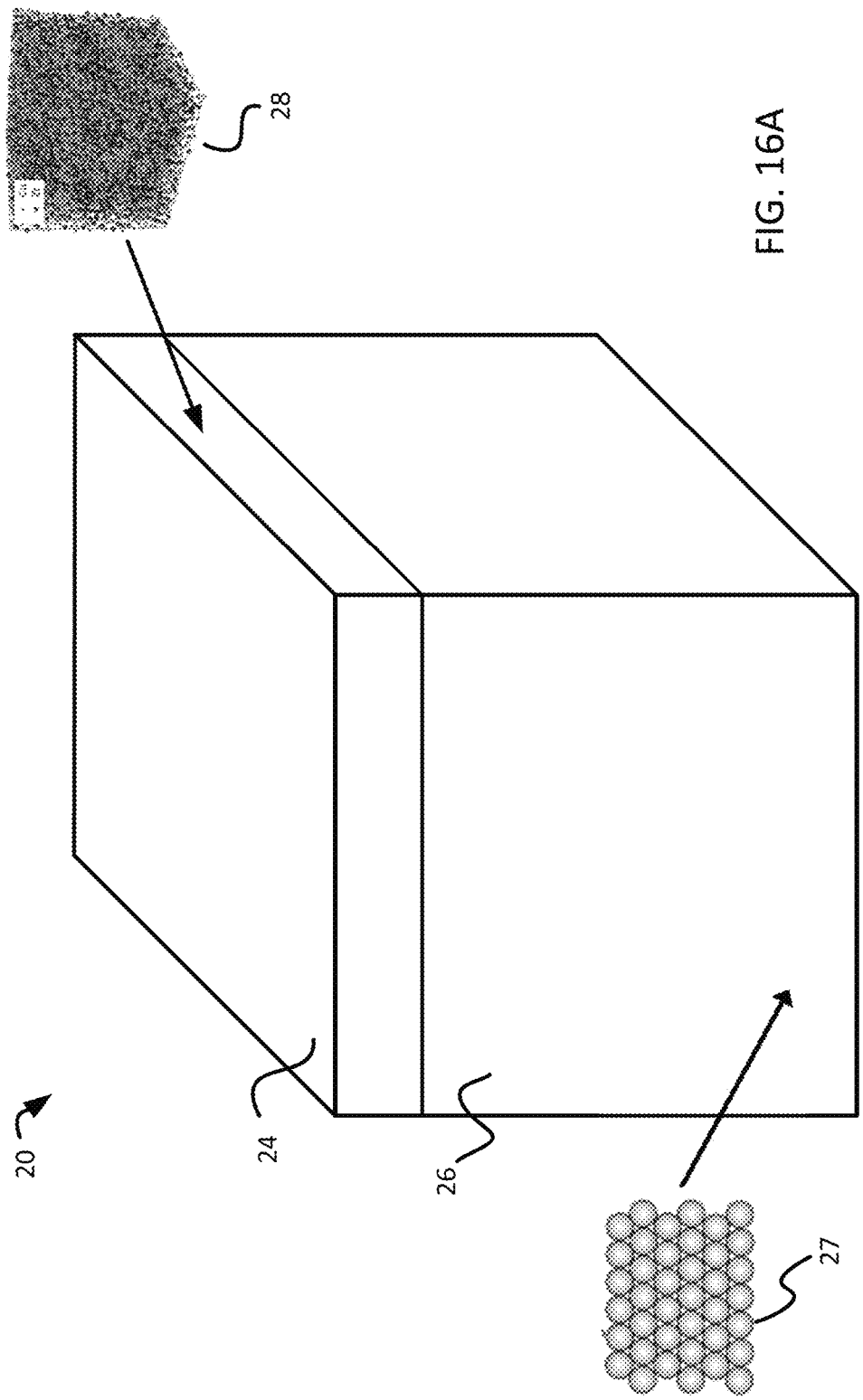

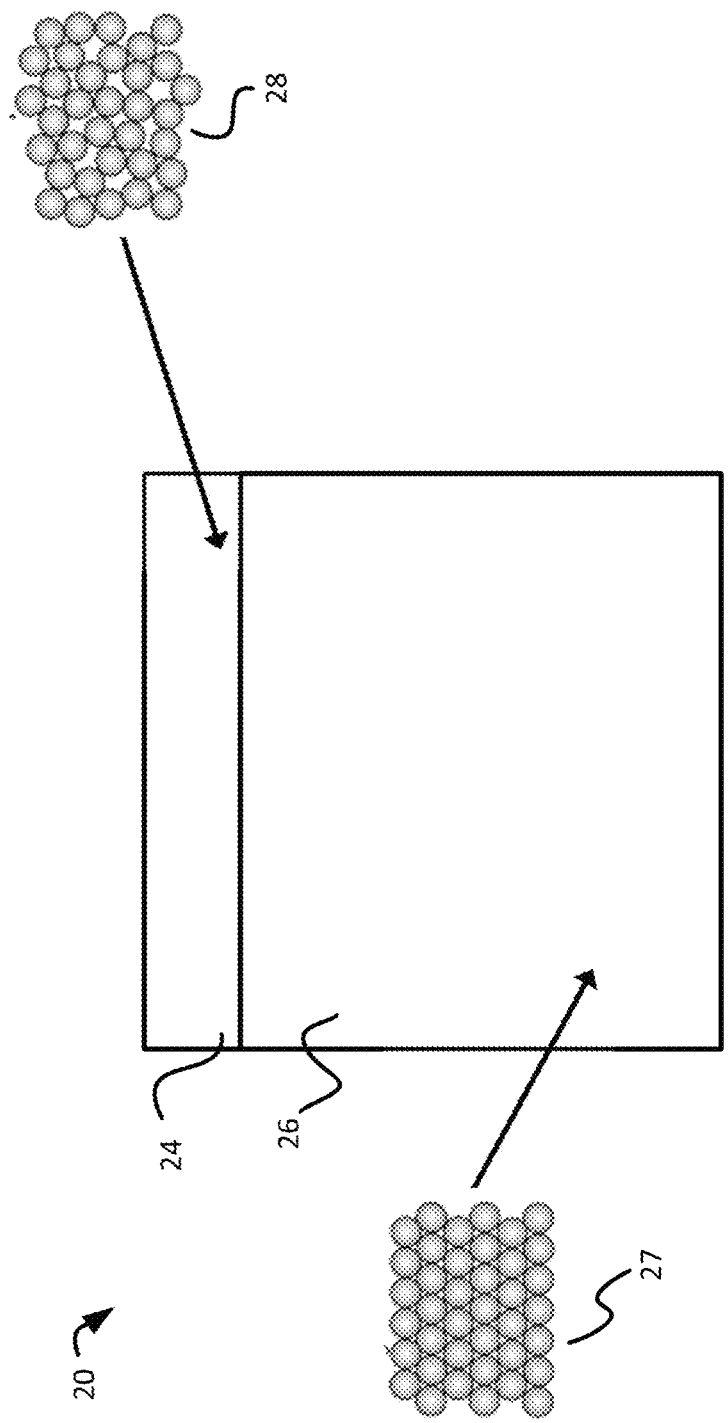

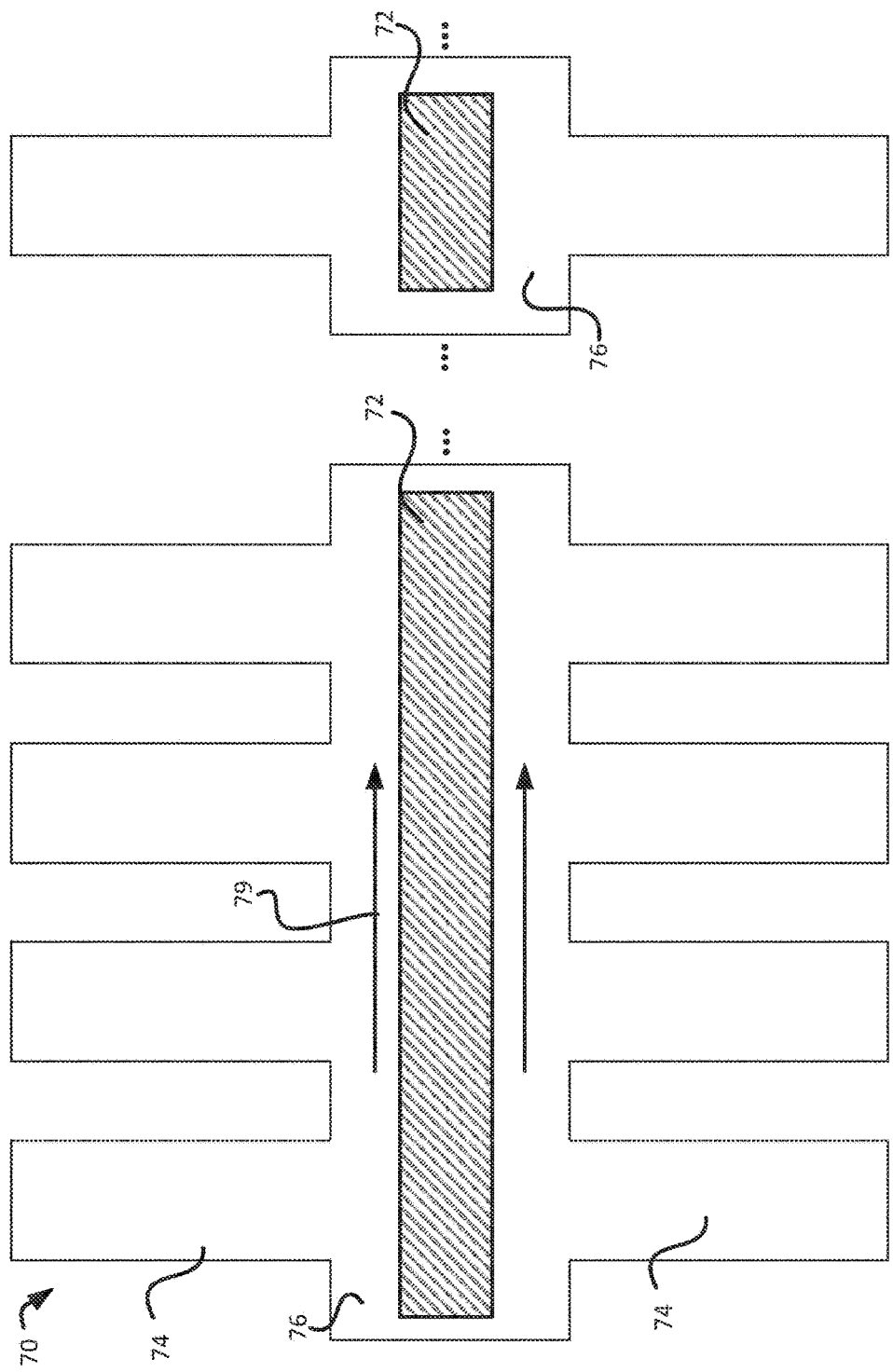

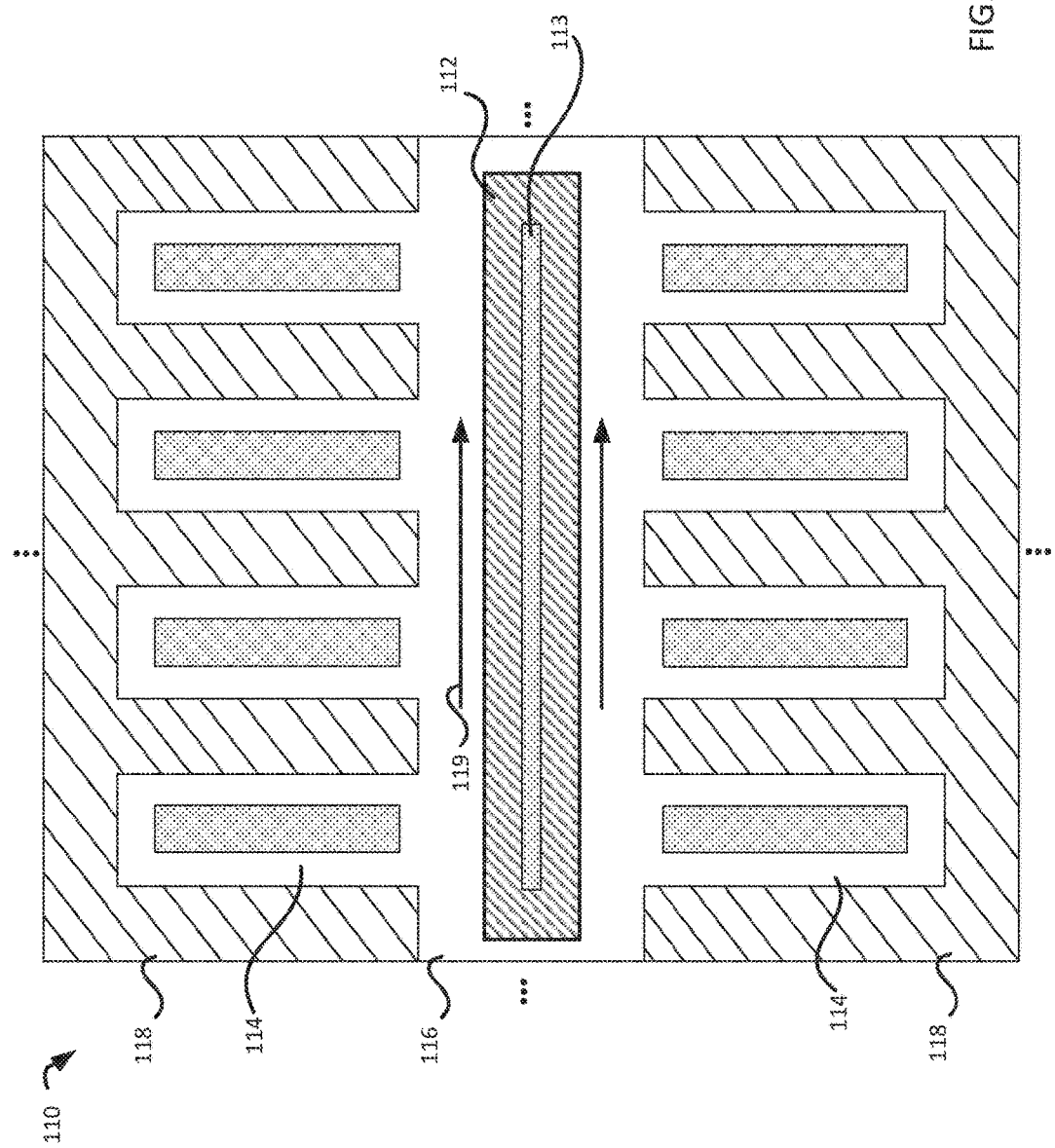

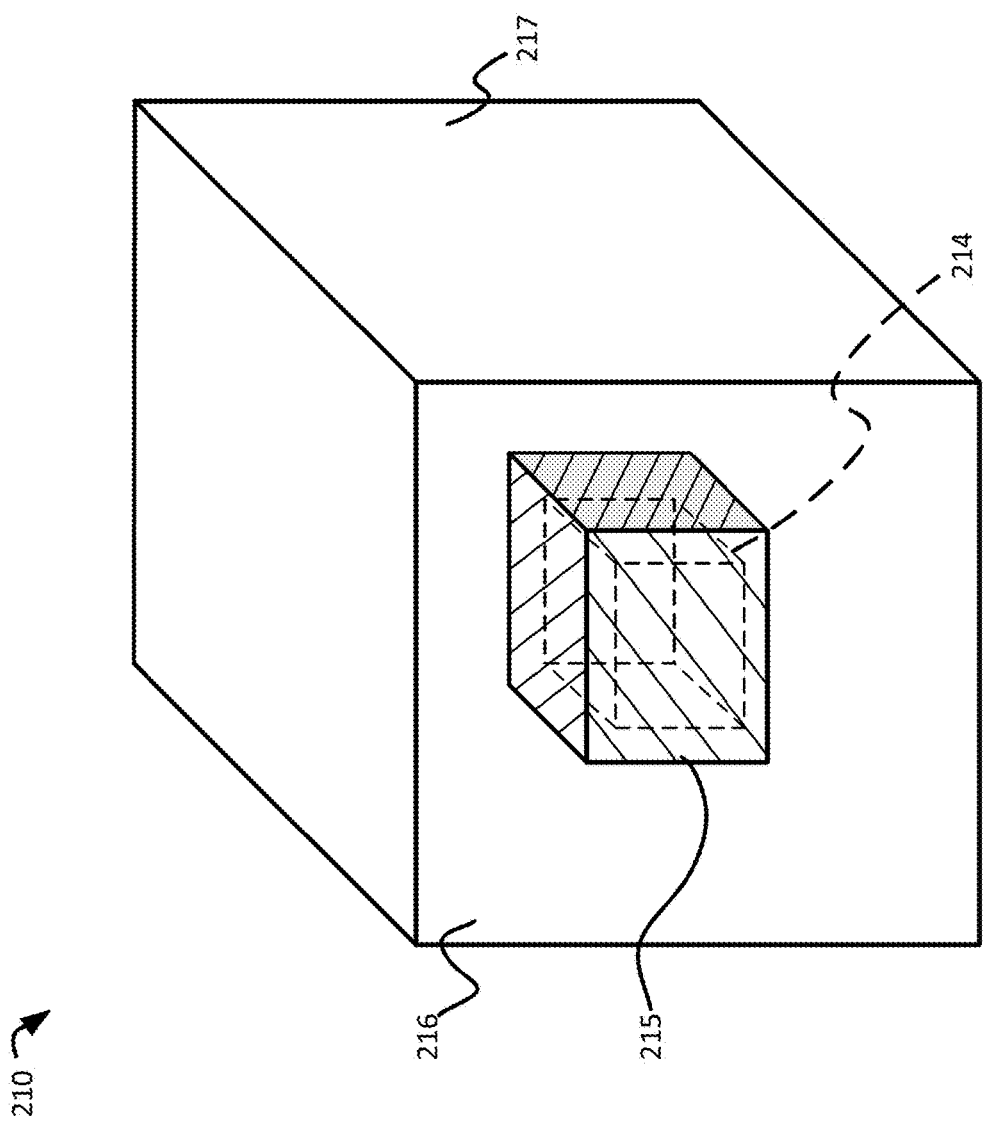

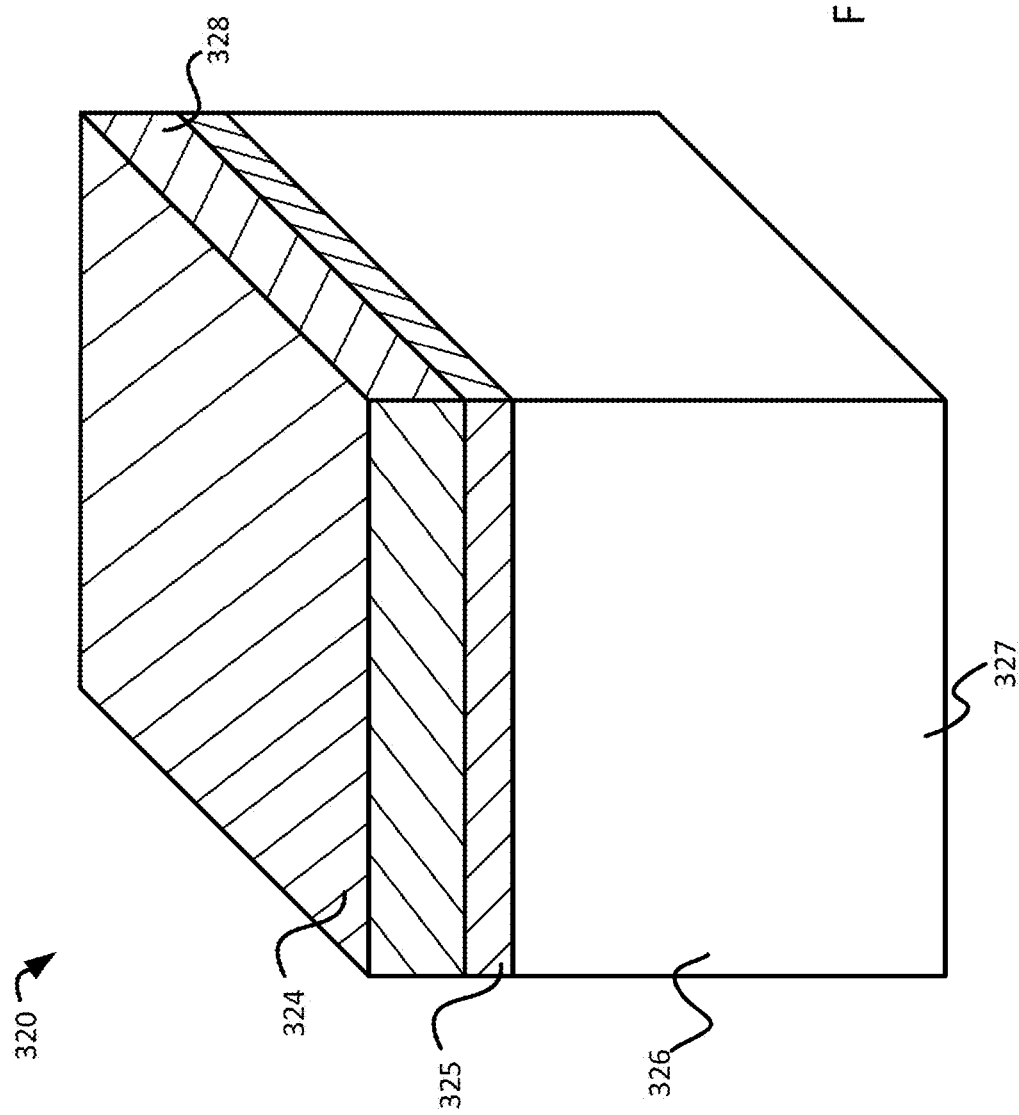

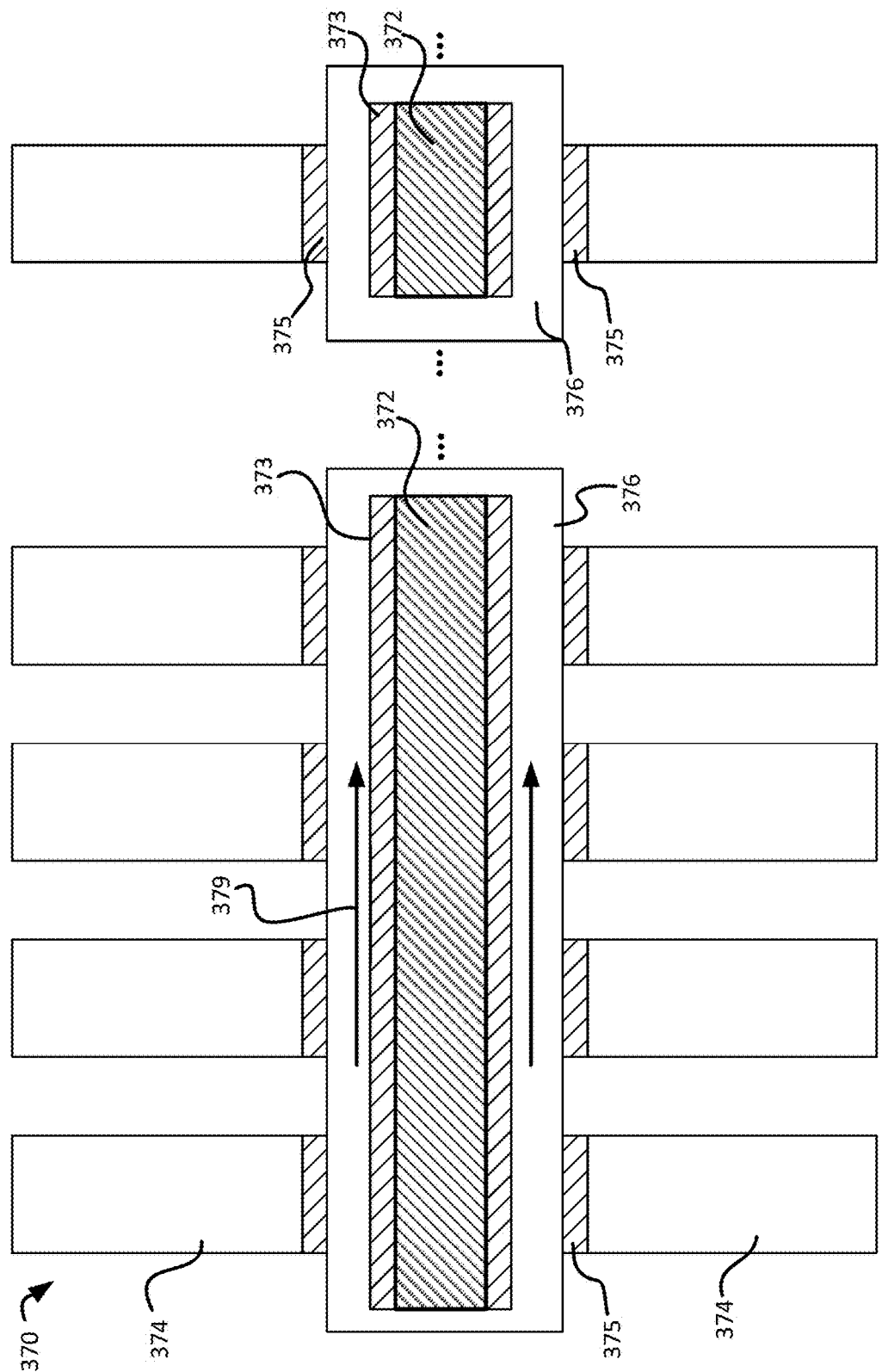

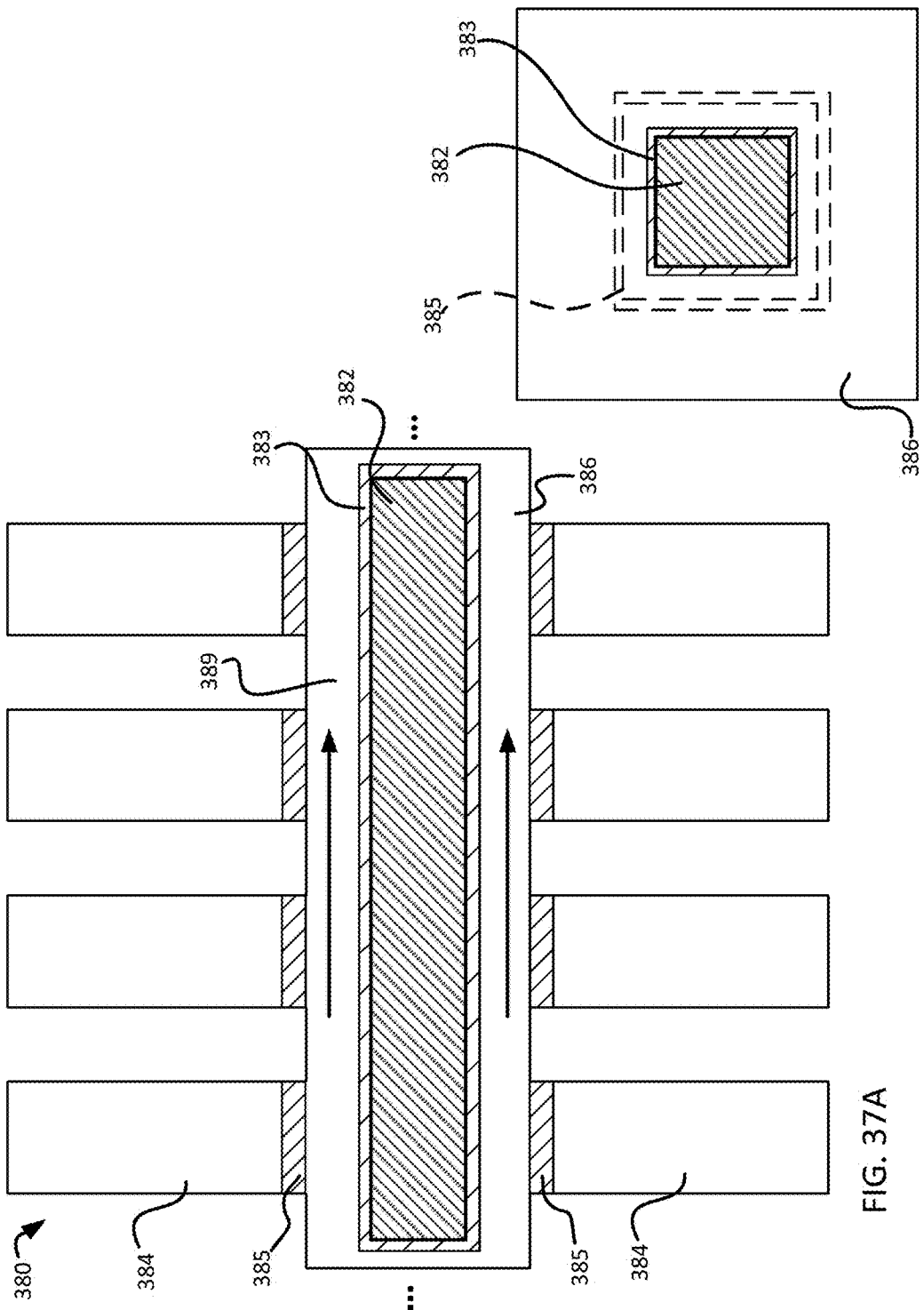

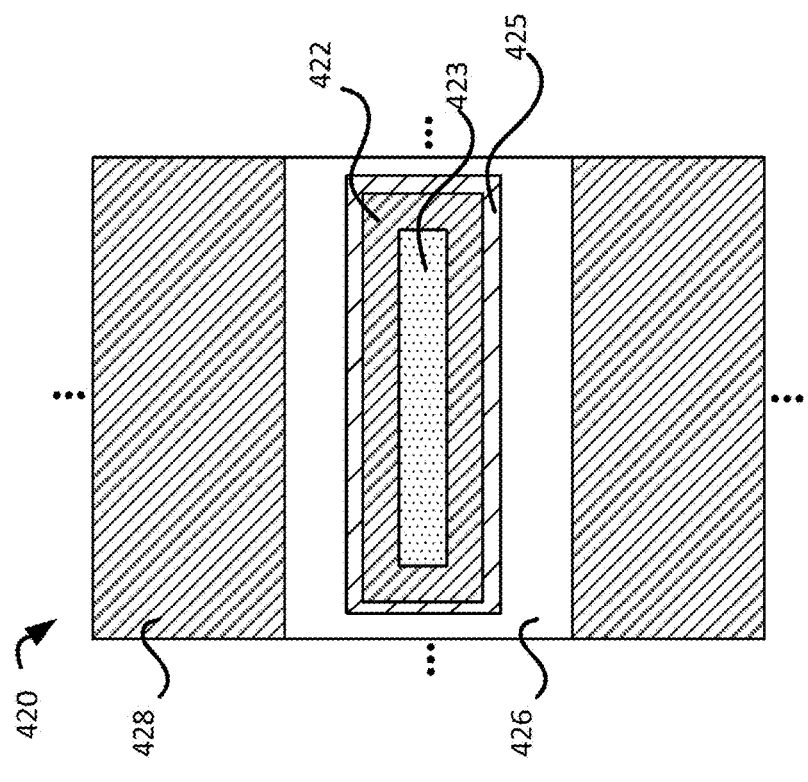
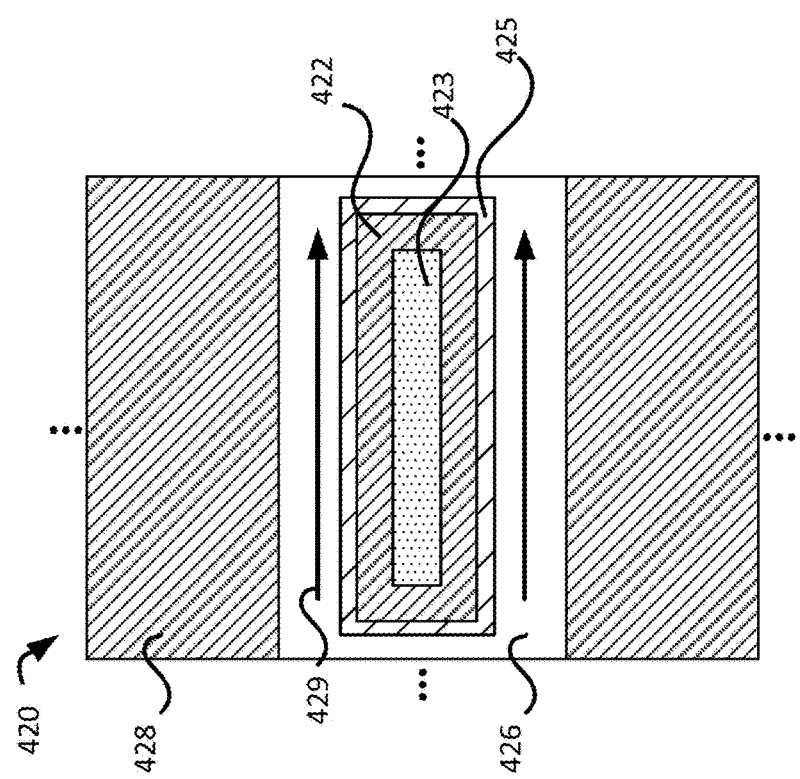

PHONONIC METAMATERIALS ADAPTED FOR REDUCED THERMAL TRANSPORT

CROSS-REFERENCE TO RELATED APPLICATIONS

This application is a continuation-in-part of U.S. patent application Ser. No. 15/289,921 filed Oct. 10, 2016 and entitled "Phononic Metamaterials Comprising Atomically Disordered Resonators." This application is a continuation-in-part of U.S. patent application Ser. No. 15/238,711 filed Aug. 16, 2016 and entitled "Phonononic Metamaterials", which is a continuation-in-part of is a continuation-in-part of U.S. patent application Ser. No. 14/247,228 filed Apr. 7, 2014 and entitled "Nanophonononic Metamaterials," which claims the benefit of U.S. provisional application No. 61/809,399, filed 7 Apr. 2013 and entitled "Lattice Dynamics and Thermal Transport Properties of Nanophononic Materials." Each application listed is hereby incorporated by reference as though fully set forth herein.

BACKGROUND a. Field

The present application discloses a number of methods, materials and devices that relate to reducing group velocities of phonons traveling within an at least partially crystalline base material. One purpose for group velocity reductions, for example, may be to reduce thermal conductivity; another may be to improve the thermoelectric energy conversion figure of merit.

b. Background

The thermoelectric effect refers to the ability to generate an electric current from a temperature difference between one side of a material and another. Conversely, applying an electric voltage to a thermoelectric material can cause one side of the material to heat while the other side stays cool, or, alternatively, one side to cool down while the other stays hot. Devices that incorporate thermoelectric materials have been used in both ways: to create electricity from a heat source or to provide cooling or heating by consuming electricity. To date, thermoelectric devices have been limited to niche or small-scale applications, such as providing power for the Mars Curiosity Rover or the cooling of precision instruments.

The widespread use of thermoelectric materials has been hindered by the problem that materials that are good electrical conductors also tend to be good conductors of heat. This means that at the same time a temperature difference creates an electric potential, the temperature difference itself begins to dissipate, thus weakening the current it created. Materials that have both high electrical conductivity, $\sigma$, and high thermal conductivity, $\kappa$, behave poorly in converting a temperature difference to an electric potential. In order for a material to perform well as a thermoelectric material, it should possess a high value of the figure of merit, $ZT=(S^2\sigma/\kappa)T$, where $S$ is the Seebeck coefficient, and $T$ is the temperature.

In the past, scientists have tackled this problem by searching for materials with intrinsic properties that allow the conduction of electricity to take place more easily than the conduction of heat. More recently, nanotechnology has been utilized by material scientists to engineer nanostructured materials that would exhibit the properties desired. The utilization of nanostructuring for control of heat transport has been a rapidly growing area of research. Researchers have tried various schemes to reduce heat transport in thermoelectric materials, such as introducing holes, inclusions, particles, interfaces and/or grains of other materials into a thermoelectric material in order to scatter the phonons (carriers of heat), but these tend to reduce the transport of electric current as well (because they scatter the electrons), which negated the improvement.

The manipulation of elastic waves in a macroscale periodic medium (i.e., with unit-cell size in the order of hundreds of micrometers or higher) can be realized primarily in two distinct ways: (i) the utilization of Bragg-scattering phononic crystals and (ii) the introduction of local resonances. The latter renders the medium a "metamaterial." The concept of a phononic crystal involves a material with an artificial periodic internal structure for which the lattice spacing has a length scale on the order of the propagating waves. In such a configuration, wave interferences occur across the unit cell providing a unique frequency band structure with the possibility of band gaps. The concept of a metamaterial, on the other hand, generally involves the inclusion of local resonators (i.e., mechanical oscillators) which enable unique subwavelength properties to emerge. While periodicity is advantageous in some implementations, it is not necessary in a metamaterial. At a macroscale (where the focus is on acoustics or mechanical vibrations), periodic locally resonant metamaterials have been considered in various forms, such as by having heavy inclusions coated with a compliant material (e.g., rubber-coated lead spheres) and hosted in a relatively lighter and less stiff matrix (e.g., epoxy) Z. Y. Liu, X. X. Zhang, Y. W. Mao, Y. Y. Zhu, Z. Y. Yang, C. T. Chan, and P. Sheng, Science 289, 1734 (2000), or by the presence of pillars on a plate Y. Pennec, B. Djafari-Rouhani, H. Larabi, J. O. Vasseur, and A. C. Hladky-Hennion, Phys. Rev. B 78, 104105 (2008); T. T. Wu, Z. G. Huang, T. C. Tsai, and T. C. Wu, Appl. Phys. Lett. 93, 111902 (2008).

In recent years, the concept of a phononic crystal has been applied to the problem of nanoscale phonon (thermal) transport. In this context, the periodic material can be realized in a variety of ways such as by the layering of multiple constituents, also known as a layered superlattice M. N. Luckyanova, J. Garg, K. Esfarjani, A. Jana M. T. Bulsara, A. J. Schmidt, A. J. Minnich, S. Chen, M. S. Dresselhaus, Z. F. Ren, E. A. Fitzgerald, and G. Chen, Science 338, 936 (2012), or the introduction of inclusions and/or holes, as in a nanophononic crystal (NPC) J. Tang, H.-T. Wang, D. H. Lee, M. Fardy, Z. Huo, T. P. Russell, and P. Yang, Nano Lett. 10, 4279 (2010); J. K. Yu, S. Mitrovic, D. Tham, J. Varghese, and J. R. Heath, Nat. Nanotechnol. 5, 718 (2010). To date, the notion of a locally resonant phononic (or elastic or acoustic) metamaterial has been limited to macroscale problems where the interest and applicability is in mechanical vibrations or acoustics (as opposed to thermal transport and heat transfer).

BRIEF SUMMARY

Manipulation of heat carrying phonons or elastic waves that propagate and scatter can yield beneficial thermal properties. One application relates to thermoelectric materials, or the concept of converting energy in the form of heat into electricity and vice versa. In various implementations, for example, manipulation of heat carrying phonons or elastic waves that propagate and scatter may be performed at scales such as, but not limited to, nanoscale, microscale, milli scale and centiscale. As used herein, the term nanoscale refers to a scale on the order of 1 nm to hundreds of nanometers, but less than one micrometer. Similarly, the term microscale refers to a scale on the order of 1 μm to hundreds of micrometers, but less than one millimeter. The term milliscale refers to a scale on the order of 1 mm to several millimeters, but less than one centimeter. The term centiscale refers to a scale on the order of 1 cm to tens of centimeters, but less than one meter.

The present application discloses a number of methods, materials and devices that relate to reducing group velocities of phonons traveling within an at least partially crystalline base material. One purpose for group velocity reductions, for example, may be to reduce thermal conductivity; another may be to improve the thermoelectric energy conversion figure of merit. In particular implementations, for example, group velocities of phonons traveling within an at least partially crystalline base material may be reduced by interacting one or more vibration modes generated by at least one locally resonant oscillator and/or atomically disordered material with one or more of the phonons, including, but not limited to, vibration modes associated with the motion of atoms within the locally resonant oscillator and/or atomically disordered material.

In one implementation, example implementations of phononic metamaterials may be include one or more inclusions disposed within an at least partially crystalline base material. The inclusion(s) may be at least partially surrounded by a relatively compliant/soft material (such as graphite, rubber, or polymer) within the at least partially crystalline base material. In these implementations, for example, the inclusion and surrounding may operate as a resonator mass. The relatively compliant/soft material (e.g., graphite) at least partially surrounding the inclusion may operate as a resonator spring. Graphite, as an example, provides a relatively effective "spring" soft/compliant material that surrounds or at least partially surrounds an inclusion because (1) it is crystalline and can allow vibrations to transmit to the surrounding base material effectively and, (2) it has a relatively high melting temperature and allows for high temperature (e.g., above 400 degrees C.) thermoelectric conversion. Although graphite provides a particularly effective soft/compliant material, it is merely an example and other compliant/soft materials may be used. By embedding inclusions within the at least partially crystalline base material, a bulk phononic metamaterial may be provided that is relatively easy to fabricate than a one-dimension (e.g., rod shaped) or two-dimension (e.g., plate or sheet shaped) phononic metamaterial base material with many individual layers/pillars/walls disposed adjacent to and extending away from the base material.

The inclusions in these variations may include atomically ordered and/or atomically disordered material disposed within an at least partially crystalline base material (e.g., in bulk form) and/or layers/pillars/walls of atomically ordered and/or disordered materials disposed near, adjacent, or juxtaposed to an at least partially crystalline base material. In these implementations, the inclusions within the at least partially crystalline base material may be further disposed at least partially within (e.g., at least partially surrounded by) one or more layer of a compliant and/or slippable material, such as graphite, where one or more layer of atoms within the overall layer can vibrate or slip with respect to each other (e.g., with relatively low force) and thus enhance the resonance(s) of the inclusion and their transmission to the least partially crystalline base material.

In one implementation, for example, an at least partially crystalline base material provides a transport region for electron and phonon flow. At least one substructure, such as a pillar, wall, ring, plate or the like, extends from a surface of the base material and causes resonance hybridizations in the base material through movement of atoms of the extending substructure(s). The extending substructure, for example, may comprise an at least partially atomically ordered material (e.g., an at least partially crystalline material) and/or an atomically disordered (e.g., amorphous) material. In one particular implementation, for example, the base material may comprise a reduced-dimension base material, such as a thin film base material (e.g., a film or membrane base material). A plurality of substructures may extend from one or more surface of the reduced-dimension base material. Resonance hybridizations caused by atomic movements within the extended substructures, for example, may extend into a reduced dimension of the base material and interact with phonons flowing through a transport region of the base material. Thus, the interaction of the hybridizing resonances with the phonons traveling through the transport region of the base material may reduce the group velocities of the phonons, which, in some implementations, may further increase the effectiveness of reducing thermal conductivity in the base transport material.

In another implementation, for example, an at least partially crystalline base material includes one or more inclusions disposed within the at least partially crystalline base material. In one particular implementation, for example, the inclusion(s) are disposed within the base material adjacent to, juxtaposed and/or near a transport region that provides for electron and phonon flow through the base material. Movement of atoms within the inclusion(s) causes resonance hybridizations that extend into the transport region of the base material. The resonance hybridizations interact with phonons flowing through the transport region of the base material. The interaction of the hybridizing resonances with the phonons traveling through the transport region of the base material may reduce the group velocities of the phonons, which, in some implementations, may further increase the effectiveness of reducing thermal conductivity in the base transport material. By embedding the inclusions within the base material, for example, a bulk or discrete thermoelectric material may be produced.

In yet another implementation, for example, one or more resonance hybridization generated by atomic movement within an extending structure or inclusion local oscillator may be altered by including another material with a local oscillator. A different (e.g., relatively heavier or lighter material, relatively stiffer or softer material, etc.), for example, may be included with an atomically ordered or disordered extending substructure extending from the at least partially crystalline base material and/or with an inclusion disposed within the base material. The different material, for example, may alter one or more hybridizing resonance by affecting the atomic motions within the local oscillator(s). A relatively heavy or dense material added to the local oscillator, for example, may lower a frequency of one or frequencies of more hybridizing resonances and thus alter the interaction between the hybridizing resonances and phonons passing through the base material.

In another implementation, for example, a material having reduced-dimension base material (e.g., a thin film, membrane, rod, wire) may be included in a bulk thermoelectric material. In one particular implementation, for example, the reduced-dimension base material structure, with or without extending substructures, may be disposed within an outer matrix. The outer matrix, for example, may comprise a relatively soft matrix material compared to the at least partially crystalline base material and/or the extending local oscillator substructures. The surrounding matrix, in some implementations, may comprise an atomically disordered material that may also provide hybridizing resonances in addition to those provided from an extending substructure and/or an atomically disordered inclusion disposed within the base material.

In yet another implementation, such as described above for example, reduced-dimension structures (e.g., nanostructures, microstructures, millistructures or centistructures) are provided that reduce the thermal conductivity k without a significant negative impact to the electrical conductivity as well as the power factor $S^2\sigma$ (where S is the Seebeck coefficient and is the electrical conductivity) of a thermoelectric material and provides the ability to achieve relatively high values of the thermoelectric energy conversion ZT figure of merit.

In another implementation, for example, a phononic metamaterial comprises at least one locally resonant pillar (e.g., nanoscale, microscale or milliscale pillar) extending from a surface of the at least partially crystalline base material. The extension of the one or more pillars from the base material may improve the thermoelectric energy conversion figure of merit, ZT, by freeing the at least partially crystalline base material from local resonators (or at least added local resonators) acting as internal scatterers that may hinder the motion of electrons and cause a reduction in electrical conductivity of the base material.

In yet another implementation, for example, a method for reducing thermal conductivity through an at least partially crystalline base material is provided. In this implementation, the method comprises: generating a plurality of local vibration modes, such as modes of atomic vibration, within the at least partially crystalline base material by the oscillation of at least one locally resonant oscillator (e.g., a nanoscale, microscale or milliscale locally resonant oscillator) coupled to the base material; and interacting at least one of the local vibration modes created by the at least one locally resonant oscillator with a plurality of phonons moving within the base material slowing group velocities of at least a portion of the interacting phonons.

In another implementation, a phononic metamaterial structure is provided. The phononic metamaterial structure in this implementation includes: an at least partially crystalline base material configured to allow thermal conduction via a plurality of phonons moving through the base material; and at least one locally resonant oscillator coupled to the at least partially crystalline base material. The at least one locally resonant oscillator is configured to generate at least one vibration mode, such as a mode of atomic vibration, to interact with the plurality of phonons moving within the base material and slowing group velocities of at least a portion of the interacting phonons and reduce thermal conductivity through the base material The foregoing and other aspects, features, details, utilities, and advantages of the present invention will be apparent from reading the following description and claims, and from reviewing the accompanying drawings.

BRIEF DESCRIPTION OF THE DRAWINGS

FIG. 2 depicts a variety of example configurations of 2D phononic metamaterials with 1D locally resonant oscillators extending from a base material.

FIGS. 5A and 5B show images of unit cells of example implementations of a locally resonant NPM comprising a pillar extending on top of a thin film base material (e.g., a suspended membrane thin film base material). Each image shows an atomic-scale model of a unit cell where the thin film base material (e.g., a suspended membrane thin film base material) and the pillar are made out of single crystal silicon.

FIG. 9 depicts an additional variety of example configurations of 2D phononic metamaterials with 1D locally resonant oscillators extending from a base material.

FIG. 10 depicts a variety of example configurations of 2D phononic metamaterials with embedded resonant oscillators.

FIG. 11 depicts a variety of example configurations of 2D phononic metamaterials with 2D locally resonant oscillators extending from a base material.

FIG. 12 depicts a variety of example configurations of 1D phononic metamaterials with 1D locally resonant oscillators extending from a base material.

FIG. 13 depicts a variety of example configurations of 1D phononic metamaterials with 2D locally resonant oscillators extending from a base material.

FIG. 14 depicts a variety of example configurations of 3D phononic metamaterials with embedded resonant oscillators.

FIGS. 15A-15C show an example implementation of a three-dimensional (3D) unit cell including an atomically disordered inclusion (such as an amorphous material) disposed within an at least partially crystalline base material. The unit cell, for example, may be used within a bulk or other material such as a two- or one-dimensional material like a membrane or a wire, respectively.

FIGS. 16A and 16B show another example implementation of a three-dimensional (3D) unit cell including an atomically disordered layer disposed adjacent to, juxtaposed and/

FIGS. 22A and 22B show an example implementation of a composite material comprising a thin film at least partially crystalline base material (e.g., membrane thin film base material) including at least one continuous atomically disordered inclusion disposed within the base material and a plurality of pillar extending substructures extending from the base material.

FIG. 27 depicts yet another example implementation of a bulk composite material comprising an at least partially crystalline base material including at least one continuous atomically disordered inclusion disposed within the base material and a plurality of extending substructures extending from the base material. The atomically disordered inclusion and the extending substructures further each include an internal inclusion disposed within the atomically disordered inclusion and the extending substructures. The base material and extending substructures are embedded at least in part by an outer matrix material.

FIGS. 29A through 29B show an example implementation of a three-dimensional (3D) unit cell.

FIGS. 30A and 30B show another example implementation of a three-dimensional (3D) unit cell.

FIGS. 36A, 36B, 36C, 36D, 37A and 37B depict other example implementations of composite materials adapted to slow a group velocity of one or more phonons flowing through an at least partially crystalline material.

FIGS. 42A and 42B show yet another implementation of an example bulk composite material including a phononic metamaterial.

DETAILED DESCRIPTION

Figure 1:
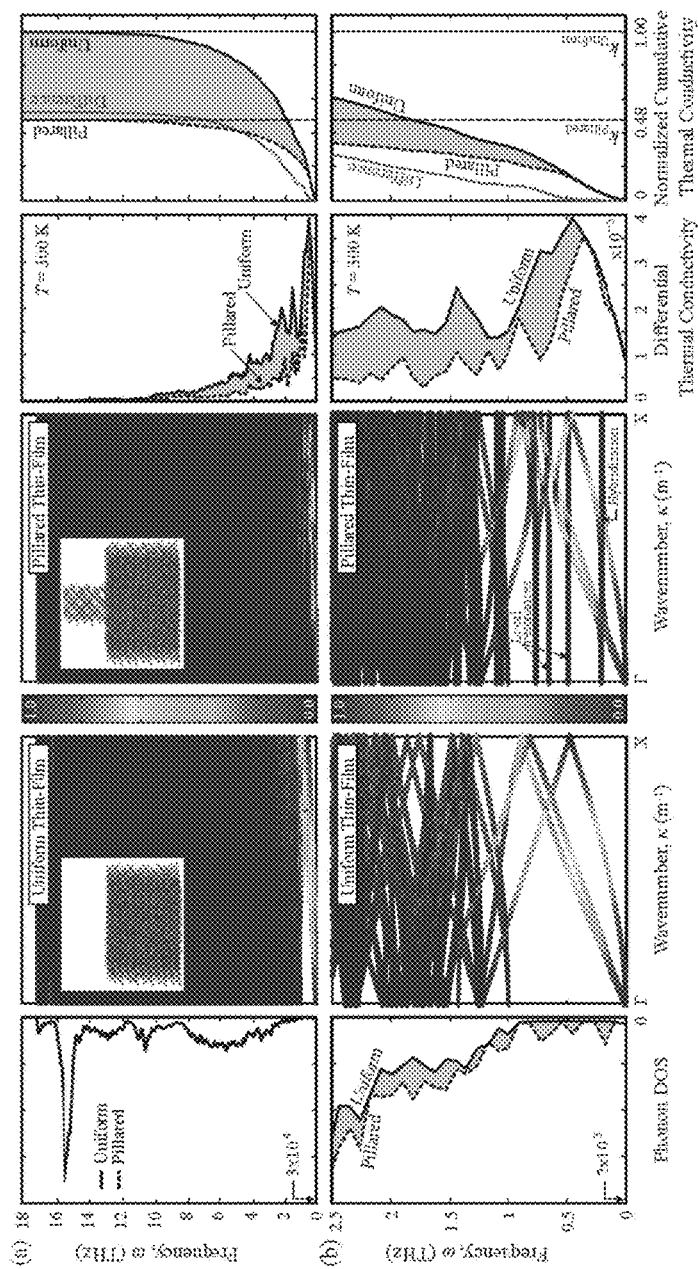
FIG. 1 shows a comparison of the phonon dispersion and thermal conductivity of a pillared silicon thin film with a corresponding uniform thin film. The dispersion curves are colored to represent the modal contribution to the cumulative thermal conductivity, normalized with respect to the highest modal contribution in either configuration. The full spectrum is shown in (a) and the $0 \leq \omega \leq 2.5$ THz portion is shown in (b). Phonon DOS and the thermal conductivity, in both differential and cumulative forms, are also shown. The gray regions represent the difference in quantity of interest between the two configurations. The introduction of the pillar in the unit cell causes striking changes to all these quantities.

Phononic metamaterials are provided herein. For example, phononic metamaterials may be provided at the nanoscale (also described as a nanophononic metamaterial (NPM)), at the microscale (also described as a microphononic metamaterial (Micro PM), at the milliscale (also described as a milliphononic metamaterial (Milli PM) as well as at other larger or smaller scales. In some implementations, a phononic metamaterial can be used to significantly reduce thermal conductivity in a structured semiconducting material (e.g., a nano-structured, micro-structured, milli-structured or centi-structured semiconducting material) and, in some implementations, do so without affecting (or at least without significantly affecting) other important factors for thermoelectric energy conversion, such as the electrical conductivity and Seebeck coefficient.

Heat flow through an at least partially crystalline base material is carried by atomic waves (phonons) with a wide range of frequencies. A phononic metamaterial may contain miniature oscillators/resonators (these two terms are used interchangeably herein) that exchange energy with phonons and alter their propagation characteristics. When the frequency of a passing phonon matches a mode of an oscillator of a phononic metamaterial, such as a mode of oscillation of one or more atoms of the resonating substructure, a coupling/hybridization/interaction occurs between a vibration mode of the oscillator and the phonon. This leads to a reduction in the group velocity of the interacting phonon, which, in turn, causes a reduction in the amount of heat carried by the phonon. Looking at this phenomenon more broadly, the local resonances of the oscillators couple/hybridize/interact with the underlying lattice dispersion of a crystalline (or partially crystalline) material to which the oscillators/resonators are incorporated. As a result, a reduction occurs in the group velocities for the phonon wave propagation (Bloch) modes at and near each coupling/hybridization/interaction as indicated in a frequency versus wave vector diagram. Where the local resonances are numerous and span the entire spectrum, the couplings will be numerous and will span the entire spectrum (e.g., up to THz). This leads to a significant reduction in the overall thermal conductivity of a material. Thus, introduction of local resonators (specifically ones that exhibit numerous and spread out modes with the lowest mode corresponding to a frequency as low as possible) can reduce the thermal conductivity of the base material significantly. This concept is demonstrated in FIG. 1 for a particular implementation that is described below.

The idea is a structural concept that is in principle independent of the base material used. As such, the proposed concept may be implemented using a wide range of materials (e.g., a semiconducting material). The concept may be even applied using a composite, an alloy, or a conventional thermoelectric material that performs well (for thermoelectric energy conversion) in its raw chemical form or that has already been structured (e.g., nanostructured) in a different way to improve its performance. In some instances, the better the thermoelectric performance of the base material in its raw form, the better the final thermoelectric performance upon the introduction of the local oscillators/resonators. In one particular implementation, a base material of single crystal silicon may be selected due to its low cost, abundance, advanced state-of-the art in analysis and fabrication, excellent industrial infrastructure already available, high resistance to high temperature and for being non-toxic. Although particular examples described herein may include a particular base material, these are merely examples and many other types of materials may also be used.

The idea is inherently robust, i.e., performance is resistant (insensitive) to variations in the geometry of all features pertaining to the main body of the material and the local oscillators or resonators (the terms oscillator and resonator are used interchangeably herein). This attribute implies, for example, resistance to surface roughness which provides practical benefits since, at least currently, low-cost fabrication (e.g., nanofabrication) of very smooth structures (e.g., nanostructures) continue to be a technological challenge.

Unlike other group velocity reduction strategies that use structuring (e.g., the introduction of periodic inclusions or holes or interfaces) and that depend on manipulating the travelling wave dispersion within the main body, e.g., by Bragg scattering (which are very sensitive to surface roughness), the local resonances associated with the local oscillators/resonators are standing waves (localized vibrations). One advantage is that the effects of these standing waves on reducing the thermal conductivity are practically not negatively influenced by the surface roughness. The roughness will only cause small shifts (up or down) in the frequency values of the local resonances, and, as such, the overall effect of the roughness on reducing the thermal conductivity by the hybridization mechanism is low. Furthermore, bulk modes may be hybridized in the main body of the at least partially crystalline base material by the local resonances, and this too would reduce the thermal conductivity without sensitivity to the roughness in any surfaces within the base material. Furthermore, should the local oscillators/resonators be incorporated in a periodic fashion, where Bragg scattering may take place or partially take place and causes at least some reduction in the group velocities, the group velocity reduction due to the local oscillators/resonators will be additive (i.e., over and beyond what is achieved by Bragg scattering and other means such as reduced dimensionality of the base material structure).

In one implementation, for example, one or more local oscillator/resonator structures comprise one or more structure extending away from a surface of a thermoelectric base material. These structures, for example may comprise any crystalline, partially crystalline or atomically disordered (e.g., amorphous) material in which atoms of the structures may create one or more modes of oscillation. Atoms of the structures may, for example, exhibit up to three natural frequencies/hybridizing resonances by movement of those atoms within the structure.

In other implementations, for example, one or more local oscillator structures may comprise one or more atomically disordered (e.g., amorphous) material mechanically coupled to the at least partially crystalline thermoelectric base material transport medium (e.g., provides transport of phonons and electrons). The atomically disordered material may comprise, for example one or more inclusions, layers, pillars, walls, grids, lines, curves, dots or other random or patterned structure comprising one or more atomically disordered material. The atomically disordered material, in this configuration, acts as one or more oscillators. Movement of one or more of the atoms of the atomically disordered material, for example, exhibits up to three natural frequencies/hybridizing resonances. Resonances couple with heat phonons traveling through the thermoelectric base material such that, through coupling, the group velocities of the phonons are decreased and thermal conductivity may be reduced.

In still other implementations, both at least one local oscillator/resonator structure (e.g., crystalline, partially crystalline and/or atomically disordered) is disposed extending from a surface of a thermoelectric base material and/or at least one atomically disordered (e.g., amorphous) inclusion is disposed within the thermoelectric base material are provided. In this implementation, for example, the local oscillator/resonator structure(s) extending from a surface of the base material may provide one or more local resonances (e.g., via one or more modes of atomic vibration) extending through the surface of the base material and coupling with one or more phonons traveling through the base material within a range of the local resonance(s). The atomically disordered inclusion material may similarly provide one or more local resonances (e.g., via one or more mode of atomic vibration) emanating from the inclusion material into the base material that couple with one or more phonons traveling through the base material within a range of the corresponding local resonance(s). In this manner, thermal conductivity of the base material may be reduced by interferences of phonons traveling through the base material by either or both of the local resonator structures.

Because local resonances of the local resonator structures are caused by one or more atoms moving within the various local resonator structures (e.g., crystalline, partially crystalline or atomically disordered structures extending from a surface of the thermoelectric base material or atomically disordered inclusions disposed within the thermoelectric base material), the number of resonances may be increased or decreased, as desired, by the size and/or number of local resonator structures employed. Similarly, one or more distribution of resonances may be tuned or otherwise selected to correspond to or conform with the distribution of phonons traveling through the thermoelectric base material, and possibly add more weight to phonons that carry most of the heat, to further reduce the thermal conductivity of the base material.

By including one or more local oscillators, whether substructures extending from the base material and/or atomically disordered inclusions disposed within the base material, that provide local resonances that extend into the base material from the local oscillator structure(s), the thermoelectric base material may also be designed to include one or more electron transport regions that are relatively free of barriers to electron flow through the base material, yet allow for local resonances created by nearby local oscillators/resonators to couple/hybridize with phonons traveling through the same transport regions. In this manner, electron flow may be relatively unimpeded while phonon group velocities are substantially decreased reducing thermal conductivity of the thermoelectric base material.

In one particular implementation, for example, a material comprises an approximately two-dimensional thin-film base material including an array of oscillators configured to provide local resonances, such as resonances associated with modes of vibration of one or more atoms within the oscillating structures. Examples of two-dimensional thin-film type base materials include thin films disposed on a substrate, thin films suspended. Further, the terms thin-film and membrane are used interchangeably. An array of pillars or other structures, for example, may extend from one or both free surfaces of the thin-film material (see, for example, FIGS. 2A and 2B). This type of implementation is referred to as a "pillared thin-film implementation." As used herein, the term "pillar" refers to an upstanding and/or downstanding member or part that extends from a surface of a base material, such as a protrusion, extrusion, extension or the like. A pillar, for example, may comprise any number of shapes, forms, heights, distribution, location, orientation, material composition or the like. Further, a pillar may be integrally formed of the same material as a base material, may be joined or otherwise attached (directly or indirectly) to the base material, may include the same or different material as the base material. A pillar, for example, may comprise a crystalline material, an at least partially crystalline material or an atomically disordered material. A pillar, in some implementations, may comprise a nanoscale pillar, a microscale pillar, a milliscale pillar or another larger or smaller scale pillar.

Further, the terms one-dimensional (1D), two-dimensional (2D) and three-dimensional (3D) are used herein to describe both the characteristics of various base material configurations as well as the shape, size, orientation, material composition and/or location/distribution of local oscillators/resonators. A nanoscale (or other scale) base material, for example, may be described as a one-dimensional (1D) base material in the shape of a wire or rod or column that extends, with the exception of other nanoscale (or other scale) dimensions, in a generally single dimension. Similarly, a nanoscale (or other scale) base material, such as a nanomaterial thin-film/membrane/sheet or plate-shaped base material may be described as a two-dimensional (2D) structure, with the exception of other nanoscale (or other scale) dimensions, that extends in two dimensions. Also, a different base material, such as a bulk material, may be described as a three-dimensional (3D) base material. Similarly, local oscillators/resonators, such as pillars shown in FIG. 3 may also be described with respect to one, two or three dimensional structures as described below with reference to those figures.

A two-dimensional (2D) nanomaterial configuration, for example, may be described as a thin film or membrane (the terms thin-film and membranes are used interchangeably herein and apply to both thin films/membranes disposed on a substrate and suspended thin-films/membranes), with a thickness roughly less than 10,000 nm. One advantage of using this configuration for a base material structure (i.e., a base material structural configuration to which the oscillators/resonators are applied to) is that the thermal conductivity gets reduced by a factor of two or more compared to a bulk state of the same material. This reduction in the thermal conductivity is due to (1) a reduction in group velocities due to the thin film structure (this effect weakens with rough surfaces) and (2) due to diffusive scattering of the phonons at the surfaces (this effects strengthens with rough surfaces). Either way, the overall reduction in the thermal conductivity is advantageous for the thermoelectric energy conversion.

Realization of local oscillators/resonators in the form of pillars, and atoms within the pillars, in this particular implementation, for example, where the pillars extend perpendicularly (or generally perpendicularly), or following a non-perpendicular orientation, from one or both free surfaces, provide an advantage in that the main body of the thin film remains unaltered (this is in contrast to other structuring strategies that involve altering the main body of the thin film by introducing holes or particles or interfaces or grains within this body), thus reducing the likelihood (or intensity) of undesirably scattering the electrons as well. Reducing the thermal conductivity without reducing the electrical conductivity (as well as the Seebeck coefficient) is very desirable for achieving a relatively high thermoelectric energy conversion figure or merit.

In one implementation, local oscillators/resonators in the form of pillars and atoms within the pillars are positioned periodically along one or both free surfaces of a thin-film base material. While the pillars in principle need not be arranged periodically for the hybridization effect to take root (the relaxation of the periodicity requirement is an advantage from the point of view of design/fabrication flexibility and insensitivity to geometric variations), the periodic positioning of the pillars in this particular implementation (1) provides an efficient way to compactly arrange the pillars, (2) allows for a systematic way to theoretically analyze, assess and design the metamaterial (e.g., a nanostructured) phononic metamaterial, and (3) the periodicity provides an additional mechanism for reduction of group velocities, namely, by Bragg scattering (like free surfaces, this effect weakens with rough surfaces) and thus reducing the thermal conductivity.

In the various implementations, a size scale of a unit cell (or a representative volume element if the configuration is not periodic) of a metamaterial (e.g., a nanophononic metamaterial) such as a thin-film thickness and lattice spacing between pillars in the pillared thin-film case may be selected to be on the order of 1 to 1,000 nm (or moderately lower or higher than that range). If significantly higher in this particular thin-film type implementation without inclusions, the unit cell (or representative volume element) may be too large compared to the mean free path of the phonons leading to a deterioration of the coupling/hybridization/interaction effect between the local resonances/oscillations and the base material phonons/dispersion and thus a loss of the favorable effects that are brought about by the presence of the resonating pillars (or other type of oscillators/resonators) and the resonating atoms within the pillars; and, in some implementations, if the unit cell (or representative volume element) is too large compared to the mean free path the benefit effects that come about from its periodic arrangement (i.e., Bragg scattering) may also be lost. If the characteristic length scale of the unit cell (or representative volume element) is smaller, then the number of atoms in the pillars (or other type of oscillators/resonators) will be lower and thus the number of local resonances will be lower which would lead to a lower thermal conductivity reduction effect, although this may still be acceptable in some instances/applications.

In the pillared thin-film implementation, the thickness of the thin film, the lattice spacing and the height of the pillars, all relative to each other, can be selected such the largest size and/or number of pillars can be used per unit area (to increase the extent of the thermal conductivity reduction) but without the coupling between the pillars becoming excessive, which can lead to the extent of the thermal conductivity reduction being weakened (this may occur when the coupling between the pillars exceeds a certain level). In one implementation, for example, relative dimensions are provided as discussed below and shown in FIG. 4. However, upon optimization studies, other sets of relative dimensions can be obtained.

In another implementation, multiple pillar local oscillators/resonators are used on one or both free surfaces of a base thin-film material with each including a unique (distinct) height and/or cross-sectional area (see, for example, FIGS. 2D and 2E). In this implementation, utilization of multiple pillars (above and/or below the thin film), each of which has a distinct geometrical dimension (in terms of the height and/or the cross-sectional area) provides multiple distinct resonance sets associated the with atoms in the pillars and the overall structural features of the pillars, and the more resonant sets the more couplings/hybridizations/interactions that take place across the spectrum and this in turn leads to the reduction in the group velocity for a larger number of phonons, and consequently a larger reduction in the overall thermal conductivity.

Theoretical/computational prediction/analysis of performance using supercell lattice dynamics and fitting to experimental data for uniform thin films can be used to obtain the optimal dimensions for various implementations. The theoretical/computational technique presented herein provide a method for the prediction/analysis of performance to determine optimal dimensions of the unit cell, and also serve as means for demonstration of a proof of concept. This process involves both atomic-scale lattice dynamics calculations and finite-element based lattice dynamics calculations for relatively large models, as well as the use of experimental data for uniform thin films to provide a conservative estimate of the scattering parameters in the thermal conductivity model used. (The thermal conductivity model used is given in Equation (1) below and is based on the Boltzmann Transport Equation under the time relaxation approximation).

A phononic metamaterial, such as a nanophononic metamaterial, may be fabricated using a number of techniques, such as at least one of the following group: deposition, physical vapor deposition, chemical vapor deposition, electrochemical deposition, molecular beam epitaxy, atomic layer deposition, removal, etching, wet etching, dry etching, chemical-mechanical planarization, patterning, lithography, ion beam lithography, architecturing (e.g., nano-architecturing) lattice structures and using lattices (e.g., nanolattices) as a scaffold on which to pattern thermoelectric materials, and the like. In one particular implementation, for example, ion beam lithography or etching techniques may be used for mass production, although other techniques, such as but not limited to the ones listed above, are also possible. In one particular implementation, for example, a phononic (e.g., nanophononic) metamaterial is fabricated using ion beam lithography. However, in another implementation (e.g., for mass production), techniques such as dry etching and metal assisted chemical (wet) etching may be used.

In particular example implementations described herein, for both functional and practical purposes, silicon thin films/membranes, are used as a foundation material for the creation of a locally resonant phononic metarnaterial (e.g., an NPM), however, other semiconducting materials, composites (e.g., nanocomposites), and other types of structured (e.g., nanostructured) materials are not only contemplated but are expected to be used in different implementations. Using a reduced dimension material such as a thin film/membrane already causes a reduction of k of up to an order of magnitude without necessarily impacting $S^2\sigma$, and is also favorable from the point of view of device integration. The choice of silicon in these particular implementations is beneficial due to its wide use in the electronics industry and ease of fabrication and non-toxicity; however, other materials may also be used in other implementations as described herein.

In one implementation, oscillators/resonators take the form of a periodic or non-periodic array of pillars (e.g., nanoscale pillars) that extend/extrude/protrude off the surface of the thin film (on either one side or both sides, in various implementations as practically permitted). Such structures may be fabricated, for example, using techniques such as dry etching and metal assisted chemical (wet) etching, although other techniques are also contemplated. One advantage of an implementation using pillar-shaped protrusions, for example, is that the pillars exhibit numerous local resonances associated with structural vibrations of the pillar as a whole and vibrations of one or more atoms in the pillar, that couple, or more specifically, hybridize with an underlying atomic-level phonon dispersion of a thin film and do so across a full range of its spectrum. These couplings drastically lower the group velocities (at locations where the hybridizations take place) and, consequently, the thermal conductivity. This phenomenon is also known as avoided crossing, which has been studied in naturally occurring materials that have guest atoms encapsulated in caged structures such as clathrates. In contrast to a phononic metamaterial such as an NPM, however, the hybridizations in these caged-structure systems are limited to the modes of the guest atom and typically take place only across a narrow band within the acoustic range of the spectrum. Another important benefit to utilizing pillars is that the feature manipulating the group velocities (i.e., the pillar or other protrusion itself) is physically outside of the primary flow path of the electrons (which resides in the main body of the thin film). This provides an advantage compared to thin-film-based NPCs, in which the inclusions or the holes penetrate through the thickness of the thin film and, hence, may undesirably cause an obstruction to electron transport through the film in addition to scattering the phonons. Furthermore, in this particular implementation, a concern about competition between coherent and nanofeature-induced incoherent thermal transport is no longer of critical importance because the local resonances are phase independent. This quality provides yet another practical benefit as it frees the NPM from restrictions on geometric tolerances.

In one particular implementation, an atomic-level unit cell model for a uniform silicon thin film with thickness t is provided. In this implementation, a conventional cell (CC) description which includes eight atoms packaged as a cube with side length a=0.54 nm is provided. Because of this conveniently shaped boxlike structure, the CC is used as a building block in this implementation and replicated along an orthogonal simple cubic lattice to generate a supercell for a thin-film structure. This is done for the uniform thin film and will be built upon later in this description when a pillar is added to the free surface(s). For the uniform thin film, the supercell consists of a vertical strip constructed by stacking M CCs on top of each other along the out-of-plane z direction. The dimensions of this supercell will be denoted by $A_x \times A_y \times A_z$, where a and $A_z$=Ma=t.

In one particular implementation, a full phonon band structure for a set of suspended uniform silicon thin films is obtained by running atomic-scale lattice dynamics (LD) calculations in which a three-body Tersoff potential is used for the Si—Si bonds with only the first nearest neighboring interactions considered (other types of interatomic potential may be used). All calculations in this implementation are conducted after minimizing the interatomic potential energy at constant pressure. For thermal conductivity predictions, the Boltzmann transport model can be used (using a Callaway Holland approach for modeling the scattering), which is expressed as $$k = \frac{1}{4A_z\pi} \sum_\lambda \int_0^{\pi/A_x} C(\kappa, \lambda) v_g^2(\kappa, \lambda) \tau(\kappa, \lambda) \kappa d\kappa \quad (1)$$

along the x-direction-aligned ΓX path, where $\kappa$, $\lambda$, C, $v_g$, and $\tau$ denote the phonon wave number, branch index, specific heat, group velocity, and scattering time, respectively. The three latter quantities are dependent on the phonon dispersion. The specific heat is expressed as $C(\kappa,\lambda)=k_B[\hbar\omega(\kappa,\lambda)/k_BT]^2 f(\kappa,\lambda)$, where $f(\kappa,\lambda)=e^{\hbar\omega(\kappa,\lambda)/k_BT}/[e^{\hbar\omega(\kappa,\lambda)/k_BT}-1]^2$, $\omega$ is the frequency, T is the temperature, $k_B$ is the Boltzmann constant, and $\hbar$ is the reduced Plank's constant. The group velocity is expressed as $v_g(\kappa,\lambda)=\partial\omega(\kappa,\lambda)/\partial\kappa$ and the scattering time as $\tau(\kappa,\lambda)=[\tau_U^{-1}(\kappa,\lambda)+\tau_I^{-1}(\kappa,\lambda)+\tau_B^{-1}(\kappa,\lambda)]^{-1}$, where $\tau_U^{-1}(\kappa,\lambda)=AT\omega^2(\kappa,\lambda)e^{-B/T}$, $\tau_I^{-1}(\kappa,\lambda)=D\omega^4(\kappa,\lambda)$, and $\tau_B^{-1}(\kappa,\lambda)=|v_g|/L$, representing umklapp, impurity, and boundary scattering, respectively. Note that Equation (1) is evaluated along the x-direction ΓX path.

In one implementation, the parameters A, B, and D are all obtained empirically. For A and B, measured data for uniform silicon thin films on a substrate is utilized since temperature-dependent trends are similar to their suspended counterparts. Concerning impurity scattering, $D=1.32\times 10^{-45}$ s$^3$ can be used in this implementation. The effective boundary scattering length L is defined as L=t/(1-p), where p is a surface specularity parameter (0≤p≈1). Because of the high sensitivity of the fitting parameters to the thin-film thickness (especially for very low t), a model can be fit for a variety of thicknesses (e.g., t=20, 30, 50, 100, 420 nm) around a predetermined temperature (e.g., T=300 K).

Figure 5A:
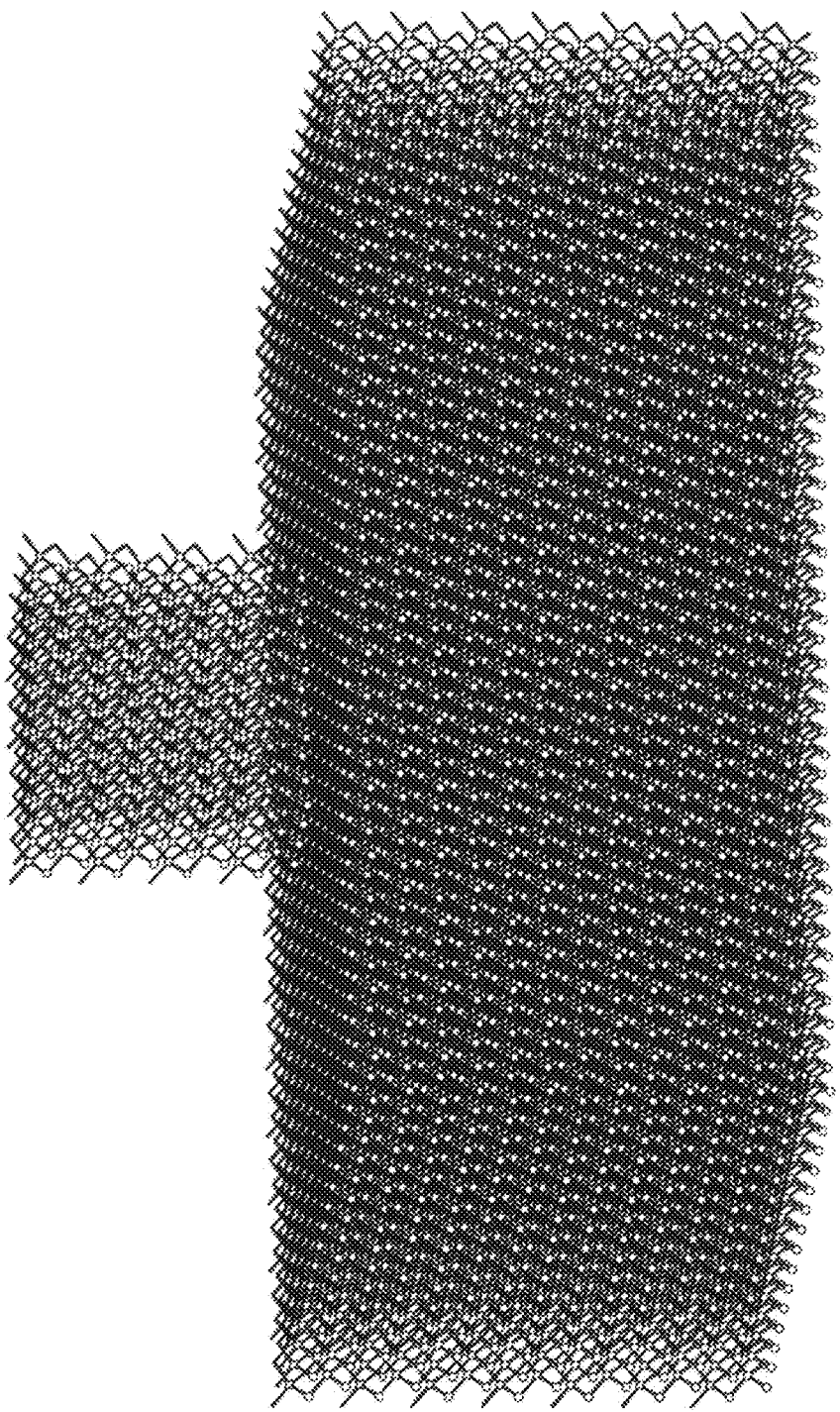

In one implementation, demonstration of a proof of concept in which a presence of nanoscale resonating pillars (or other protrusions) and the atoms therein reduces thermal conductivity in a thin film is described. In this implementation, a thin-film thickness is extremely, small. A baseline study for this example case includes a thin-film supercell with a square base of 6×6 CCs ($A_x=A_y=a_{NPM}$=3.26 nm) and a thickness of M=5 CCs ($A_z$=t=2.72 nm); this corresponds to a rectangular solid containing 1440 atoms. A pillar is placed at the top of the thin film and has a square base of 2×2 CCs (side length of d=1.09 nm) and a height of 3 CCs (h=1.63 nm) and itself contains 96 atoms. The geometrical configuration of both supercells of this example implementation is shown in the insets of FIG. 1 and also in FIG. 5. A phonon dispersion along the ΓX path is presented in the same figure (FIG. 1) for both the uniform thin film and the pillared thin film. For the thermal conductivity predictions in this implementation, the umklapp scattering parameters are kept constant between the uniform and pillared cases. This provides a conservative approximation for the latter since it has been shown that avoided crossings cause a slight reduction of phonon lifetimes. Boundary scattering parameters are also kept constant since the pillars in this implementation are relatively small in the cross-sectional area and are external to the main cross section of the nominal thin film; and they are, therefore, not expected to cause a significant deviation from the uniform thin-film boundary scattering parameters. For this model, appropriately fitted A and B parameters are used for a t=2.72-nm thin film using the experimental data in K. E. Goodson and Y. S. Ju, *Annu. Rev. Mater. Sci.* 29, 261 (1999); W. J. Liu and M. Asheghi, *Appl. Phys. Lett.* 84, 3819 (2004); and *J. Appl. Phys.* 98, 123523 (2005) (and as described further herein) and considering the case of p=0.

FIG. 1, including sub-sections (a) and (b), shows a comparison of the phonon dispersion and thermal conductivity of a pillared silicon thin film with a corresponding uniform thin film. The dispersion curves, in this implementation, are colored to represent the modal contribution to the cumulative thermal conductivity, normalized with respect to the highest modal contribution in either configuration. The full spectrum is shown in (a) and a close up view of the 0≤ω≤2.5 THz frequency range portion is shown in 1(b). Phonon DOS and the thermal conductivity, in both differential and cumulative forms, are also shown. The gray regions represent the difference in quantity of interest between the two configurations. The introduction of the pillar in the unit cell causes striking changes to all these quantities. FIG. 1 shows results of the proof of concept implementation. As can be seen in FIG. 1: (i) The lower (acoustic) branches contribute to a significant portion of the thermal conductivity in both the uniform and pillared thin films. In addition, we see that the higher wave numbers also significantly contribute to the thermal conductivity. One factor to recall here is that the boundary scattering term has been set to the thin-film thickness, i.e., L=t=2.72 nm. When this value is very small, the long waves (i.e., those near the F point in the band diagram) are effectively eliminated and, as a result, the low contribution is obtained at the low wave number end of the acoustic branches. (ii) The presence of the pillars causes a series of flat locally resonant phonon mocks to appear across the entire spectrum, i.e., at both subwavelength and superwavelength frequencies. These modes interact with the underlying acoustic and optical thin-film phonon modes and form a hybridization of the dispersion curves. This in turn leads to a flattening of the branches at the intersections and hence a reduction in the group velocities and the thermal conductivity. The introduction of the pillars reduces the thermal conductivity to 48% of that of the uniform thin film. This is a remarkable outcome considering that the pillars introduce 288 new degrees of freedom per unit cell, each of which add one more branch to the summation carried out in Equation (1). Thus even though more phonons are added to the system, less energy is actually carried due to the hybridization mechanism. (iii) We note that the branches under 1.5 THz (mostly acoustic branches) for the uniform case contribute approximately to 40% of the thermal conductivity. The presence of the pillars significantly modifies the relative contribution of these branches, which now contribute to roughly 60% of the thermal conductivity. With the pillars, nearly 70% of the thermal conductivity is accounted for by phonons below 2.5 THz compared to 60% without pillars. For the pillared case, the vast majority of this 70% falls within the range $0.5<\omega\leq2.5$ THz. The remaining 30% are mostly accounted for in the range $2.5<\omega\leq10$ THz. These results indicate that the flattening effect caused by the numerous local resonances on the dense high frequency optical modes causes the contribution profile to shift downwards, allowing the acoustic and low frequency optical modes to carry more weight. However, at very high frequencies (above 10 THz), the thin-film dispersion curves are already too flat, providing the horizontal resonant branches little opportunity for any noticeable alteration of the group velocities.

In these implementations, modeling of the dispersion of the thin film was performed with pillar-shaped protrusions utilizing atomic-scale LD. However, due to the profound computational intensity associated with solving large complex eigenvalue problems, the model used in these implementations was limited to very small sizes, although larger models could also be performed with additional computing resources. In the particular example implementation described above, however, a model approximately on the order of 5 nm in supercell side length was used. Given that current nanostructure fabrication technology is practically limited to minimum feature sizes roughly an order of magnitude larger, a continuum-based finite-element (FE) model was also used for LD calculations, although special attention was paid to the FE resolution in terms of the number of elements per CC, $n_{ele}/CC$, when compared to the atomic scale model. To understand the sensitivity of the thermal conductivity prediction to the FE resolution, comparisons of results obtained by both FE and atomic-scale LD models are included below. From these results it is noted that with increased FE resolution, the FE model maintains a consistent trend and approaches the atomic-scale LD model. Also examined below is the FE performance for a larger model (for which atomic-scale LD results are not available) and again a converging trend is observed.

Figure 4:
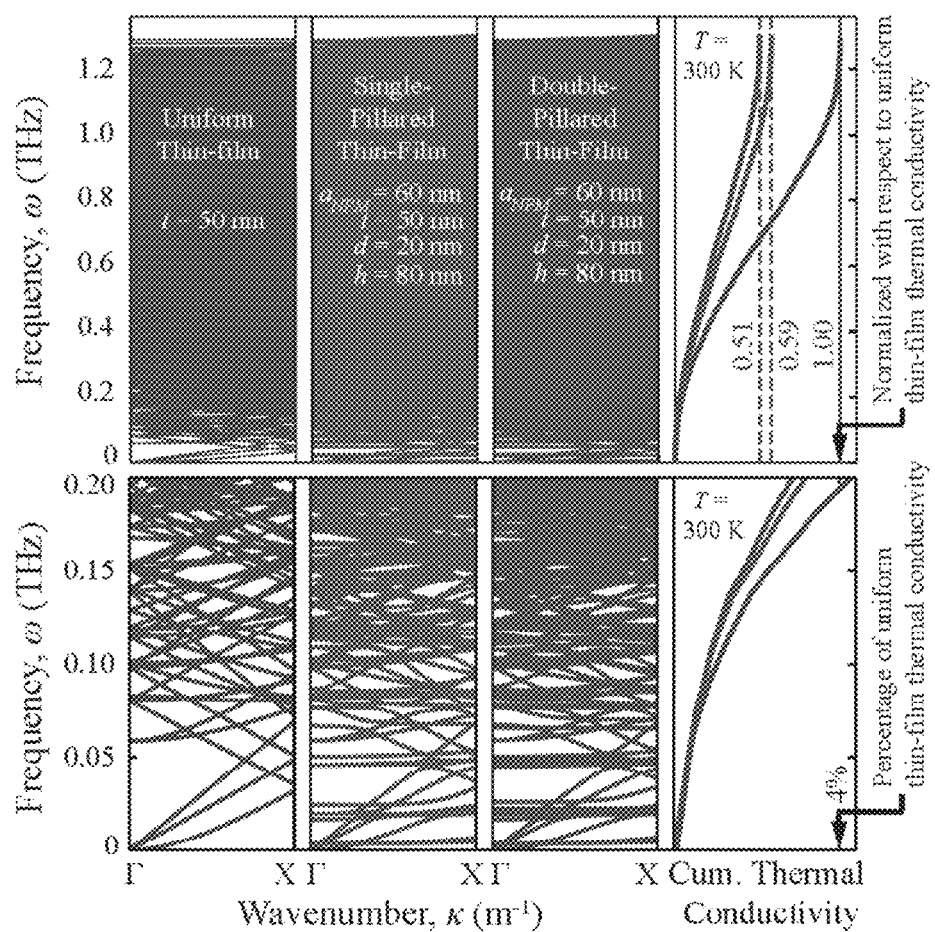
FIG. 4 shows a full dispersion comparison of a uniform t=50-nm thin film (left), with a t=50-nm thin film with an 80-nm single pillar (center), and a t=50-nm thin film with an 80-nm double pillar (right).

Identical scattering parameters were also used for the uniform and pillared models, noting that this approximation improves with an increase in thin-film thickness. The results appear in FIG. 4 for a NPM with pillars on either one surface or on two surfaces and for a uniform thin film. Specifically, FIG. 4 shows a full dispersion comparison of a uniform t=50-nm thin film (left), with a t=50-nm thin film with an 80-nm single pillar (center), and a t=50-nm thin film with an 80-nm double pillar (right). In this particular implementation, for example, the thin film includes a suspended membrane as the thin film base material. A focus on the first few dispersion branches is also shown, as well as the cumulative thermal conductivity as a function of frequency. Note a few distinctive traits in these results: (i) consistent with FIG. 1, the maximum frequency between the uniform and pillared cases remains the same despite the extra branches that get introduced due to the added FE degrees of freedom of the pillar, and (ii) despite this addition of degrees of freedom, once again the NPM has a reduced thermal conductivity (59% of the uniform thin film's value) due to the penetration of the local resonance branches into the phonon spectrum. With a higher FE resolution, the predicted reduction is expected to increase (see below). For the double pillared thin film, additional flat branches appear which improves the performance further and causes further reduction in the thermal conductivity to 51% of the uniform thin film's value. In order to examine the effect of the choice of the umklapp scattering parameters, these calculations were repeated using values for bulk silicon ($A=2.10\times10^{-19}$ s/K and B=180 K; see B. L. Davis and M. I. Hussein, AIP Advances 1, 041701, 2011) and obtained $k_{Pillared}/k_{Uniform}$ values of 60% and 54% for the single and doubled pillared thin films, respectively. These numbers are very close to those reported above using the thin-film parameters because at a thickness of t=50 nm, the umklapp scattering behavior approaches that of the bulk material. Finally, the analysis was repeated with a specularity parameter of p=1 and resulted in $k_{Pillared}/k_{Uniform}$ values of 76% and 73% for the single and doubled pillared thin films, respectively (using recalculated thin-film umklapp scattering parameters, $A=1.20\times10^{-18}$ s/K and B=15 K, which were obtained using p=1).

Locally resonant acoustic metamaterials have been investigated to control acoustic waves in macroscale applications where characteristic size is on the order of microns or larger. In the present applications, however, a locally resonant NPM is provided to control heat waves. In acoustics, local resonances couple with the dispersion curves associated with the periodic arrangement of the oscillators/resonators, or the long wave linear dispersion of the embedding medium when looking only at the subwavelength regime. In the thermal applications discussed herein, the coupling is between the local resonance modes and the atomic-scale dispersion of the underlying crystalline material. Acoustic metamaterials, like their electromagnetic counterparts, derive their unique properties at subwavelength frequencies. In NPMs, the local resonances produce desirable effects across the entire spectrum, including the superwavelength regime. Indeed, despite the injection of additional phonons (associated with the added degrees of freedom of the oscillators/resonators), the thermal conductivity has been reduced, and this is attributed to the hybridizations taking place at both subwavelength and superwavelength frequencies. This outcome provides a broader perspective to the definition of a metamaterial. Finally, in the particular implementation of the NPM configuration based on pillared thin films, a powerful mechanism for reducing the thermal conductivity is provided without altering the base thin-film material (e.g., without the insertion of boundary-type scatterers such as holes, inclusions, interfaces, impurities, etc.) and is therefore expected to have a minimal effect on the electrical conductivity. This scenario is markedly advantageous for thermoelectric energy conversion. In this implementation, models provide a conservative prediction of thermal conductivity reduction by as high as a factor of 2 compared to a corresponding uniform thin film. Upon analysis with higher resolution models, optimization of dimensions, exploration of other base material and local oscillator/resonator material and geometric configurations, merging of the local oscillator/resonator (e.g., pillars) concept with other 2D (or 1D or 3D) base materials that originally (i.e., without the oscillators/resonators) have good thermoelectric properties, such as composites and alloys, among other factors, it is perceivable to reach exceedingly high values of ZT using the concept of a phononic metamaterial.

Thin Film Umklapp Scattering Parameters

Figure 6:
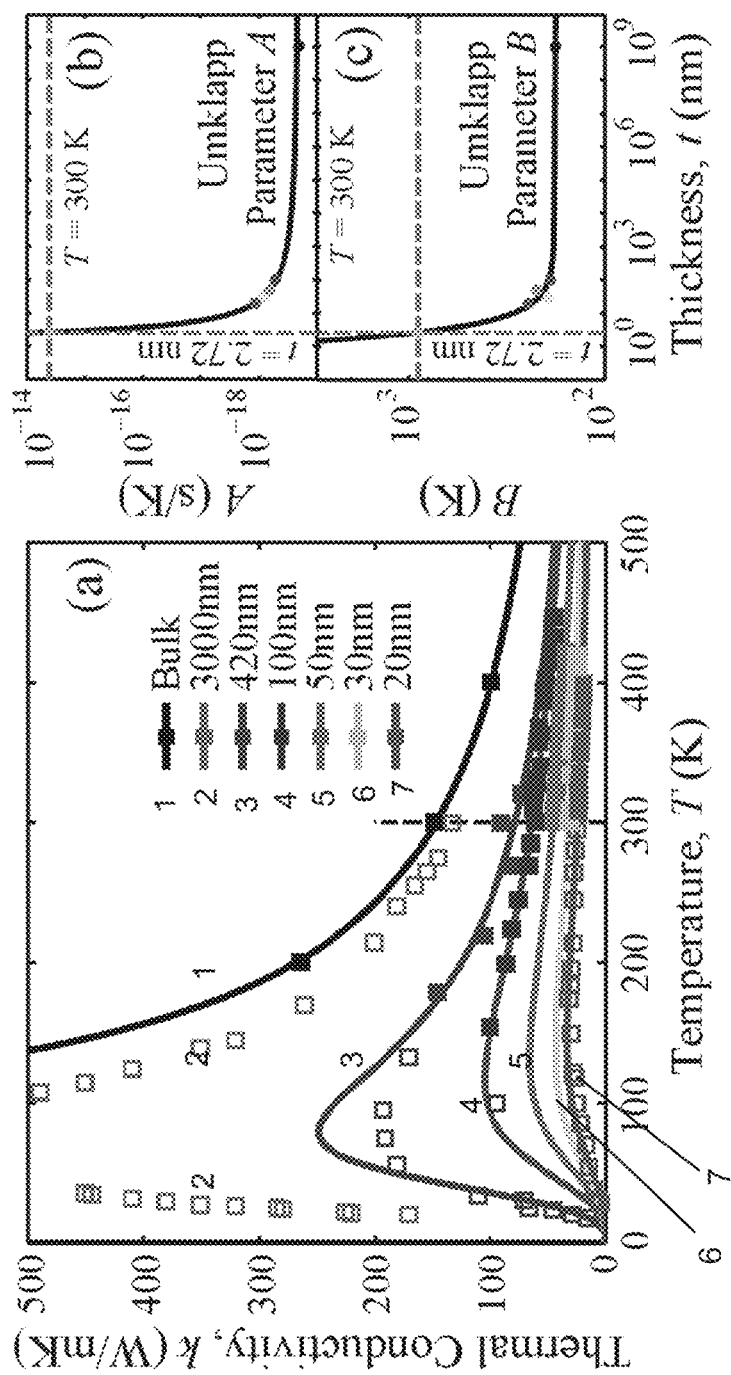
FIG. 6 shows (a) Thermal conductivity as a function of T for various thin film base materials (e.g., suspended membrane thin film base materials). The squares are measurements (K. E. Goodson and Y. S. Ju, Annu. Rev. Mater. Sci. 29, 261 (1999); W. J. Liu and M. Asheghi, Appl. Phys. Lett. 84, 3819 (2004); J. Appl. Phys. 98, 123523 (2005)) and the solid lines represent the fitted model. The subfigures (b) and (c) show Umklapp scattering parameters, A and B, respectively, as a function of t at room temperature. These parameters are determined by fitting the thermal conductivity predictions with the empirical data points shown in (a). The Callaway-Holland 2D thermal conductivity formulation, reinforced with full dispersion information, is shown to represent the experimental values very well for various t values. For thin films with thickness smaller than that is empirically available, an extrapolation is carried out. This is demonstrated in (b) and (c) for the thickness value of t=2:72 nm, where $A=4:14 \times 10^{-15}$ s/K and B=899 K.

In one implementation, a thermal conductivity prediction Callaway-Holland (C-H) model (see J. Callaway, *Phys. Rev.* 113, 1046 (1959); M. G. Holland, ibid. 132, 2461 (1963)) is fitted to experimental data provided in K. E. Goodson and Y. S. Ju, *Annu. Rev. Mater. Sci.* 29, 261 (1999); W. J. Liu and M. Asheghi, *Appl. Phys. Lett.* 84, 3819 (2004); and *J. Appl. Phys.* 98, 123523 (2005) in order to obtain estimates for the Umklapp scattering parameters, A and B. In this implementation, the model was fitted for a variety of thicknesses, t=20; 30; 50; 100; 420 nm, around a temperature of T=300K. FIG. 6a shows the empirical data used (marked with square dots) as well as the results from the model for the case of zero surface specularity, i.e., p=0. It is noted that due to the limited availability of data across a wide temperature range, and the inconsistency in the number of data points available for each thickness, only the solid dots were considered for the fitting. This ensures the expected trends at T=300K while simultaneously providing a consistent asymptotic behavior at high temperatures whereby the order of the curves is maintained according to the thickness value for each curve. Upon obtaining the parameter values for an adequate number of thin-film thicknesses, a second level of curve fitting is performed to harness scattering parameters for a wide range of thin-films as shown in FIGS. 6b and 6c (see B. L. Davis, M. F. Su, I. El-Kady, and M. I. Hussein, Proc. ASME IMECE, IMECE2012-89902 (2012) for further details on this two-step fitting process).

Finite-Element Resolution Analysis of Thin-Film Models

Figure 7:
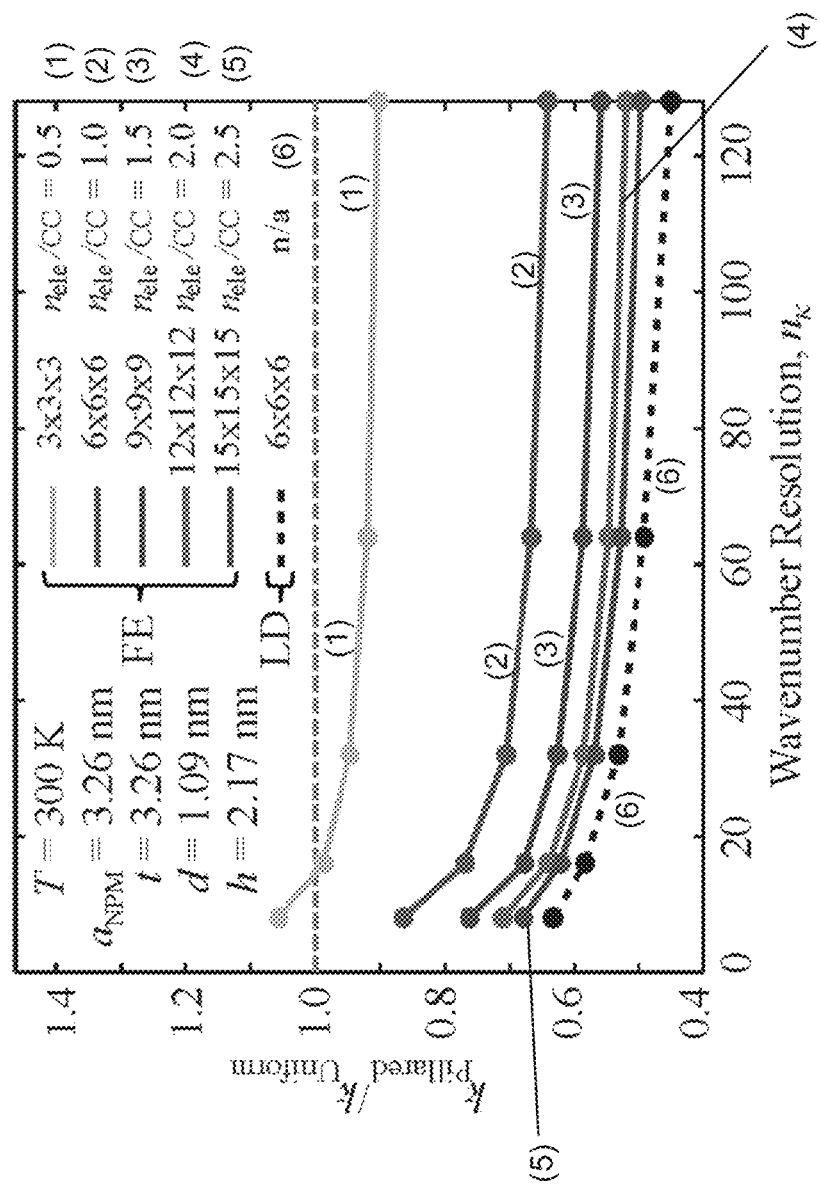
FIG. 7 shows a comparison of the thermal conductivity of a t=3:26-nm thin film base material (e.g., suspended membrane thin film base material) with and without the presence of pillars utilizing FE of varying $n_{ele}$=CC (units of conventional cell size) and $n_\kappa$ resolutions (solid lines). The unit cell dimensions of the FE model are equivalent to a corresponding atomic-scale LD model (dashed line) to enable a direct comparison.

We consider a supercell whose thin-film base has a thickness of $A_z$=t=3:26 nm (A=4.17×10$^{-16}$ s/K, B=705 K and p=0) and the rest of the dimensions as given in FIG. 7. These dimensions are selected to enable a comparison with an atomic-scale LD supercell model with a thin-film base composed of 6 conventional cells (CC) and a pillar base and height formed from 2 and 4 CC, respectively. For the finite-element (FE) model, three-dimensional cubic elements were used. In FIG. 7, we directly compare the reduction in the thermal conductivity for the thin-film with pillars normalized with respect to the uniform case, for various FE resolutions, $n_{ele}$=CC (where $n_{ele}$ is the number of finite elements), and wavenumber discretization resolutions, $n_\kappa$. First, we find that as we increase $n_k$ (which numerically improves the prediction of the C—H model), the thermal conductivity converges to a constant value. Second, when $n_{ele}$=CC is increased, the reduction in the thermal conductivity due to the presence of the pillars increases and also converges to a constant value. As we saw in the smaller-sized problem of FIG. 1, the overall effects of the coupling/hybridizations/interactions are relatively higher on the optical modes than on the low-frequency modes due to the large number of local resonances penetrating into a high density of optical branches. Consequently, since more optical branches appear with an increase in FE resolution an improvement in the thermal conductivity reduction was observed. Finally, with increased FE resolution, the FE model maintains a consistent trend and approaches the atomic-scale LD model. This provides confidence that, for a given resolution, the FE model conservatively captures the nanoscale phonon dynamics behavior as far as the effects of the pillars on the overall dispersion, and hence the thermal conductivity reduction, are concerned.

Figure 8:
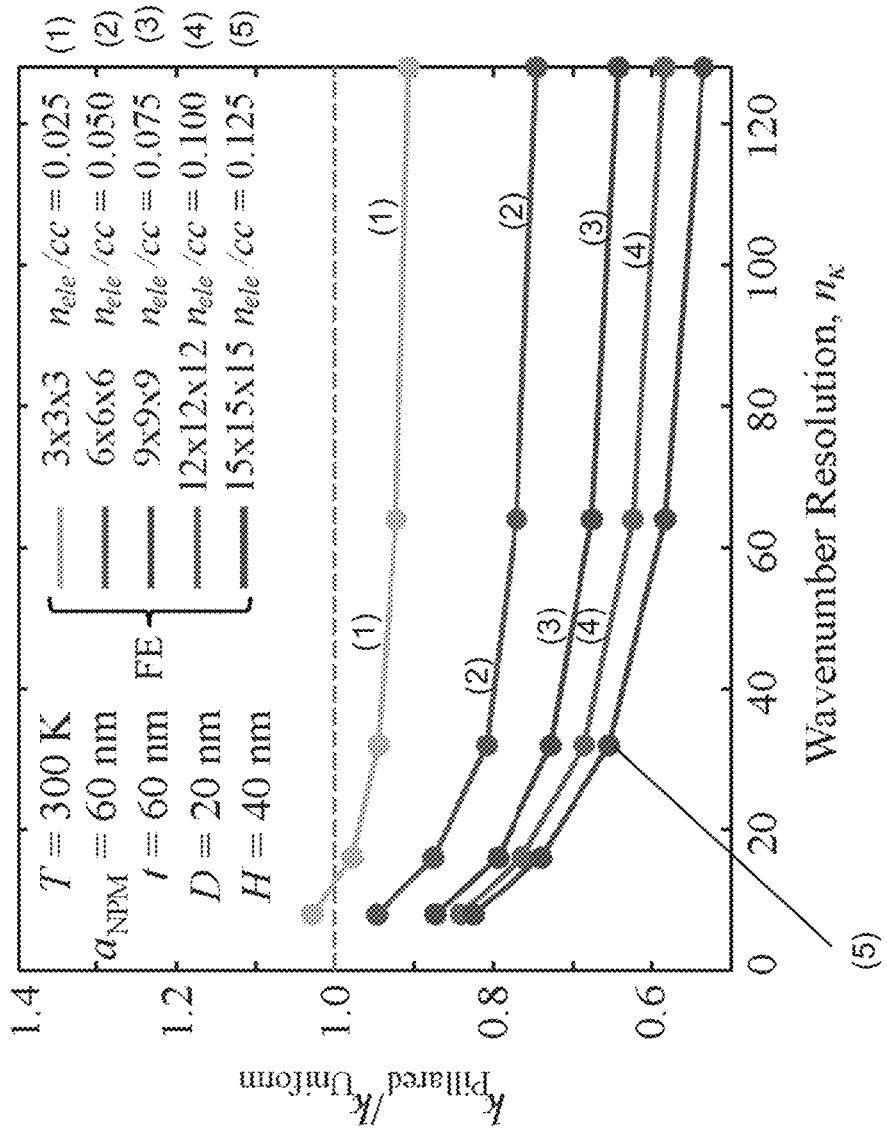
FIG. 8 shows a comparison of the thermal conductivity of a t=60-nm thin film base material (e.g., suspended membrane thin film base material) with and without the presence of pillars utilizing FE of varying $n_{ele}$=CC and $n_\kappa$ resolutions. The steady but slow rate of convergence observed indicates that upon further increase in FE resolution, the relative thermal conductivity, $k_{Pillared}/k_{Uniform}$, is expected to decrease substantially.

Upon proceeding to a thin-film model with a larger thickness, it is difficult to maintain the same level of FE resolution due to limitation of computational resources. To examine the convergence performance under such limitation, a larger thin-film model using substantially lower $n_{ele}$=CC values was analyzed. Uniform and pillared thin-films with a thickness of t=60 nm (A=5:90×10$^{-19}$ s/K, B=200 K and p=0) were selected. The NPM supercell here has a base length of $a_{NPM}$=60 nm, a pillar width of d=20 nm and a pillar height of h=40 nm. The results are shown in FIG. 8 where a reduction in the thermal conductivity is observed. FIG. 8 also displays a converging trend as that is shown in FIG. 7 except that the rate of convergence is slower. This in fact suggests that if the $n_{ele}$/CC resolution is increased further, a substantial additional reduction in the thermal conductivity of the NPM compared to the uniform thin-film case is to be expected. Upon comparing with bulk silicon, this estimated relative reduction is to be added to a reduction of roughly a factor 3 (attributed to the transitioning from bulk to a thin-film configuration) as suggested by FIG. 6a.

Although pillar-shaped protrusions that function as local oscillators/resonators are discussed in various example implementations, many types and shapes of local oscillators/resonators (e.g., protrusions (with all the vibrating atoms they comprise) extending from a surface of a contiguous solid medium, such as a thin film, or localized oscillators/resonators (with all the vibrating atoms they comprise) embedded within the main body of a contiguous solid medium) are contemplated and may be interchanged, in whole or in part, with other implementations described. FIGS. 2, 3, 5 and 9 through 14, for example, demonstrate a variety of geometrical configurations for a nanophononic metamaterial as described herein. In these implementations, for example, a contiguous, solid medium serving as a skeleton (in various implementations, for example, the medium may be composed of a semiconducting material or any type of a crystalline or at least partially crystalline material or composite or alloy with relatively good raw thermoelectric properties) and an assembly of substructures that serve as local resonators/oscillators are provided. In one implementation, for example, the main body or skeleton takes the form of a 3D (bulk), 2D (thin-film, sheet, membrane or plate) or 1D (wire, rod, column or beam) medium. Furthermore, in one implementation, for example, the surfaces of a 3D main body may be straight or curves, and, similarly, the surfaces, or the centerline along the thin sections, of a 2D or a 1D main body may be straight or curved. The oscillators/resonators can take a variety of distributions, shapes and sizes as shown in the drawings and could lie within the main body or extrude out of the main body. Furthermore, the oscillators/resonators (with all the vibrating atoms they comprise) can take a variety of orientations and material compositions. The oscillators/resonators (with all the vibrating atoms they comprise) could be distributed in a perfectly periodic fashion, randomly, or in any other manner. The geometric dimensions of the oscillators/resonators (with all the vibrating atoms they comprise) could be identical, or could vary within a group whereby the entire group repeats in an identical fashion, or could vary in random fashion, or could be arranged in any other pattern or manner.

It should be noted that in addition to the configurations shown in each sub-figure, it is possible to mix and match various features from different sub-figures. For example, having oscillators/resonators (with all the vibrating atoms they comprise) on both the top and bottom sides of a thin film as shown in FIGS. 2A and 2B may be applied to all the other cases showing thin-films, such as the multi-pillared thin films shown in FIGS. 2D and 2E. Furthermore, the relative dimensions of all features, as well as the relative spacing between the features, shown in all the figures could be varied and it is also possible to use different materials for the main body versus the oscillators/resonators (with all the vibrating atoms they comprise).

A choice to be made between the various configurations may depend on one or more of several factors such as thermoelectric energy conversion performance, stability, toxicity, ease of fabrication and scalable manufacturing, ease and suitability of integration into a thermoelectric device, cost, among other factors.

Figure 3:
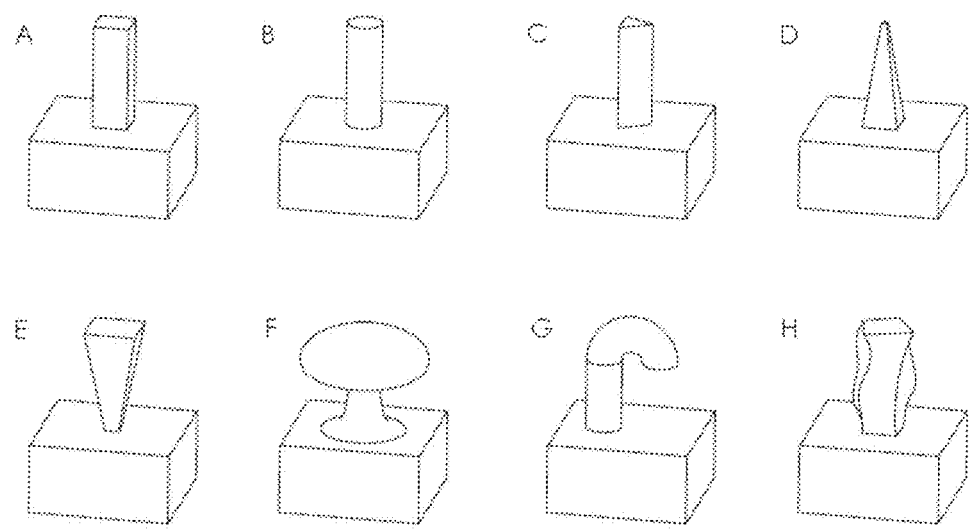
FIG. 3 depicts a variety of 1D locally resonant oscillator geometries/shapes of the type that extends from a base material.

FIG. 3, including FIGS. 3A through 3H, show a plurality of example implementations of pillar-shaped protrusions forming local oscillators/resonators (with all the vibrating atoms they comprise) on one or more surfaces of a contiguous solid medium (e.g., a 3D bulk medium, a 2D thin-film, sheet, membrane or plate medium or a 1D wire, rod, column or beam medium). FIG. 2A, for example, shows different perspective views of one implementation of a thin film medium including a generally two-dimensional (2D) uniform, periodic array of equal-sized pillars disposed on a single surface (e.g., a top surface) of the thin-film medium. Although the pillars are shown in FIG. 2A to have a square cross-section, they can have any other cross-sectional shape such as rectangle, circle, oval, triangle, polygon or other regular or irregular cross-sectional shape (see, for example, cross sections depicted in FIG. 3).

FIG. 2B similarly show different perspective views of a second implementation of a generally two-dimensional (2D) thin-film medium including a periodic, uniform array of equal-sized, pillars disposed on two sides/surfaces (e.g., top and bottom surfaces) of the thin-film medium. In this implementation, the size of the pillars on a first side of the medium (e.g., top pillars) could be equal to or different than the size of the pillars on a second side of the medium (e.g., bottom pillars). In addition, although the pillars are shown in FIG. 2B to have a square cross-section, they can have any other cross-sectional shape such as rectangle, circle, oval, triangle, polygon or other regular or irregular cross-sectional shape (see, for example, cross sections depicted in FIG. 3).

FIG. 2C show different perspective views of a third implementation of a generally two-dimensional (2D) thin-film medium with a periodic array of equal-sized pillars disposed on a first surface of the thin-film medium (e.g., on a top surface) with an empty row appearing every n number of rows (e.g., every third row in the implementation shown in FIG. 2C). Other distributions of full and empty rows, and columns, could also be employed.

FIG. 2D show different perspective views of a fourth implementation of a generally two-dimensional thin-film medium with a periodic array based on a multi-pillared unit cell having pillars with different heights. In the particular example shown in FIG. 2D, for example, each repeated unit cell has multiple pillars each of a different height but the same cross-sectional area and/or shape. In a different implementation, each repeated unit cell could have multiple pillars of different heights and also different cross-sectional areas. While in this configuration, there are four pillars in each unit cell, other configurations could include a larger or smaller number of pillars per unit cell, distributed on only one side or both sides of the thin film.

FIG. 2E shows different perspectives of a fifth implementation of a generally two-dimensional thin-film medium with a periodic array based on a multi-pillared unit cell having pillars with different cross-sectional areas. In the particular example shown in FIG. 2E, for example, each repeated unit cell has multiple pillars each of a different cross-sectional area but the same height and/or shape. In a different implementation, each repeated unit cell could have multiple pillars of different cross-sectional areas and also different heights and/or shapes. While in this configuration, there are four pillars in each unit cell, other configurations could include a larger or smaller number of pillars per unit cell.

FIG. 9 includes sub-parts 9A through 9F showing different example implementations of generally two-dimensional (2D) thin-film/membrane implementations. FIG. 9A, for example, shows different perspective views of a sixth implementation of a generally two-dimensional (2D) thin-film medium including a two-dimensional (2D) periodic array of pillars disposed on a first and second surface of the thin-film medium (e.g., on a top surface and a bottom surface of the medium) in which a thickness (e.g., diameter) of the pillars vary randomly across different locations on the surface of the medium. In this implementation, the pillars on each side have same height, and the height of each pillar at the top is different than at the bottom. In another implementation, the height of each pillar at the top could be the same as at the bottom. Although pillars are shown on two sides in FIG. 9A, another implementation may have a similar configuration of pillars but on a single side only.

FIG. 9B shows different perspective views of a seventh implementation of a generally two-dimensional (2D) thin-film medium including a two-dimensional (2D) periodic array of pillars disposed on a first and second surface of the thin-film medium (e.g., on a top surface and a bottom surface of the medium) in which a height of the pillars vary randomly across different locations on the surface of the medium. In this implementation, the pillars on each side have the same thickness (e.g., diameter), and the thickness of each pillar at the top is the same than at the bottom. In another implementation, the thickness of each pillar at the top could be different than at the bottom. Although pillars are shown on two sides in FIG. 9A, another implementation may have a similar configuration of pillars but on a single side only.

FIG. 9C shows different perspective views of an eighth implementation of a generally two-dimensional (2D) thin-film medium including pillars disposed on a single surface (e.g., on a top surface) and whose positions and heights are random while their thicknesses are all the same. Although pillars are shown on a single side in FIG. 9C, another implementation may have a similar configuration of pillars but on two surfaces of a thin-film medium.

FIG. 9D shows different perspective views of an ninth implementation of a generally two-dimensional (2D) thin-film medium including pillars disposed on a single surface (e.g., on a top surface) and whose positions and thicknesses are random while their heights are all the same Although pillars are shown on a single side in FIG. 9D, another implementation may have a similar configuration of pillars but on two surfaces of a thin-film medium.

FIG. 9E shows different perspective views of a tenth implementation of a generally two-dimensional thin film medium including a random (i.e., non-periodic) array of pillars on a single surface (e.g., on a top surface) with the thickness (e.g., diameter), shapes and heights of the pillars varying randomly across the different sites. Although pillars are shown on a single side in FIG. 9E, another implementation may have a similar configuration of pillars but on two surfaces of a thin-film medium.

FIG. 9F shows a configuration of an eleventh implementation based on a vertical stacking of the of the pillared thin-film material shown in FIG. 2A. The different features shown in other figures such as pillar spacing (see, for example, FIG. 2C), multi-pillar unit cell (see, for example, FIGS. 2D and 2E), walled configuration (see, for example, FIGS. 11A and 11B and their corresponding descriptions) and random pillars (see, for example, FIGS. 9A and 9D) may also apply to this vertical stacking configuration. While the figure shows, as an example three layers of pillared thin films stacked on top of each other, the number of layers of pillared thin films stacked could vary.

FIG. 10 includes sub-parts 10A and 10B showing different example implementations of generally two-dimensional (2D) thin-film/membrane implementations. FIG. 10A, for example, shows different perspective views of another implementation of a generally two-dimensional thin film medium including a bridged structure having a central cylinder supported by thin arms (e.g., beams). In this implementation, for example, the unit cell may be repeated to form a periodic or non-periodic array. The central cylinder (which could be of the same material as the main body of the thin film, or a heavier material) acts as a local oscillator/resonator (with all the vibrating atoms it comprises) in this configuration. Other shapes for oscillators/resonators (with all the vibrating atoms they comprise) in this configuration (e.g., square cylinder, sphere, others) may be employed, and the supporting arms also could have other shapes, number and orientations. This configuration concept could also be realized in the form of a 2D thick plate-like material with each oscillator/resonator (with all the vibrating atoms it comprises) taking the shape of a cylinder, or sphere or other shape.

FIG. 10B shows different perspective views of another implementation of a generally two-dimensional thin film medium with a periodic array of circular inclusions comprising a highly complaint material (i.e., a material that is significantly less stiff than the material from which the main body of the thin film is made). In this particular implementation, for example, each inclusion of a compliant material in this configuration may act as an oscillator/resonator (with all the vibrating atoms it comprises) (i.e., similar to each pillar in FIG. 2A). Other shapes and sizes for the inclusions may also be adopted. The sites of the compliant inclusions may be ordered in a periodic fashion (as shown) or may be randomly distributed (as in FIGS. 9C and 9D). Similarly, the size of each inclusion may be uniform or may vary in groups (as in FIGS. 2D and 2E) or vary randomly.

FIG. 11 includes subparts 11A and 11B showing example generally two-dimensional (2D) thin film implementations. FIG. 11A, for example, shows different perspective views of another implementation of a generally two-dimensional (2D) thin film medium including a one-dimensional (1D) periodic array of equal-sized walls disposed on a first surface of the thin-film medium (e.g., a top surface of the thin-film medium). In this particular implementation, each wall acts as an oscillator/resonator (with all the vibrating atoms it comprises) representing a 2D version of a pillar. The walls have a uniform cross section along the length, but other configurations could have a periodically or non-periodically varying cross-section along the length of the wall. Although walls are shown on a single side in FIG. 11A, another implementation may have a similar configuration of walls but on two surfaces of a thin-film medium.

FIG. 11B shows different perspective views of another implementation of a generally two-dimensional (2D) thin film medium including a two-dimensional (2D) periodic array of equal-sized walls disposed on a first surface of the thin-film medium (e.g., a top surface of the thin-film medium). In this particular implementation, each wall acts as an oscillator/resonator (with all the vibrating atoms it comprises) representing a 2D version of a pillar. Each wall has a uniform cross section along the length, but other configurations could have a periodically or non-periodically varying cross-section along the length of each wall. The thickness of the vertical walls could be different than the thickness of the horizontal walls. Although walls are shown on a single side in FIG. 11B, another implementation may have a similar configuration of walls but on two surfaces of a thin-film medium.

FIG. 12 includes subparts 12A and 12B showing example generally one-dimensional (1D) implementations. FIG. 12A shows different perspective views of another implementation of a generally one-dimensional (1D) wire, rod, column or beam medium including a cyclic periodic array of equal-sized pillars disposed along the circumference of the main body medium. In this particular implementation, each pillar acts as an oscillator/resonator (with all the vibrating atoms it comprises). In other implementations, the pillars may have other shapes. While in this configuration, eight pillars protrude at each lattice site, other configurations could include a larger or smaller number of pillars per lattice site.

FIG. 12B shows different perspective views of another implementation of a generally one-dimensional (1D) wire, rod, column or beam medium including a cyclic distribution of pillars of different heights disposed along the circumference of the main body medium. In this particular implementation, each pillar acts as an oscillator/resonator (with all the vibrating atoms it comprises). In other implementations, the pillars may have other shapes. While in this configuration, four pillars protrude at each lattice site, other configurations could include a larger or smaller number of pillars per lattice site. Furthermore, in other implementations, the radial distribution of the pillars could be random. Furthermore, in other implementations, the heights of the pillars and/or shapes and/or thicknesses could be random along both the radial and axial directions.

FIG. 13 includes subparts 13A and 13B showing example generally one-dimensional (1D) implementations. FIG. 13A, for example, shows different perspective views of another implementation of a generally one-dimensional (1D) wire, rod, column or beam medium including a one-dimensional (1D) periodic array of cylinders disposed along the axis of the main body medium. In this particular implementation, each cylinder acts as an oscillator/resonator (with all the vibrating atoms it comprises). In other implementations, the cylinders may have other shapes.

FIG. 13B shows different perspective views of another implementation of a generally one-dimensional (1D) wire, rod, column or beam medium including a one-dimensional (1D) periodic array where each unit cell consists of multiple cylinders of different diameters and/or thicknesses disposed along the along the axis of the main body medium. In this particular implementation, each cylinder acts as an oscillator/resonator (with all the vibrating atoms it comprises). In other implementations, the cylinders may have other shapes. While in this configuration, there are three cylinders in each unit cell, other configurations could include a larger or smaller number of cylinders per unit cell. Furthermore, in other implementations, the size, shape and positioning of the cylinders along the axis of the main body may be random.

FIG. 3 show a variety of shapes and designs for a pillar. Any of these designs, or other shapes that would allow the pillar to function as an oscillator/resonator (with all the vibrating atoms it comprises), may be applied in conjunction with the numerous design concepts/features shown FIGS. 2, 9 and 12.

FIG. 14 includes subparts 14A and 14B showing example generally three-dimensional (3D) implementations. FIG. 14A, for example, shows different perspective views of another implementation of a 3D material configuration including a bridged structure having a central sphere supported by thin arms (e.g., beams). In this implementation, for example, the unit cell may be repeated to form a periodic or non-periodic array. The central sphere (which could be of the same material as the main body of the thin film, or a heavier material) acts as a local oscillator/resonator (with all the vibrating atoms it comprises) in this configuration. Other shapes for oscillators/resonators (with all the vibrating atoms they comprise) in this configuration (e.g., cubic sphere, cylinder, others) may be employed, and the supporting arms also could have other shapes, number and orientations. In analogy to the configuration shown in FIG. 10A (which is a 2D version), the sites of the local resonators may be ordered in a periodic fashion (as shown) or may be randomly distributed.

FIG. 14B show a 3D material configuration with a periodic array of cubic inclusions comprising a highly complaint material (i.e., a material that is significantly less stiff than the material from which the main body is made). The compliant material in this configuration acts as an oscillator/resonator with all the vibrating atoms it comprises (i.e., similar to the pillars in FIG. 2A). Other shapes for the inclusions may be adopted. In analogy to the configuration shown in FIG. 10B (which is a 2D version), the sites of the compliant inclusions may be ordered in a periodic fashion (as shown) or may be randomly distributed. Similarly, the size of each inclusion may be uniform or may vary in groups or vary randomly.

FIGS. 15A through 21 include example implementations of phononic metamaterials that may be scaled at any number of dimensions, such as nanoscale, microscale, milliscale or even larger or smaller scales. The various implementations, for example, may include atomically disordered inclusions (e.g., amorphous inclusions) disposed within an at least partially crystalline base material and/or layers/pillars/walls of atomically disordered materials (e.g., amorphous materials) disposed near, adjacent or juxtaposed to an at least partially crystalline base material. Similar to the implementations discussed with reference to FIGS. 2, 3, 5A, 5B and 9-14, for example, the inclusions and/or layers of atomically disordered (e.g., amorphous) material within or near an at least partially crystalline base material may reduce group velocities of phonons traveling in the at least partially crystalline base material by interacting one or more vibration modes generated by at least one locally resonant oscillator (including those due to atomic vibrations) formed by the inclusions and/or the extending substructures (e.g., layers, pillars, walls, plates, rings) with one or more of the phonons. Further, thermal transport through the material may be reduced while at least substantially allowing electron transport through the base material channel(s).

The inclusions and/or extending substructures (e.g., layers, pillars, walls, etc.) shown in FIGS. 15A through 28 can take a variety of distributions, shapes and sizes as shown in the drawings and could lie within the main body or extrude out of the main body. Furthermore, the inclusions and/or extending substructures may take a variety of orientations and material compositions. The inclusions and/or extending substructures may be distributed in a perfectly periodic fashion, randomly, or in any other manner. The geometric dimensions of the inclusions and/or extending substructures could be identical, or could vary within a group whereby the entire group repeats in an identical fashion, or could vary in random fashion, or could be arranged in any other pattern or manner. In one particular implementation, for example, atomically disordered inclusions and/or extending substructures may be distributed within a metamaterial such that vibration modes generated by the atomically disordered inclusions and/or extending substructures extend generally throughout an at least partially crystalline base material of the metamaterial and, thus, are able to interact with passing phonons within that base material and reduce one or more group velocities of the phonons traveling in the at least partially crystalline thermoelectric base material. Further, thermal transport through the material may be reduced while at least substantially allowing electron transport through the base material channel(s).

Figure 15B:
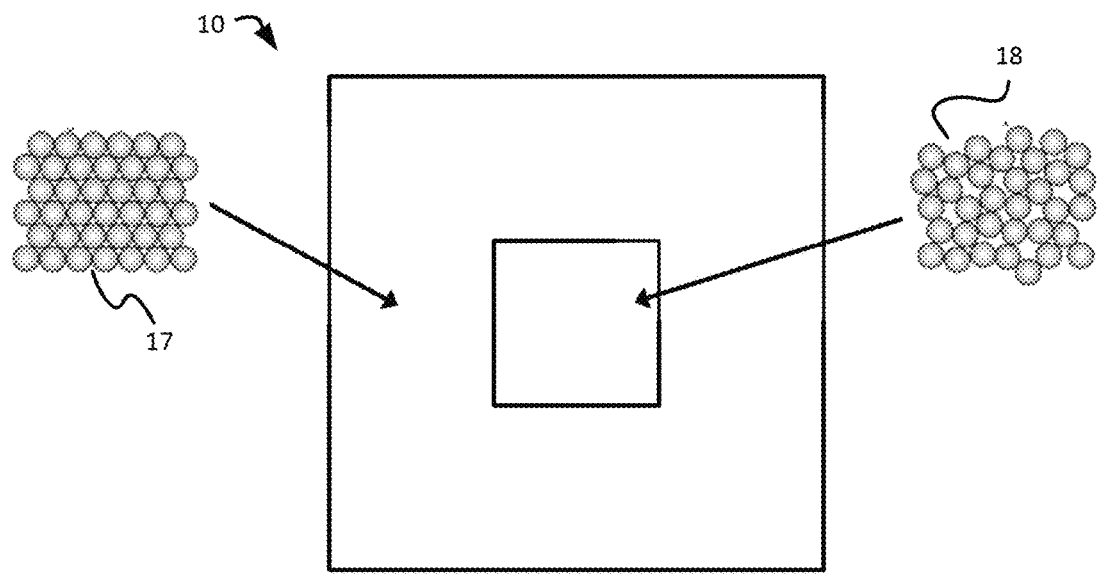
Figure 15C:
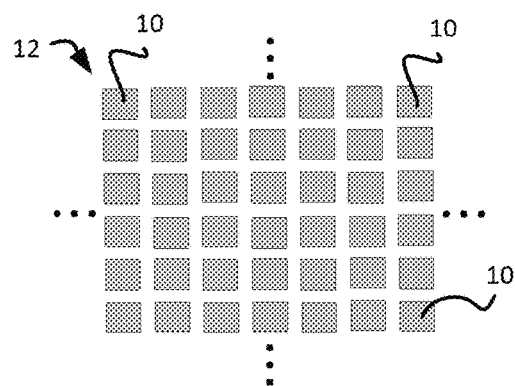

FIGS. 15A-15C show an example implementation of a three-dimensional (3D) unit cell 10 that may be used, for example, within a bulk or other material such as a two- or one-dimensional material like a membrane or a wire, respectively. In one implementation, for example, the unit cell 10 may comprise a unit cell of a bulk material, such as a three-dimensional (3D) bulk material configuration including a periodic array of unit cells each including one or more inclusions 14 (e.g., the cubic inclusions 14 shown in FIG. 15A) disposed within a base material 16. FIG. 15A shows, for example, an implementation of a 3D unit cell 10 comprising a crystalline 17 (e.g., single crystal or partially crystalline) base material 16 structure including one or more inclusions 14 disposed within the crystalline 17 base material 16 structure. Although FIG. 15A shows a single inclusion 14 the unit cell may include a plurality of inclusions disposed within the crystalline structure. FIG. 15B shows a side view of the unit cell of FIG. 15A.

The unit cell 10 may, for example, be repeated in three dimensions to form a three-dimensional (3D) bulk material 12 as shown in FIG. 15C. Similarly, the unit cell may be repeated to create two-dimensional (2D) or one-dimensional structures, such as described herein. The inclusions 14, in various implementations may fully or partially comprise an atomically disordered (e.g., amorphous) material 18 (i.e., a material that is fully or partially non-crystalline). The inclusion material in this particular configuration may also be made of a polycrystalline material or a single-crystal material. The inclusion material may be, for example, the same type of material as the base material or may be made of any other material, such as but not limited to semiconductor, metal, ceramic, polymer and/or composite material(s). The inclusion material in this particular configuration may for example be made of a polymer or partially polymeric material. In one particular implementation, for example, a base material of the unit cell may be constructed with single crystal silicon and one or more inclusion(s) may be made out of amorphous silicon or silicon oxide. The inclusion material in this configuration acts as one or more oscillators/resonators where each atom in the inclusion portion exhibits three natural frequencies/hybridizing resonances. The oscillators/ resonators generate a plurality of local vibration modes that interact with a plurality of phonons moving through the base material channel(s) and slow the group velocities of at least a portion of the interacting phonons. Further, thermal transport through the material may be reduced while at least substantially allowing electron transport through one or more base material channel(s) or transport regions 19. Other shapes for the inclusions may also be adapted. In analogy to the configuration shown in FIG. 10B (which is a two-dimensional version), the sites of the inclusion material may be ordered in a periodic fashion (as shown) and/or may be randomly distributed. Similarly, the size of each inclusion (e.g., within one or more unit cells) may be uniform or may vary in groups or vary randomly.

FIGS. 16A and 16B show another example implementation of a three-dimensional (3D) unit cell 20 that may be used, for example, within a bulk or other material, such as a two- or one-dimensional material like a membrane or a wire, respectively. In one implementation, for example, the unit cell may comprise a unit cell 20 of a bulk base material 26, such as a three-dimensional (3D) bulk base material configuration including an attached layer 24 of a material 28 fully or partially comprising an atomically disordered (e.g., amorphous) material (i.e., a material that is fully or partially non-crystalline). The attached layer 24 may be of any thickness and may fully or partially cover the base material. The attached layer material 28 in this particular configuration may also be made of a polycrystalline material or a single-crystal material. The attached layer may be of the same type of material as the base material or can be made of any other material, such as but not limited to semiconductor, metal, ceramic, polymer and/or composite materials. The attached layer in this particular configuration may, for example, be made of a polymer or partially polymeric material. FIG. 16A shows, for example, an implementation of a 3D unit cell comprising a base material 26 comprising a crystalline material (e.g., single crystal or partially crystalline) structure 27 including one or more attached layers disposed adjacent to, juxtaposed or near the crystalline structure 27. Although FIG. 16A shows a single attached layer 24 the unit cell may include a plurality of attached layers (e.g., on opposing sides of the unit cell) disposed adjacent to, juxtaposed to or nearby the base material 26 comprising a crystalline structure 27. FIG. 16B shows a side view of the unit cell of FIG. 16A In one particular implementation, for example, the base material 26 may be constructed of single crystal silicon and the attached layer constructed of amorphous silicon or silicon oxide. The attached layer 24 in this configuration acts as one or more oscillators/resonators where each atom in the amorphous portion exhibits three natural frequencies/hybridizing resonances. The oscillators/resonators generate a plurality of local vibration modes that interact with a plurality of phonons moving through the base material channel(s) and slow the group velocities of at least a portion of the interacting phonons. Further, thermal transport through the material may be reduced while at least substantially allowing electron transport through one or more base material channel(s). Other shapes, sizes, thicknesses or spatial distribution for the attached layer may be adopted. Also, the attached layer may be attached to the base material on one side or more than one side. In analogy to the configuration shown in FIG. 10B (which is a 2D example), the sites of the attached layer material may be ordered in a periodic fashion (as shown) or may be randomly distributed or may continuously cover the surface. Similarly, the size of each attached layer may be uniform or may vary in groups or vary randomly.

Figure 17:
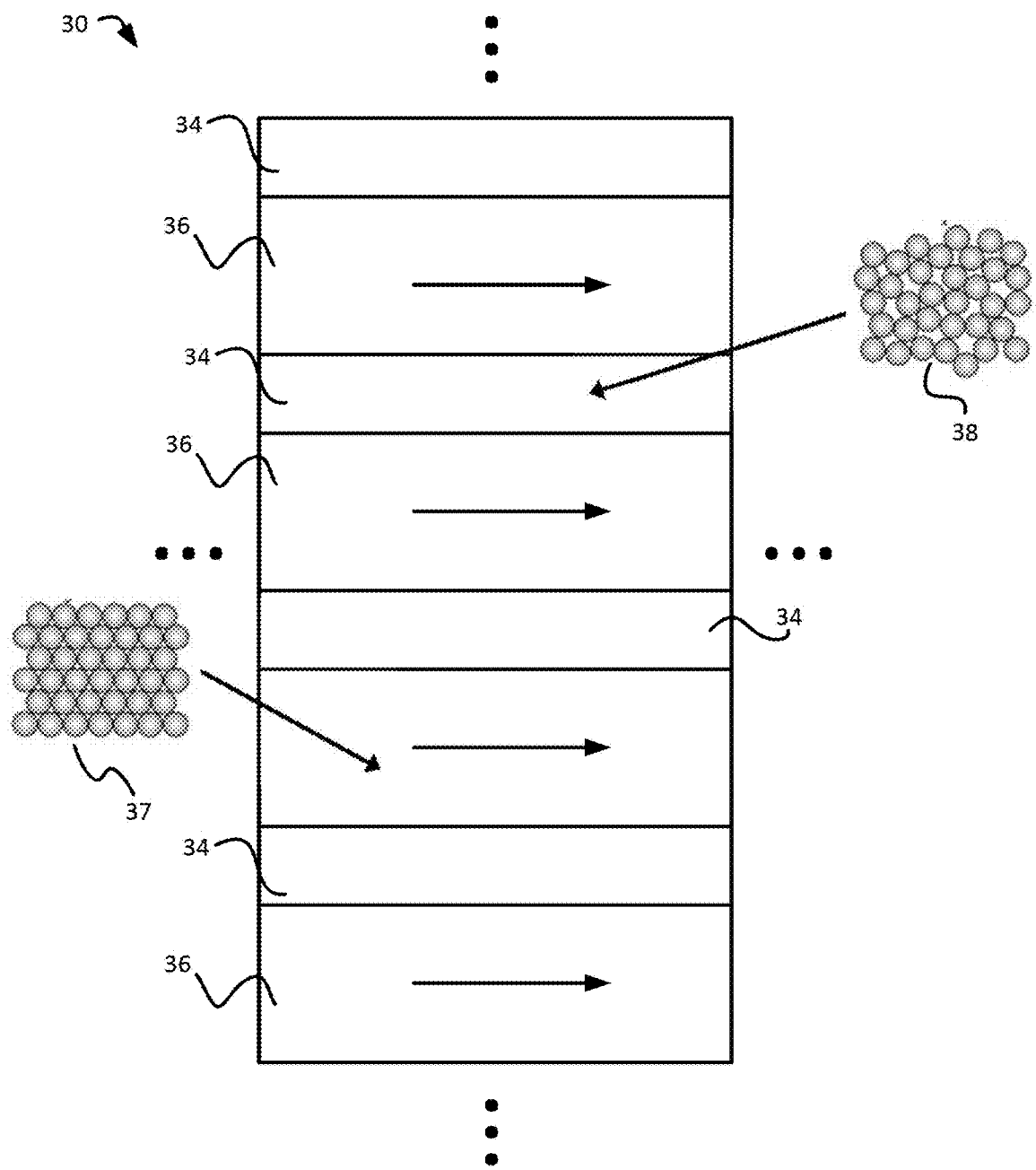
FIG. 17 shows an example of yet another example implementation of one or more unit cell(s) of a material including a plurality of crystalline thermoelectric material layers

FIG. 17 shows an example of yet another example implementation of one or more unit cell(s) 30 of a material including a plurality of crystalline (e.g., single crystal or partially crystalline) thermoelectric material layers 36, such as a silicon or other at least partially crystalline material 37 configured for thermal transport through the material 36 interposed between one or more attached layers 34. The material may, for example, comprise a bulk 3D material, a 2D material or a 1D material. One or more layers 34 of atomically disordered (e.g., amorphous) material 38 are disposed adjacent to, juxtaposed or near the crystalline thermoelectric base material components 36. The atomically disordered (e.g., amorphous) material layers 34, for example, may comprise an atomically disordered (e.g., amorphous) material 38 (i.e., a material that is fully or partially non-crystalline). The interposed layers material in this particular configuration may also be made of a polycrystalline material or a single-crystal material. The attached layer(s) may be of the same type of material as the base material or can be made of any other material, such as but not limited to semiconductor, metal, ceramic, polymer and/ or composite materials. The interposed layers in this particular configuration may, for example, be made of a polymer or partially polymeric material. The unit cell, in this particular implementation, for example, comprises a plurality of crystalline thermoelectric material layers configured for thermal transport through the unit cell and a plurality of attached layers disposed adjacent to, juxtaposed or near one or more of the crystalline thermoelectric material layers.

In one particular implementation, for example, the base crystalline material layer(s) may be constructed of single crystal silicon and the attached layer(s) constructed of amorphous silicon or silicon oxide. The attached layer(s) in this configuration act as one or more oscillators/resonators where each atom in the amorphous portion exhibits three natural frequencies/hybridizing resonances. The oscillators/resonators generate a plurality of local vibration modes that interact with a plurality of phonons moving through the base material channel(s) and slow the group velocities of at least a portion of the interacting phonons. Further, thermal transport through the material may be reduced while at least substantially allowing electron transport through one or more base material channel(s). Other shapes, sizes, thicknesses or spatial distribution for the attached layer may be adopted. Also, the attached layer may be attached to the base material on one side or more than one side. In analogy to the configuration shown in FIG. 10B (which is a 2D example), the sites of the attached layer material may be ordered in a periodic fashion (as shown) or may be randomly distributed within the base crystalline material or may take a continuous form within the base crystalline material. Similarly, the size of each attached layer may be uniform or may vary in groups or vary randomly.

In the particular implementation shown in FIG. 17, for example, a plurality of transport "channels" 39 are formed by the plurality of base material crystalline material layers 36 disposed within the unit cell between the attached layers 34 of atomically disordered (e.g., amorphous) material disposed between two or more channels 39 of the base crystalline material 37. The attached layers 34 of atomically disordered (e.g., amorphous) material 38 act as one or more oscillators/resonators that generate a plurality of local vibration modes (including those stemming from atomic vibrations) within the at least partially crystalline base material channel(s) and interact with a plurality of phonons moving through the base material channel(s) and slow the group velocities of at least a portion of the interacting phonons. In this manner, thermal transport through the material may be reduced while at least substantially allowing electron transport through the base material channel(s).

Figure 18:
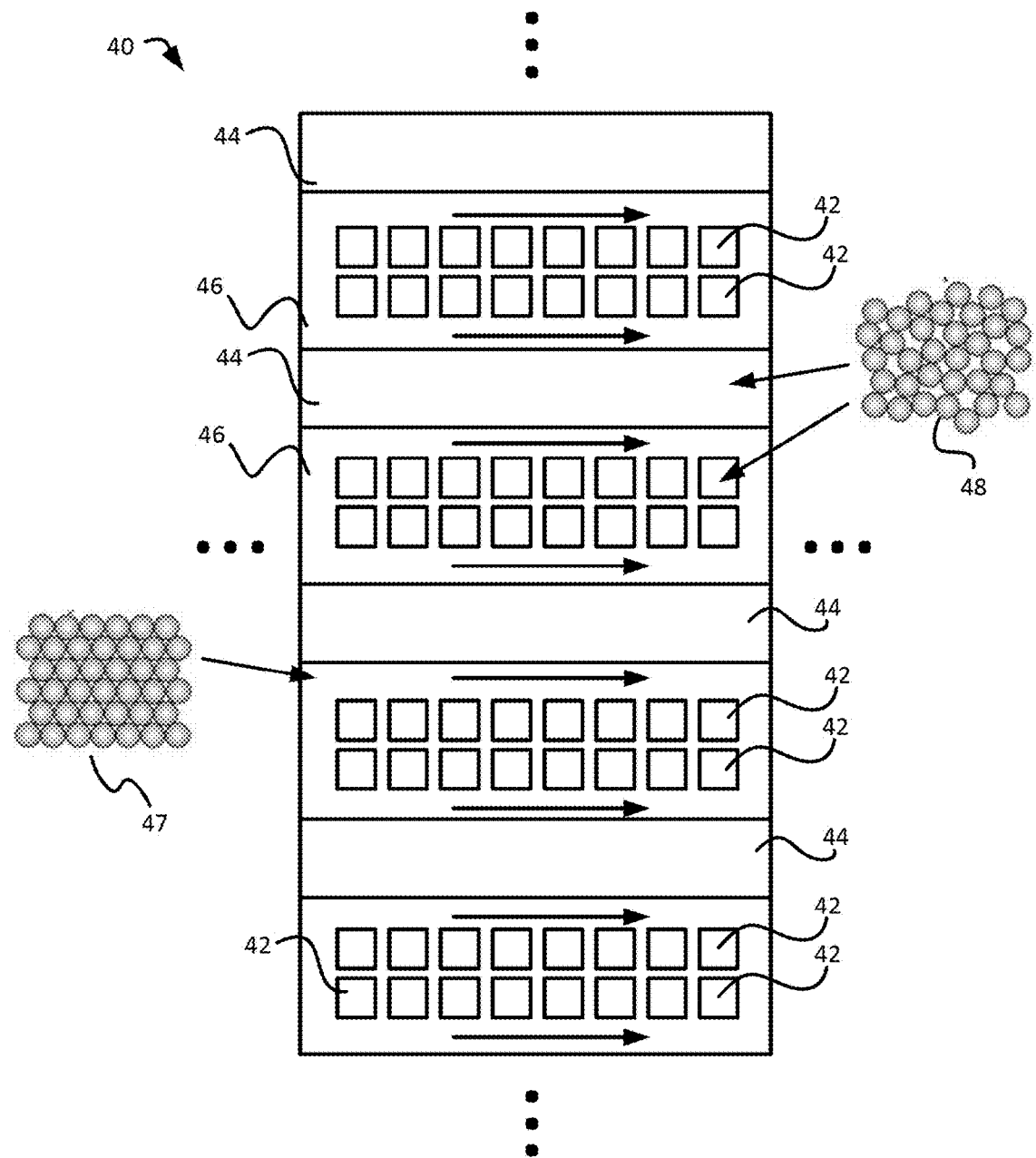
FIG. 18 shows another implementation of one or more unit cell(s) of a material including a plurality of at least partially crystalline base material layers each further including a plurality of atomically disordered inclusions.

FIG. 18 shows another implementation of one or more unit cell(s) 40 of a material including a plurality of crystalline (e.g., single crystal or partially crystalline) thermoelectric base material layer(s) 46, such as a silicon or other material including one or more inclusions 42, such as shown in FIGS. 15A-15C, and further including one or more attached layer(s) 44 disposed adjacent to, juxtaposed to or near the base material layer(s) 46, such as shown in FIGS. 16A and 16B. The base material layer(s) 46, for example, may comprise a crystalline (e.g., single crystal or partially crystalline) structure including one or more inclusions 42 disposed within the crystalline structure of the base material 46. The inclusion(s) 42 and atomically disordered (e.g., amorphous) material layer(s) 44, for example, may comprise one or more amorphous material 48 (i.e., a material that is fully or partially non-crystalline).

The material may, for example, comprise a bulk 3D material, a 2D material or a 1D material. One or more layers 44 of amorphous material 47 attached layers are disposed adjacent to, juxtaposed to or near the crystalline thermoelectric base material 46 having the inclusion(s) 42. In one particular implementation, for example, the inclusion(s) and the attached layer material may also be made of a polycrystalline material or a single-crystal material. The inclusion(s) and attached layer(s) may be of the same type of material as the base material or the other amorphous material or can be made of any other material, such as but not limited to semiconductor, metal, ceramic, polymer and/or composite materials. The unit cell, in this particular implementation, for example, comprises a plurality of crystalline thermoelectric material layers configured for thermal transport through the unit cell. One or more inclusion(s) may be disposed within the thermoelectric material layers and one or more attached layer(s) may be disposed adjacent to, juxtaposed or near one or more of the crystalline thermoelectric material layers.

In one particular implementation, for example, the base crystalline material layer(s) may be constructed of single crystal silicon and the inclusion(s) and attached layer(s) constructed of amorphous silicon or silicon oxide. The inclusion(s) and attached layer(s) in this configuration act as one or more oscillators/resonators where each atom in the amorphous portion exhibits three natural frequencies/hybridizing resonances. Other shapes, sizes, thicknesses or spatial distribution for the attached layer may be adopted. Also, the attached layer may be attached to the base material on one side or more than one side. In analogy to the configuration shown in FIG. 10B (which is a 2D example), the sites of the attached layer material may be ordered in a periodic fashion (as shown) or may be randomly distributed within the base crystalline material or may take a continuous form within the base crystalline material. Similarly, the size of each attached layer may be uniform or may vary in groups or vary randomly.

In the particular implementation shown in FIG. 18, for example, a plurality of transport "channels" are formed by the plurality of base crystalline material layers disposed within the unit cell. The inclusion(s) and the attached layers of amorphous material disposed between two or more channels of the base crystalline material act as one or more oscillators/resonators that generate a plurality of local vibration modes within the at least partially crystalline base material channel(s) and interact with a plurality of phonons moving through the base material channel(s) and slow the group velocities of at least a portion of the interacting phonons. In this manner, thermal transport through the material may be reduced while at least substantially allowing electron transport through the base material channel(s).

Figure 19:
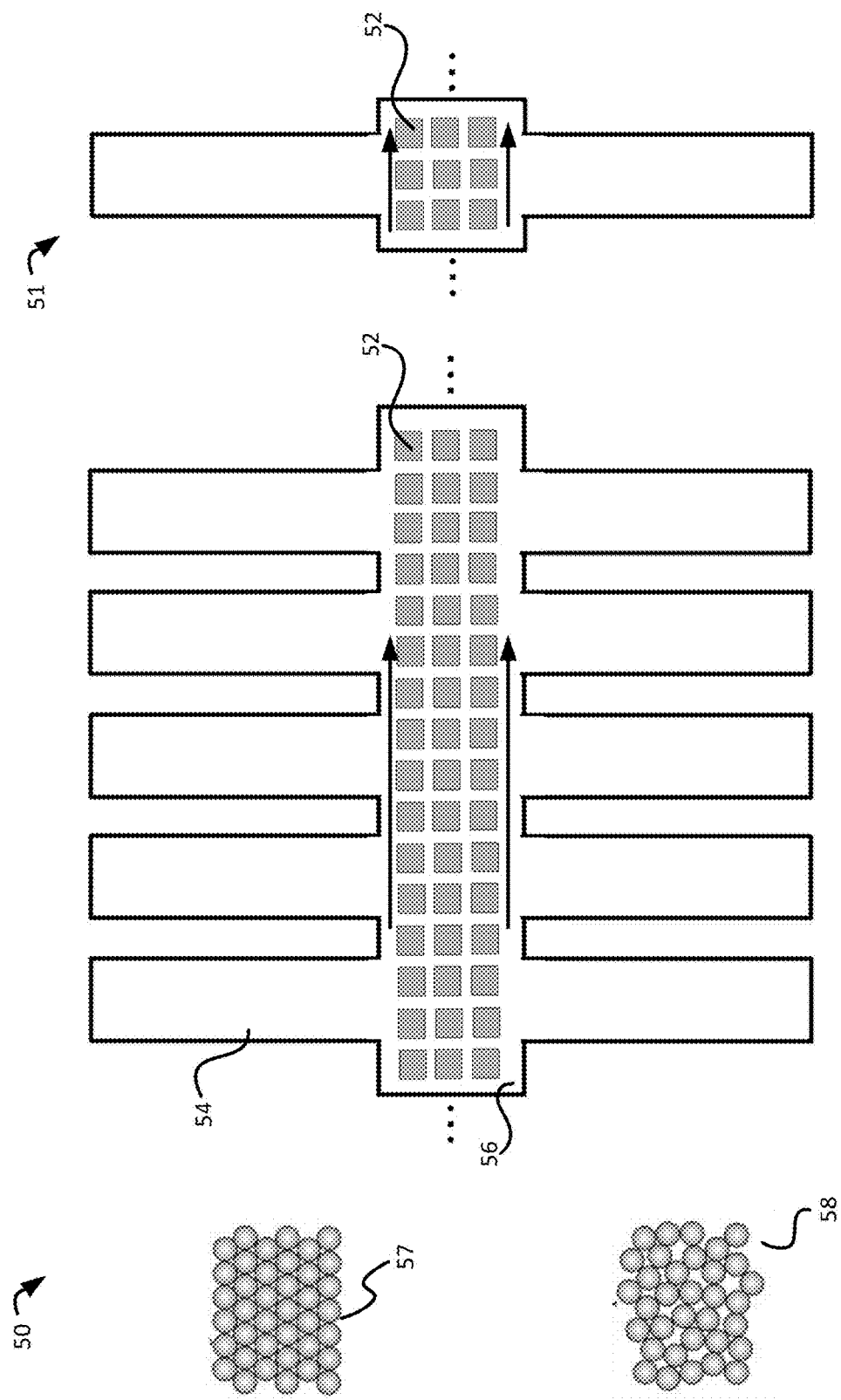
FIG. 19 shows an example implementation of a composite material comprising a thin film at least partially crystalline base material (e.g., membrane thin film base material) including a plurality of atomically disordered inclusions disposed within the base material and a plurality of pillar extending substructures extending from the base material.

FIG. 19 shows an example implementation of a composite material 50 adapted to slow a group velocity of one or more phonons flowing through a crystalline material. In this particular implementation, for example, a crystalline base material 56 (e.g., single crystal or partially crystalline material 57) defines a transport region 59 along with one or more pillars 54 disposed adjacent to, juxtaposed to or near the transport region 59 of the composite material 50, such as described above with respect to FIGS. 2, 3, 9, 11, 12 and 13. The one or more pillars 54 act as one or more oscillators/resonators that generate a plurality of local vibration modes (including those due to atomic vibrations) within the transport region 59 of the at least partially crystalline base material 56 and interact with a plurality of phonons moving through the transport region 59 and slow the group velocities of at least a portion of the interacting phonons. Further, thermal transport through the base material 56 may be reduced while at least substantially allowing electron transport through one or more base material channel(s) 59. The composite material 50 further comprises one or more inclusions 52 disposed within the transport region. As described above with respect to FIGS. 15A-15C and 18 above, the inclusions 52 similarly act as one or more oscillators/resonators that generate a plurality of local vibration modes (including those due to atomic vibrations) within the transport region of the at least partially crystalline base material and interact with a plurality of phonons moving through the transport region and slow the group velocities of at least a portion of the interacting phonons. In this manner, thermal transport through the transport region 59 of the composite material 50 may be reduced by the pillars 54 and/or inclusions 52 while at least substantially allowing electron transport through the transport region 59 of the composite material.

Figure 20A:
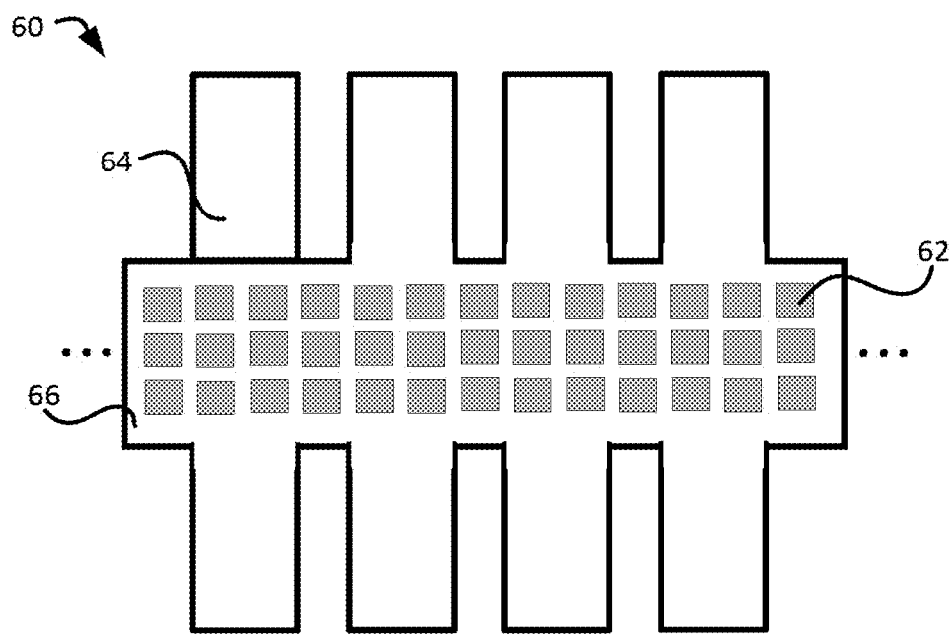
FIGS. 20A and 20B show another example implementation of a composite material comprising a one-dimensional at least partially crystalline base material (e.g., a wire or rod base material) including plurality of atomically disordered inclusions disposed within the base material and a plurality of pillar extending substructures extending from the base material.
Figure 20B:
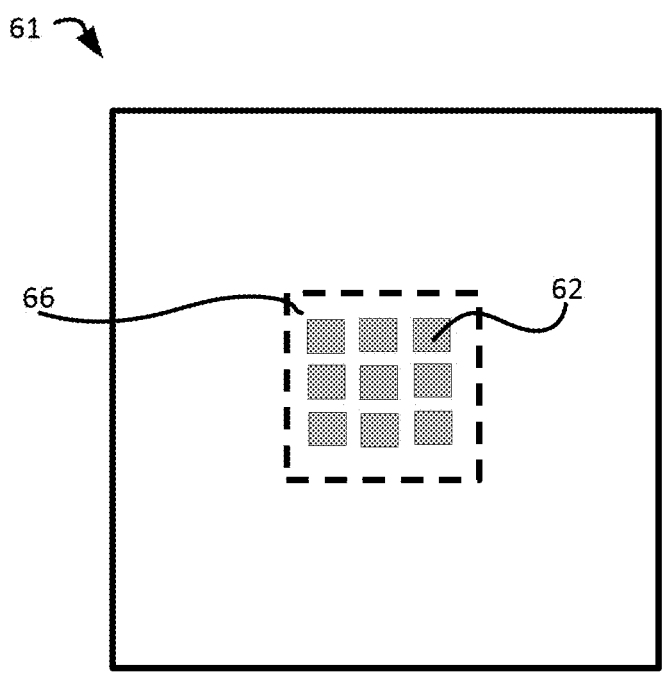

FIGS. 20A and 20B show another example implementation of a composite material 60 adapted to slow a group velocity of one or more phonons flowing through a crystalline base material 66. In this particular implementation, for example, crystalline base material (e.g., single crystal or partially crystalline material) defines a transport region 69 along with one or more rings or plates or pillars 64 extending away from the transport region 69 of the composite material 60, such as described above with respect to FIG. 13. The one or more rings or plates or pillars 64 act as one or more oscillators/resonators that generate a plurality of local vibration modes (including those due to atomic vibrations) within the transport region of the at least partially crystalline base material 66 and interact with a plurality of phonons moving through the transport region 69 and slow the group velocities of at least a portion of the interacting phonons. The composite material 60 further comprises one or more inclusions 62 disposed within the transport region 69. As described above with respect to FIGS. 15A-15C and 18 above, the inclusions 62 similarly act as one or more oscillators/resonators that generate a plurality of local vibration modes (including those due to atomic vibrations) within the transport region 69 of the at least partially crystalline base material 66 and interact with a plurality of phonons moving through the transport region 69 and slow the group velocities of at least a portion of the interacting phonons. In this manner, thermal transport through the transport region 69 of the composite material may be reduced by the plates, rings, pillars 64 and/or inclusions 62 while at least substantially allowing electron transport through the transport region of the composite material.

Figure 21:
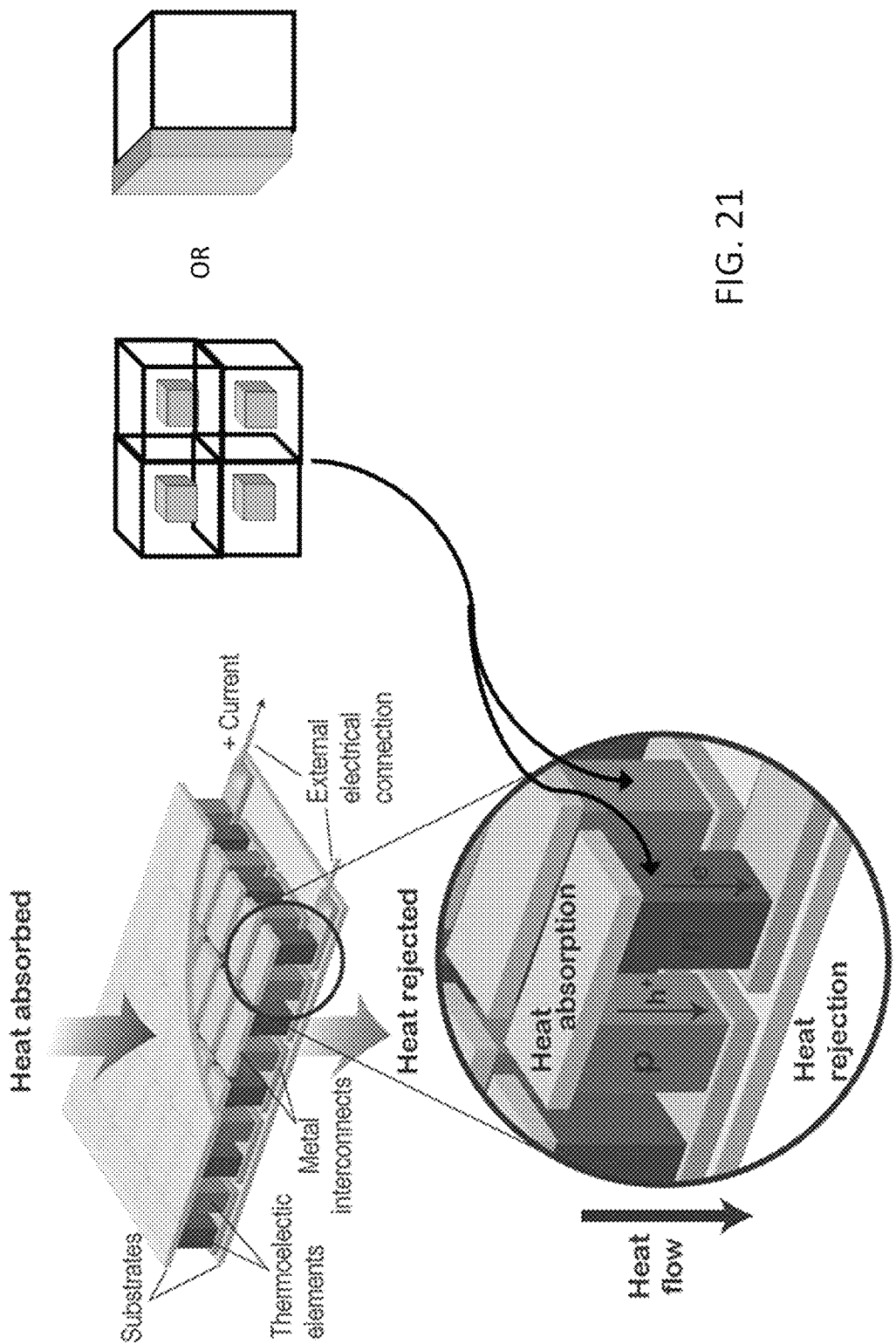
FIG. 21 shows an example implementation of a thermoelectric device using a bulk phononic metamaterial.

FIG. 21 shows an example implementation of a thermoelectric device using a bulk phononic (e.g., nanophononic) metamaterial, such as for example a single crystal silicon material with one or more periodic or non-periodic inclusions of an amorphous material such as amorphous silicon or silicon oxide such as shown in FIG. 15 and/or with a single crystal silicon material with one or more attached layer(s) of an amorphous material such as amorphous silicon or silicon oxide such as shown in FIG. 16 and/or with a single crystal silicon material with one or more embedded layer(s) of an amorphous material such as amorphous silicon or silicon oxide such as shown in FIG. 17. In these particular implementations, for example, a bulk phononic (e.g., nanophononic) metamaterial may be doped at any level desired to improve the electrical properties forming a p-type semiconducting material and/or an n-type semiconducting material. Furthermore, the transport portion of the phononic (e.g., nanophononic) metamaterial may be alloyed with other elements to reduce the thermal conductivity further while having a minimal effect on the electrical properties such as the electrical conductivity and the Seebeck coefficient.

Figures 23A, 23B:
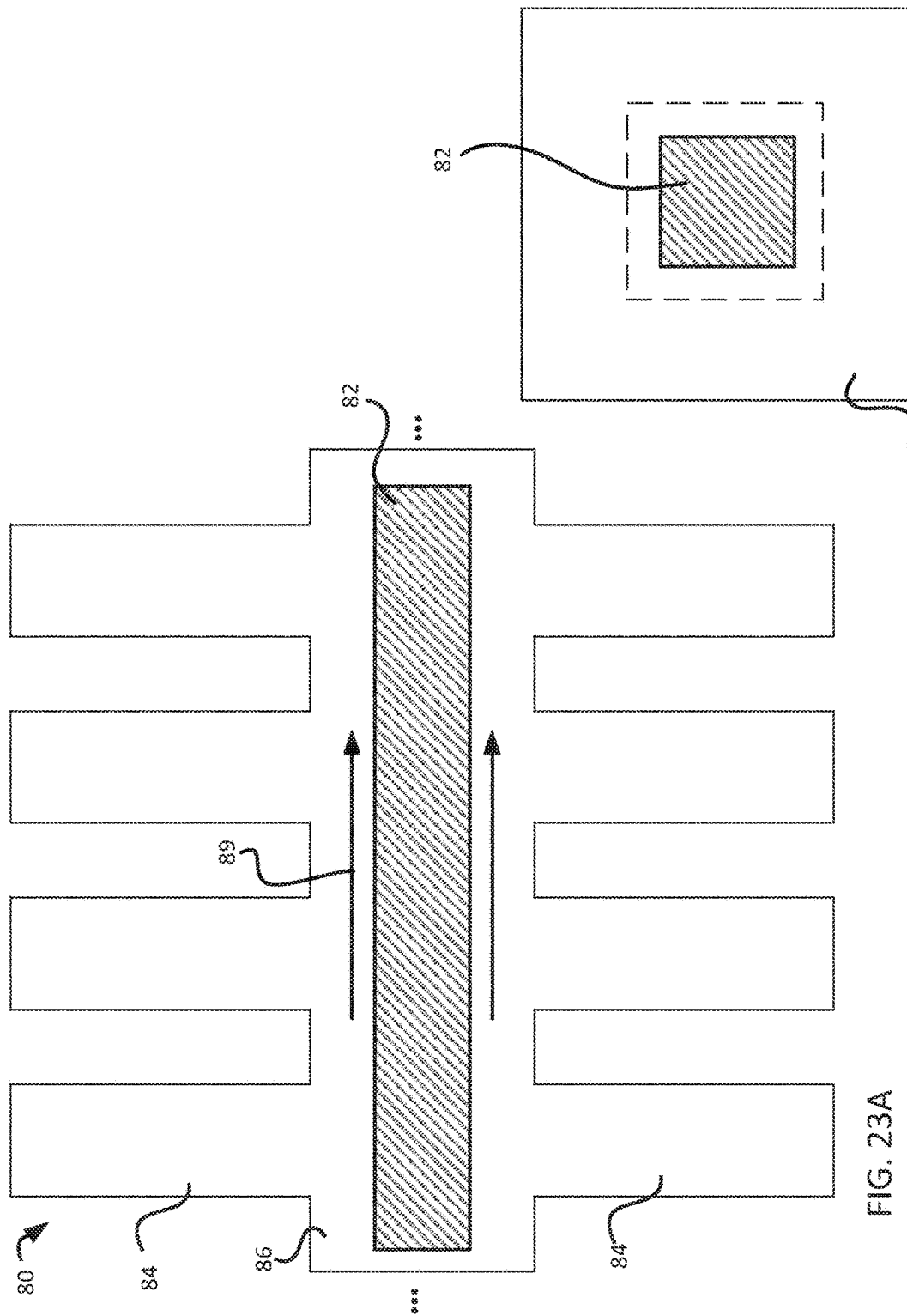
FIGS. 23A and 23B show an example implementation of a composite material comprising a one-dimensional at least partially crystalline base material (e.g., a wire or rod base material) including at least one continuous atomically disordered inclusion disposed within the base material and a plurality of pillar extending substructures extending from the base material.

FIGS. 22A, 22B, 23A and 23B depict other example implementations of composite materials 70, 80 adapted to slow a group velocity of one or more phonons flowing through an at least partially crystalline material. In FIGS. 22A and 22B, for example, a composite material 70 includes a two-dimensional thin-film/membrane base material structure 76 with extended substructures 74 (e.g., pillars). FIGS. 23A and 23B show a composite material 80 including a one-dimensional (e.g., wire) base material structure 86 with extended substructures 84 (e.g., plates or rings). In this particular implementation, for example, the composite material 70, 80 comprises an at least partially crystalline thermoelectric base material. A thermoelectric base material includes a base material region 76, 86. The base material region 76, 86 includes an at least partially crystalline transport region 79, 89 and at least one atomically disordered oscillator/resonator region 72, 82. The at least one transport region 79, 89 includes one or more transport paths (shown by arrows) through the at least partially crystalline thermoelectric base material and is configured to allow electrons flow through the thermoelectric base material at least relatively unimpeded by one or more atomically disordered materials of one or more atomically disordered oscillator/resonator regions 72, 82 (e.g., one or more atomically disordered inclusions) disposed within the base material region 76, 86 of the base material juxtaposed the transport region(s) 79, 89. The atomically disordered oscillator/resonator region 72, 82 is adapted to provide local resonances through the movement of one or more atoms within the atomically disordered material (e.g., an amorphous material) of the atomically disordered oscillator/resonator region 72, 82 (e.g., one or more atomically disordered inclusions). The local resonances, in turn, travel into the transport region(s) 79, 89 of the at least partially crystalline thermoelectric base material and interact with one or more phonons traveling through the transport region 79, 89 reducing group velocities and the thermal conductivity of the composite material 70, 80. In this particular implementation, for example, the atomically disordered oscillator/resonator region 72, 82 may comprise a continuous inclusion of atomically disordered (e.g., amorphous) material disposed within the at least partially crystalline thermoelectric base material or may include a plurality of individual inclusions of atomically disordered (e.g., amorphous) material. Although FIGS. 22 and 23 show a single continuous inclusion of atomically disordered material forming the atomically disordered oscillator/resonator region, a plurality of continuous or discontinuous inclusions may also be used to form one or more atomically disordered oscillator/resonator regions disposed within the thermoelectric base material region. However, local resonances of atoms within the inclusion(s) extend into the transport region(s) and interact with phonons passing through the region. Thus, base material region may be configured to allow electrons to pass through the transport region(s) without being substantially impeded by the inclusion(s) while still allowing the local resonances of the inclusions to interact with one or more phonons passing through the same transport region.

The composite materials shown in FIGS. 22A, 22B, 23A and 23B further include one or more extending substructures 74, 84 extending outwardly away from a surface of the thermoelectric base material region 76, 86 (e.g., the 2D thin-film/membrane base material of FIG. 22 or the 1D wire base material of FIG. 23). The extending substructures 74, 84, for example, may comprise any structure that extends away from the at least partially crystalline base material region, such as but not limited to pillars, walls, rings, plates, layers or the like. In the particular implementation shown in FIGS. 22A, 22B, 23A and 23B, for example, a plurality of extending substructures 74, 84 extend away from a surface of the thermoelectric base material region 76, 86 and provide local oscillators/resonators adapted to create local resonances that extend into one or more transport regions 79, 89 of the base material through the movement of one or more atoms of the extending substructures. The local resonances of the extending substructures similarly interact with phonons passing through the transport region(s) of the base material region and decrease the group velocities of the phonons and may reduce the thermal conductivity of the composite material. Although FIGS. 22A, 22B, 23A and 23B show particular types of substructures (e.g., pillars/walls/plates/rings) extending away from a surface of the base material region including the transport region being formed of an at least partially crystalline material, which may be the same or a different material as the at least partially crystalline thermoelectric base material, some or all of the extending substructures may likewise be formed of an atomically disordered (e.g., amorphous) material as described herein.

Figure 24:
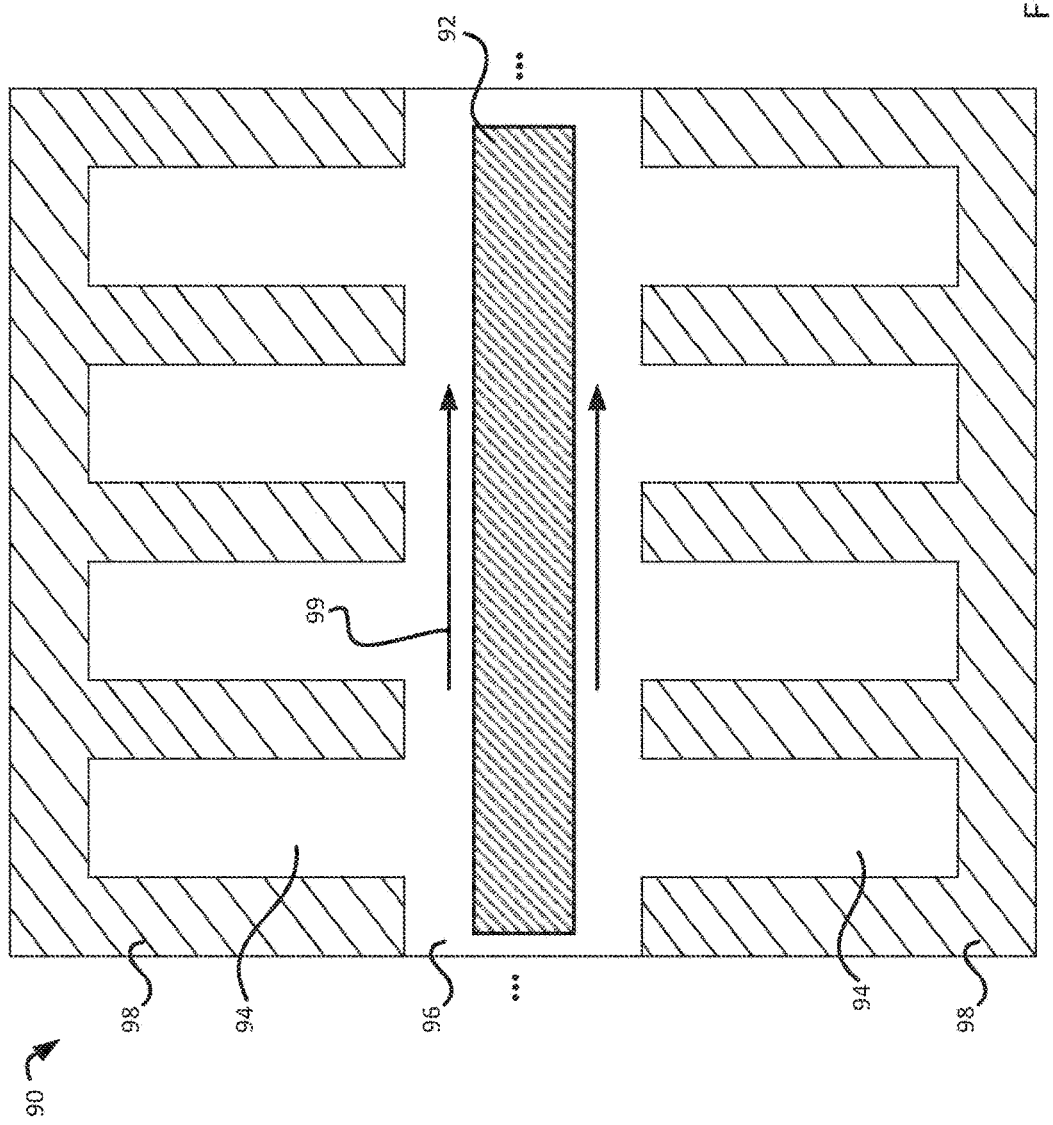
FIG. 24 depicts yet another example implementation of a bulk composite material comprising an at least partially crystalline base material including at least one continuous atomically disordered inclusion disposed within the base material and a plurality of extending substructures extending from the base material. The base material and extending substructures are embedded in an outer matrix material to provide a bulk composite material.

FIG. 24 depicts yet another example implementation of a bulk composite material 90 including a phononic metamaterial. In this particular implementation, for example, the composite material 90 comprises a base material region 96 including an at least partially crystalline thermoelectric transport region 99 and at least one atomically disordered oscillator/resonator region 92. The transport region 99 includes one or more transport regions of the base material region 96. The at least partially crystalline base material region 96 provides one or more transport regions 99 for electron and phonon flow through the thermoelectric structure via one or more transport paths (shown by arrows) extending through the at least partially crystalline thermoelectric base material. The transport region(s) 99 are configured to allow electrons to flow through the thermoelectric base material at least relatively unimpeded by one or more atomically disordered materials of one or more atomically disordered oscillator/resonator regions 92 (e.g., one or more atomically disordered inclusions) disposed within the base material region 96 of the base material juxtaposed the transport region(s). The composite material further comprises at least one extending substructure 94 (e.g., layers, pillars, walls, rings, plates) that extends away from a surface of the base material region 96. In the particular implementation shown in FIG. 24, for example, the composite material 90 includes a plurality of extending substructures 94 extending in at least two directions away from a surface of the base material region 96 including the at least partially crystalline transport region 99 and a continuous inclusion 92 of atomically disordered (e.g., amorphous) material disposed within the transport region 99 adjacent to two opposite transport regions. These extending substructures 94, for example, may comprise any structure that extends away from the base material region, such as but not limited to pillars, walls, rings, plates, layers or the like.

The composite material 90, in this particular implementation, includes a bulk composite structure including the base material region 96 from which the extending substructures 94 extend. The at least partially crystalline transport region 99 and the extending substructures 94, for example, may comprise the same or different at least partially crystalline material(s) (e.g., single crystal silicon or other thermoelectric material), such as shown in FIG. 24. Similarly, the extending substructures 94 may comprise the same or a different atomically disordered (e.g., amorphous) material as the atomically disordered oscillator/resonator region 92.

The base material region 96 and the one or more extending substructures 94 are further disposed within a matrix 98 of atomically disordered (e.g., amorphous) material. In one particular implementation, for example, the matrix 98 of amorphous material may comprise a soft amorphous material within which the base material region and the one or more extending substructures are disposed (e.g., encased, surrounded or the like), although other implementations are also contemplated. In various implementations, for example, the base material region 96 and extending substructures 94 may be surrounded in one, two or three-dimensions (e.g., surrounded at least in part or fully surrounded).

The surrounding matrix 98 material in this configuration may further act as one or more oscillators/resonators where each atom in the atomically disordered (e.g., amorphous) surrounding material exhibits three natural frequencies/hybridizing resonances. The oscillators/resonators formed by the surrounding atomically disordered material may generate a plurality of local vibration modes that interact with a plurality of phonons moving through the base material channel(s) and slow the group velocities of at least a portion of the interacting phonons. Further, thermal transport through the base material may be reduced while at least substantially allowing electron transport through one or more base material channel(s).

The surrounding matrix 98 material, regardless of whether it is a crystalline, at least partially crystalline or atomically disordered material, may further be used to convert a reduced dimension structure (e.g., a 2D or 1D base material) into a 3D bulk phononic metamaterial that may be used in standard thermoelectric devices, such as the one shown in FIG. 21. Where the surrounded composite material includes extending substructures adapted to move to provide one or more hybridizing resonances, the surrounding matrix material may comprise a relatively soft, flexible or other material, such as a polymer material for example, adapted to allow those extending substructures to move at least at an atomic scale.

Although one particular structure of the base material region and extending substructures are shown in FIG. 24 similar to the structure shown in FIG. 22, any of the other structures disclosed herein (e.g., FIGS. 2, 3, 9, 10, 11, 12, 13, 16, 17, 18, 19, 20, 22, 23), may similarly be disposed within one or more matrix of amorphous or soft material.

In these implementations, for example, the outer matrix(ces) may provide local resonances (stemming from atomic and structural motion) that further interact with phonons passing through the transport region of the base material that may decrease the group velocities of the phonon(s) and reduce the thermal conductivity of the composite material.

Figure 25:
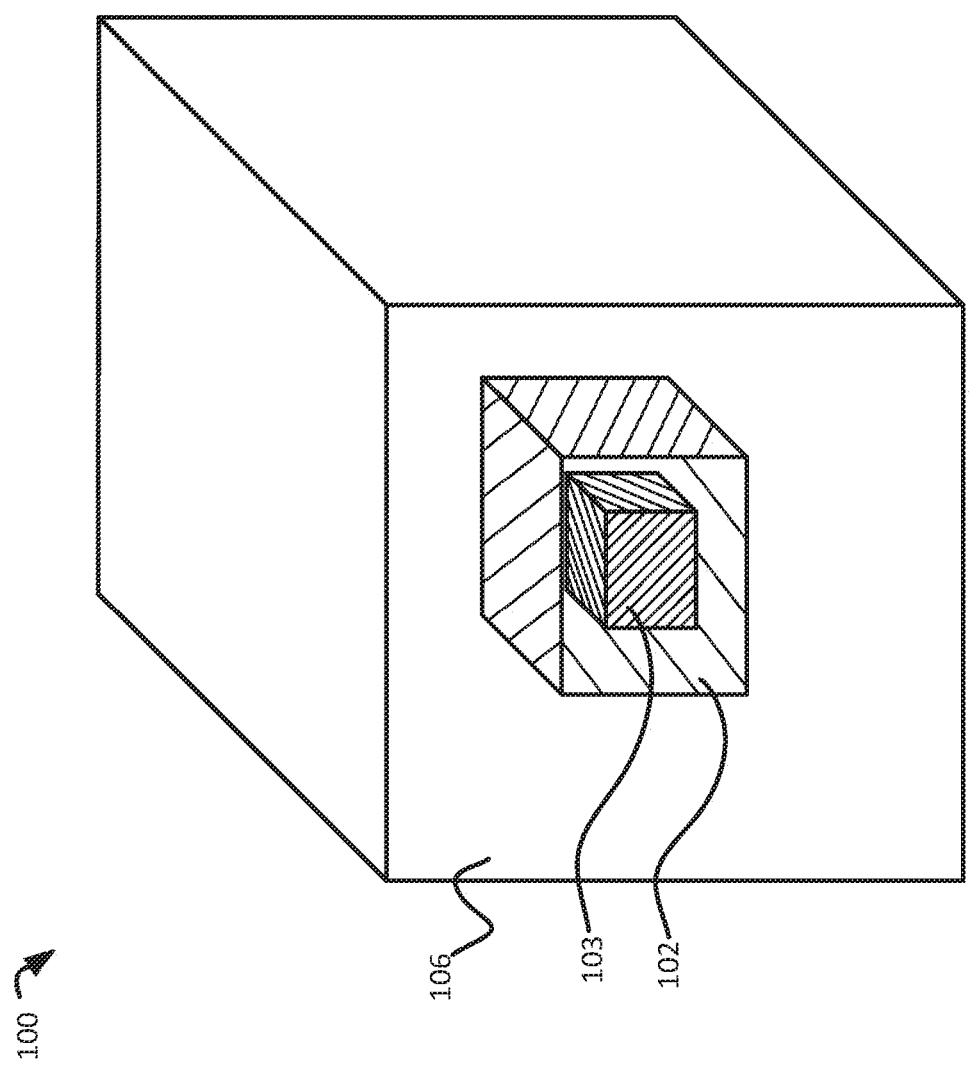
FIGS. 25, 26A and 26B depict another example implementation of a three-dimensional (3D) unit cell including an atomically disordered inclusion disposed within an at least partially crystalline base material and an internal inclusion further disposed within the atomically disordered inclusion. The unit cell, for example, may be used within a bulk or other composite material such as a two- or one-dimensional composite material such as a membrane or a wire, respectively.
Figure 26A:
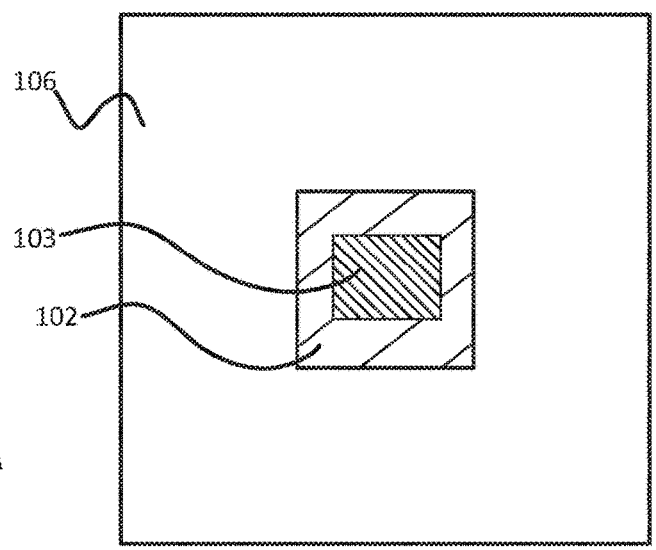
Figure 26B:
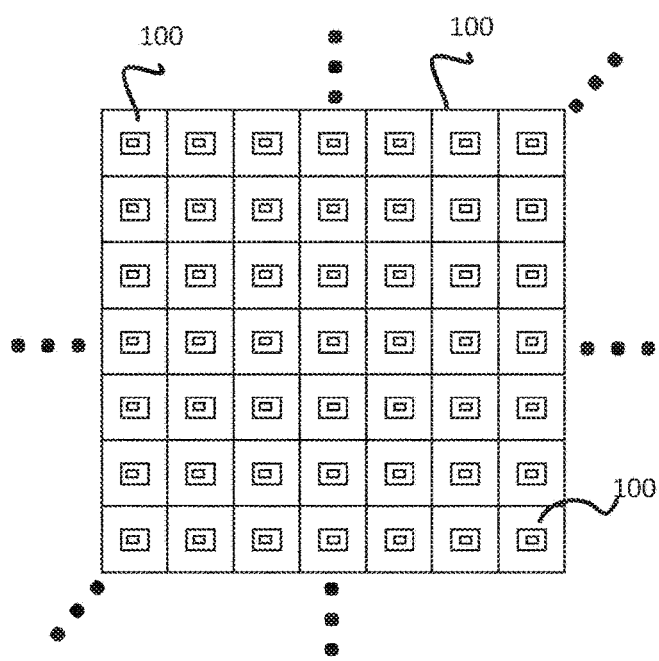

FIGS. 25, 26A and 26B depict another example implementation of a bulk composite material 100 including a phononic metamaterial. In this particular implementation, for example, the composite material 100 comprises one or more additional internal inclusions 103 (e.g., additional inclusion(s) disposed inside one or more outer inclusion(s) 102). The internal inclusions 103 disposed within the outer atomically disordered inclusions 102, for example, may be adapted to alter one or more characteristic of the outer atomically disordered inclusions 102. For example, the internal inclusions 103 that are disposed within the one or more atomically disordered outer inclusions 102 may be adapted to alter one or more atomic movements within the atomically disordered outer inclusions 102. In one implementation, for example, the internal inclusion(s) 103 may be relatively heavier or denser than the surrounding atomically disordered outer inclusion 102. The internal inclusion(s) 103 may be atomically disordered or ordered materials. Similarly, the outer inclusion(s) 103 may be atomically disordered or ordered materials. The outer inclusion may be a soft material such as rubber or other polymers. The internal and outer inclusions can take any shape such as cubes, spheres, or the like. The internal inclusion(s) 103 may alter (e.g., lower or increase) a frequency of resonances stemming from and/or facilitated by the atomically disordered outer inclusions of the composite material 100. In one particular implementation, for example, the internal inclusion may be relatively heavier or denser than the atomically disordered (e.g., amorphous) inclusion 102 in which it is supported and the atomically disordered (e.g., amorphous) inclusion may comprise a material softer than the internal inclusion 103. In this implementation, a heavier material suspended within a soft material may lead to a lowering of the frequencies of local resonances. Thus, the composite structure(s) (internal inclusion(s) 103 within an atomically disordered outer inclusion 102) may be used to alter one or more hybridizing resonances, which in some implementations, may further increase the effectiveness of reducing thermal conductivity in the base transport material by targeting one or more phonons that carry relatively more heat. Further, in some implementations, the combination of the internal inclusions and outer inclusions may be optimized to produce a distribution of resonances from the inclusion(s) that are effective to reduce thermal conductivity of the base transport material and the system as a whole by resonance hybridizations.

Although FIGS. 25, 26A and 26B show the internal inclusions 103 disposed within atomically disordered outer inclusions 102, the internal inclusions 103 may similarly be disposed within one or more at least partially crystalline oscillator/resonator material, such as a substructure extending from a base material 106 including a transport region. In these implementations, for example, one or more material (ordered or disordered) may be disposed within an at least partially crystalline layer, pillar, wall, plate, ring or other structure. The internal inclusions, for example, may be adapted to alter an atomic movement within the at least partially crystalline extending substructure. In other implementations, the extending structures can be made entirely from one or more heavy materials. A relatively heavy or dense material, such as a metal material, for example, may be used to lower a frequency of one or more atomic motion within the extending substructure and, thus, alter hybridizing resonance(s) produced.

FIG. 27 depicts yet another example implementation of a bulk composite material 110 including a phononic metamaterial that illustrates a combination of the surrounding atomically disordered matrix shown in FIG. 24 and the internal inclusions shown in FIGS. 25 and 26 disposed within a continuous atomically disordered outer inclusion in this implementation. Thus, in this implementation, the composite material 110 includes a base material region 116 comprising an at least partially crystalline transport region 119 defining one or more transport paths (shown by arrows) for carrying electron and phonon flow through the composite material 110. One or more atomically disordered inclusions 112 are disposed within the base material region at least generally outside the transport region(s) 119 so as to reduce physical interference with electron flow within the transport region(s) due to the physical interference of the inclusion(s) 112. One or more additional internal inclusions 113 (e.g., additional inclusion(s) disposed inside one or more outer inclusion(s)) are provided. The internal inclusions 113, in this particular implementation, are disposed within a continuous outer atomically disordered inclusion 112 and may be adapted, for example, to alter one or more characteristic of the continuous outer atomically disordered inclusion 112. The internal inclusions 113 disposed within the atomically disordered continuous outer inclusion 112 may be adapted to alter one or more atomic movements within the atomically disordered outer inclusions 112. In one implementation, for example, the internal inclusion(s) 113 may be relatively heavier or denser than the surrounding atomically disordered outer inclusion 112. The internal inclusion(s) 113 may be atomically disordered or ordered materials. Similarly, the outer inclusion(s) 103 may be atomically disordered or ordered materials. The outer inclusion may be a soft material such as rubber or other polymers. The internal and outer inclusions can take any shape such as cubes, spheres, or the like. The internal inclusion(s) 113 may alter (e.g., lower or increase) a frequency of resonances stemming from and/or facilitated by the atomically disordered outer inclusions 112 of the composite material. Thus, the composite structure(s) (internal inclusion(s) 113 within an atomically disordered outer inclusion 112) may be used to alter one or more hybridizing resonances, which in some implementations, may further increase the effectiveness of reducing thermal conductivity in the base transport material by targeting one or more phonons that carry relatively more heat. Further, in some implementations, the internal inclusions 113 may be optimized to produce a distribution of resonances from the atomically disordered outer inclusion(s) that are effective to reduce thermal conductivity of the base transport material and the system as a whole by resonance hybridizations.

Further, in some implementations, the inclusions 115 disposed within the extending substructures 114 (e.g., pillar, wall, plate, ring, layer) may be optimized to produce a distribution of resonances that are effective to reduce thermal conductivity of the base transport material and the system as a whole by resonance hybridizations. In other implementations, the extending structures can be made entirely from one or more heavy materials. As can be further seen in FIG. 27, the base material region 116 and extending substructures 114 (e.g., pillars/walls) are also disposed within a matrix 118 of atomically disordered (e.g., amorphous) material. In one particular implementation, for example, the matrix 118 of atomically disordered material may comprise a soft amorphous material within which the base material region and extending substructures (e.g., pillars/walls) are disposed, although other implementations are also contemplated.

The surrounding matrix material in this configuration may further act as one or more oscillators/resonators where each atom in the atomically disordered (e.g., amorphous) surrounding material exhibits three natural frequencies/hybridizing resonances. The oscillators/resonators formed by the surrounding atomically disordered material may generate a plurality of local vibration modes that interact with a plurality of phonons moving through the base material channel(s) and slow the group velocities of at least a portion of the interacting phonons. Further, thermal transport through the base material may be reduced while at least substantially allowing electron transport through one or more base material channel(s).

In the particular implementation of FIG. 27, for example, the bulk composite material provides hybridizing resonances from extended substructures, atomically disordered inclusions that may be altered by one or more additional internal inclusions as well as additional hybridizing resonances from the surrounding outer matrix.

In yet another implementation, the surrounding matrix material may comprise a crystalline or at least partially crystalline material that adapts a 2D or 1D composite material into a bulk 3D composite material such as described above with respect to FIG. 24.

Figure 28B:
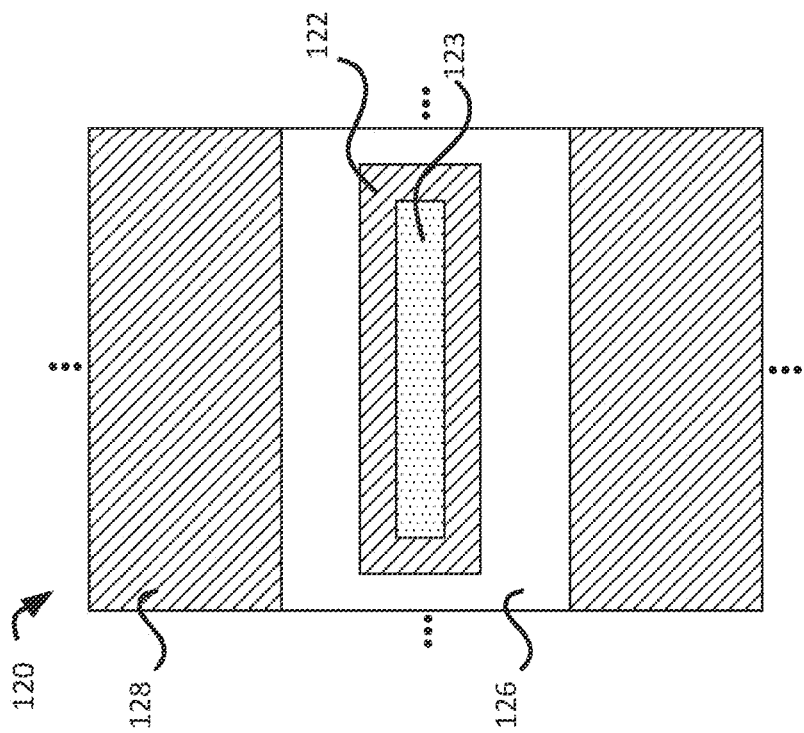
FIGS. 28A and 28B show yet another implementation of an example bulk composite material comprising an at least partially crystalline base material including at least one continuous atomically disordered inclusion disposed within the base material and an internal inclusion disposed within the atomically disordered inclusion. The base material is further embedded at least in part by an outer matrix material.
Figure 28A:
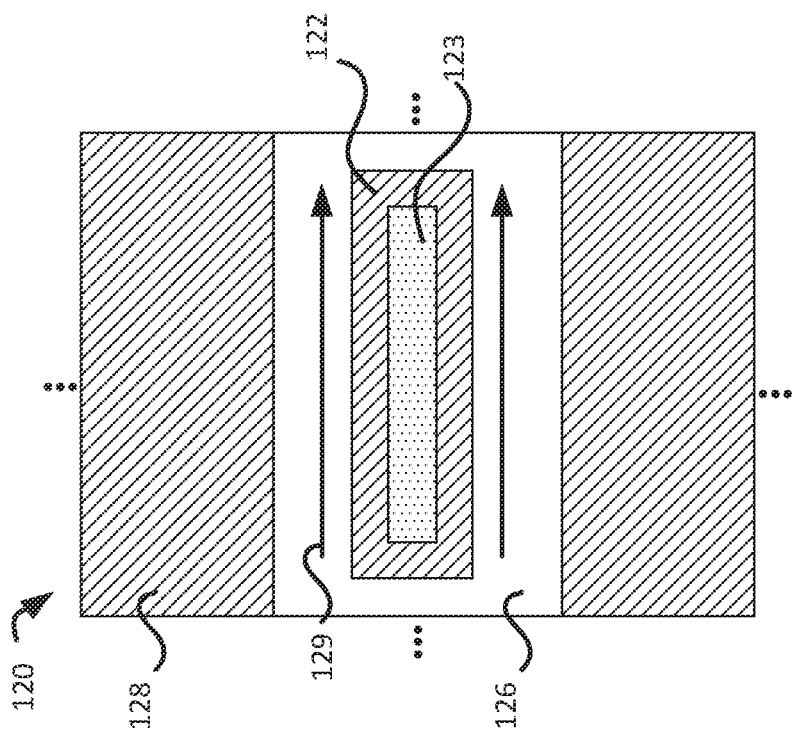

FIG. 28 shows yet another implementation of an example bulk composite material 120 including a phononic metamaterial. In this particular implementation, for example, the bulk composite material 120 includes a base material region 126 comprising an at least partially crystalline transport region 129 defining one or more transport paths (shown by arrows) for carrying electron and phonon flow through the composite material 120. One or more atomically disordered inclusions 122 are disposed within the base material region 126 at least generally outside the transport region(s) 129 so as to reduce physical interference with electron flow within the transport region(s) 129 due to the physical interference of the inclusion(s) 122. In this particular implementation, for example, one or more additional internal inclusions 123 (e.g., a relatively dense or heavy material such as metal, ceramic, nonmetal, etc.) are also disposed within the one or more atomically disordered inclusions 122 such as shown in FIG. 27. As discussed above, the internal inclusions 123 and/or atomically disordered inclusions 122 within which the internal inclusions 123 are disposed may be designed to alter (e.g., lower or increase) a frequency of resonances stemming from and/or facilitated by the atomically disordered inclusions of the composite material 120. Similarly, the outer inclusion(s) 103 may be atomically disordered or ordered materials. The outer inclusion may be a soft material such as rubber or other polymers. The internal and outer inclusions can take any shape such as cubes, spheres, or the like. Thus, the composite structure may be used to alter one or more hybridizing resonances to reduce the group velocities of phonons traveling through the transport region of the composite material, which in some implementations, may further increase the effectiveness of reducing thermal conductivity in the base transport material by targeting one or more phonons that carry relatively more heat.

In this particular implementation, for example, the base material region is disposed within (e.g., between or surrounded by) a matrix 128 of an atomically disordered material that forms a matrix of atomically disordered (e.g., amorphous) material surrounding the base material region. In this particular implementation, for example, the matrix 128 of atomically disordered material may comprise a soft amorphous material within which the base material region is disposed, although other implementations are also contemplated.

As described above with respect to FIGS. 24 and 27, for example, the outer matrix material may further act as one or more oscillators/resonators where each atom in the atomically disordered (e.g., amorphous) surrounding material exhibits three natural frequencies/hybridizing resonances. The oscillators/resonators formed by the surrounding atomically disordered material may generate a plurality of local vibration modes that interact with a plurality of phonons moving through the base material channel(s) and slow the group velocities of at least a portion of the interacting phonons. Further, thermal transport through the base material may be reduced while at least substantially allowing electron transport through one or more base material channel(s).

Further, although the surrounding matrix material is shown as an atomically disordered material in the particular implementation shown in FIG. 28, for example, the surrounding matrix material may comprise a crystalline or at least partially crystalline material that adapts a 2D or 1D composite material into a bulk 3D composite material such as described above with respect to FIGS. 24 and 27.

Further, as shown in FIG. 28, the bulk composite material may comprise a plurality of repeated cells (e.g., unit cells), such as having the structures shown in FIG. 28. Thus, a one, two or three-dimensional composite material structure may be formed by individual unit cells repeated in one, two or three dimensions.

Similar to FIGS. 15A through 21, FIGS. 29A through 42 include further example implementations of phononic metamaterials that may be scaled at any number of dimensions, such as nanoscale, microscale, milliscale or even larger or smaller scales. In the various implementations shown in FIGS. 29A through 42, for example, the phononic metamaterials may include one or more inclusions disposed within an at least partially crystalline base material. The inclusion(s) may be at least partially surrounded by a relatively compliant/soft material (such as graphite) within the at least partially crystalline base material. In various implementations, for example, the inclusion may be fully or partially surrounded by the layer(s) of relatively compliant or soft material. Where the inclusion is partially surrounded by the layer(s) of relatively compliant or soft material, voids may be disposed between the inclusion and the base material in one or more openings where the layer(s) of relatively compliant or soft material are not disposed between the inclusion and the base material. The voids in various example implementations may include air, gas, vacuum, liquid, and/or solid and may provide room for the inclusion to move as it vibrates within the base material. In other implementations, the inclusion, where not surrounded by the layer(s) of relatively compliant or soft material, may be disposed directly adjacent to the base material.

In these implementations, for example, the inclusion and surrounding layer(s) and/or void(s) may operate as a resonator mass (similar to the pillars described above with respect to FIGS. 2, 3, 9, 12, 19, 22A, 22B, 24, 27). The relatively compliant/soft material (e.g., graphite) at least partially surrounding the inclusion may operate as a resonator spring. Graphite, as an example, provides a relatively effective "spring" soft/compliant material that surrounds or at least partially surrounds an inclusion because (1) it is crystalline and can allow vibrations to transmit to the surrounding base material effectively and, (2) it has a relatively high melting temperature and allows for high temperature (e.g., above 400 degrees C.) thermoelectric conversion. Although graphite provides a particularly effective soft/compliant material, it is merely an example and other compliant/soft materials may be used. By embedding inclusions within the at least partially crystalline base material, a bulk phononic metamaterial may be provided that is relatively easy to fabricate than a one-dimension (e.g., rod shaped) or two-dimension (e.g., plate or sheet shaped) phononic metamaterial base material with many individual layers/pillars/walls disposed adjacent to and extending away from the base material.

The inclusions in these variations may include atomically ordered and/or atomically disordered material disposed within an at least partially crystalline base material (e.g., in bulk form) and/or layers/pillars/walls of atomically ordered and/or disordered materials disposed near, adjacent, or juxtaposed to an at least partially crystalline base material. In these implementations, the inclusions within the at least partially crystalline base material may be further disposed at least partially within (e.g., at least partially surrounded by) one or more layer of a compliant and/or slippable material, such as graphite, where one or more layer of atoms within the overall layer can vibrate or slip with respect to each other (e.g., with relatively low force) and thus enhance the resonace(s) of the inclusion and their transmission to the least partially crystalline base material.

Graphite, for example, comprises atoms strongly bonded together in one or more direction and weakly bonded (e.g., by van der Waal bonds) in one or more other direction. This combination of bonding features gives the graphite layer a relatively high melting temperature (e.g., higher than polymers) while also high compliance or softness along certain directions due to the weak, e.g., van der Waal, bonds. The weak bonds enable individual atomic-scale layer(s) of the overall layer to vibrate normal to the layer(s) and/or slip parallel to the layer(s) with respect to other atomic-scale layer(s) of the layer via vibration or slippage between layers of atoms which give rise to high compliance or softness. In one example implementation, a graphite layer has these characteristics because it comprises a stack of electrically conducting graphene layers held together by weak van der Waals bonds. These properties allow the graphite layer to act as a spring holding the inclusion(s) which act as a one or more mass. Such a configuration, for example, may give rise to one or more internal resonances within the host (matrix/base) material of the composite. In principle, the number of resonances may be as many as the number of atoms in the inclusion multiplied by three (i.e., the number of degrees of freedom per atom).

The layer(s) within which the inclusion(s) are disposed, for example, may be adapted to alter one or more characteristic of the inner inclusion(s). For example, one or more atomic movements within the inclusion(s) and/or outer layer(s) may be altered by the outer layer(s) or inclusion(s) or the interaction therebetween. In one implementation, for example, the inclusion(s) may be relatively heavier or denser than the surrounding layer(s) and, possibly, also heavier or denser than the surrounding at least partially crystalline base material. The inclusion(s) may be atomically ordered or disordered materials. Similarly, the outer layer(s) may be atomically ordered or disordered materials.

As an alternative to being made out of graphite or a material with similar atomic compliance, softness, and/or slippage (weak bonds between atomic layers) characteristics, the outer layer(s) may be a soft and/or compliant material such as rubber or other polymers. The inclusion(s) and outer layer(s) can take any shape, such as but not limited to cubes, spheres, or the like. The inclusion(s) and outer layer(s) may alter (e.g., lower or increase) a frequency of resonances stemming from and/or facilitated by the effective spring-mass effect due to the combination of inclusion(s) and outer layer(s). In one particular implementation, for example, the inclusion(s) may be relatively heavier or denser than the outer layer(s) in which it is supported and the outer layer(s) may comprise a material softer or more compliant than the inclusion(s). In this particular implementation, a heavier material suspended within a soft or compliant material (e.g., partially or fully surrounded by a soft or compliant material) may lead to a lowering of the frequencies of local resonances. Thus, the composite structure(s) (inclusion(s) 103 fully or partially surrounded by the outer layer(s)) may be used to alter one or more hybridizing resonances, which in some implementations, may further increase the effectiveness of reducing thermal conductivity in the surrounding (matrix/base) transport material by targeting one or more phonons that carry relatively more heat. Further, in some implementations, the combination of the inclusion(s) and the outer layer(s) may be optimized to produce a distribution of resonances from the inclusion(s) that are effective to reduce thermal conductivity of the surrounding (matrix) transport material and the system as a whole by resonance hybridizations.

Similar to the implementations discussed with reference to FIGS. 2, 3, 5A, 5B and 9-28B, for example, the inclusions disposed at least partially within one or more layer of compliant and/or slippable material within the at least partially crystalline base material and/or extending substructures (e.g., layers of, pillars, walls, plates, rings of ordered or disordered material disposed adjacent to the at least partially crystalline base material (with or without one or more layer of compliant and/or slippable material disposed between the substructure and the at least partially crystalline base material) may reduce group velocities of phonons traveling in the at least partially crystalline base material (transport region) by interacting one or more vibration modes generated by at least one locally resonant oscillator (including those due to atomic vibrations) formed by the inclusions and/or the extending substructures (e.g., layers, pillars, walls, plates, rings) with one or more of the phonons. Further, thermal transport through the material may be reduced while at least substantially allowing electron transport through the base material channel(s).

Without being limited by theory, reduction in thermal conductivity due to resonances, such as described herein, may involve one or more of the following: (1) group velocity reduction of passing phonons, (2) mode localization within the resonating region that leads to localizing heat rather than transporting it, and (3) reduction of phonon lifetimes near resonance coupling regions in the phonon band structure.

The inclusions and/or extending substructures (e.g., layers, pillars, walls, etc.) shown in FIGS. 29A through 42B can take a variety of distributions, shapes and sizes as shown in the drawings and could lie within the main body or extend away from and/or extrude out of the main body including the at least partially crystalline base material. Furthermore, the inclusions and/or extending substructures may have a variety of orientations and material compositions. The inclusions and/or extending substructures may be distributed in a perfectly periodic fashion, randomly, or in any other manner. The geometric dimensions of the inclusions and/or extending substructures could be identical, or could vary within a group whereby the entire group repeats in an identical fashion, or could vary in random fashion, or could be arranged in any other pattern or manner, random or periodic. In one particular implementation, for example, inclusions and/or extending substructures may be distributed within a metamaterial such that vibration modes generated by the inclusions and/or extending substructures extend generally throughout an at least partially crystalline base material of the metamaterial and, thus, are able to reduce thermal conductivity through the at least partially crystalline base material. As described above, the reduction in thermal conductivity is believed to be caused by one or more of the following: (1) group velocity reduction of passing phonons, (2) mode localization within the resonating region that leads to localizing heat rather than transporting it, and (3) reduction of phonon lifetimes near resonance coupling regions in the phonon band structure. Further, thermal transport through the material may be reduced while at least substantially allowing electron transport through the base material channel(s).

Figure 29B:
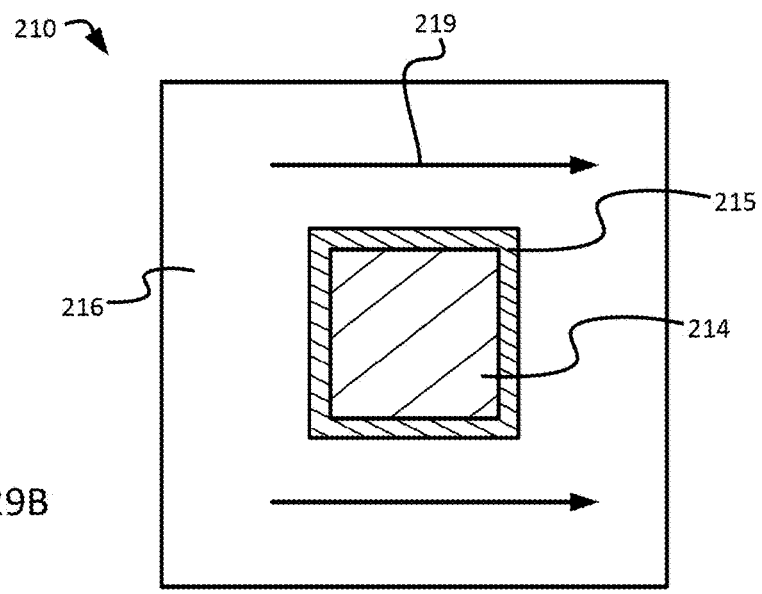

FIGS. 29A through 29B show an example implementation of a three-dimensional (3D) unit cell 210 that may be used, for example, within a bulk or other material such as a two- or one-dimensional material like a membrane or a wire, respectively. In one implementation, for example, the unit cell 210 may comprise a unit cell of a bulk material. A three-dimensional (3D) bulk material configuration, for example, may include a periodic array of unit cells 210 each including one or more inclusions 214 (e.g., the cubic inclusions 214 shown in FIG. 29A) disposed within a base material 216. FIG. 29A shows, for example, an implementation of a 3D unit cell 210 comprising a crystalline 217 (e.g., single crystal or partially crystalline) base material 216 structure including one or more inclusions 214 disposed within the crystalline 217 base material 216 structure. The inclusion 214 is further at least partially disposed within (e.g., partially or fully surrounded by) one or more layer 215 of a compliant and/or slippable material, such as graphite, rubber or polymer. In one particular implementation, for example, the compliant and/or slippable material includes a plurality of individual sub-layers (e.g., atomic-scale layers) adapted to vibrate normal to the layers or slip or vibrate parallel to the layers and with respect to one another. Although FIG. 29A shows a single inclusion 214, the unit cell may include a plurality of inclusions disposed within the crystalline structure. Further, the inclusion(s) 214 may be disposed at least partially within a plurality of layers of compliant and/or slippable material (e.g., partially or fully surrounded by the compliant and/or slippable material). FIG. 29B shows a side view of the unit cell of FIG. 29A.

Figure 29C:
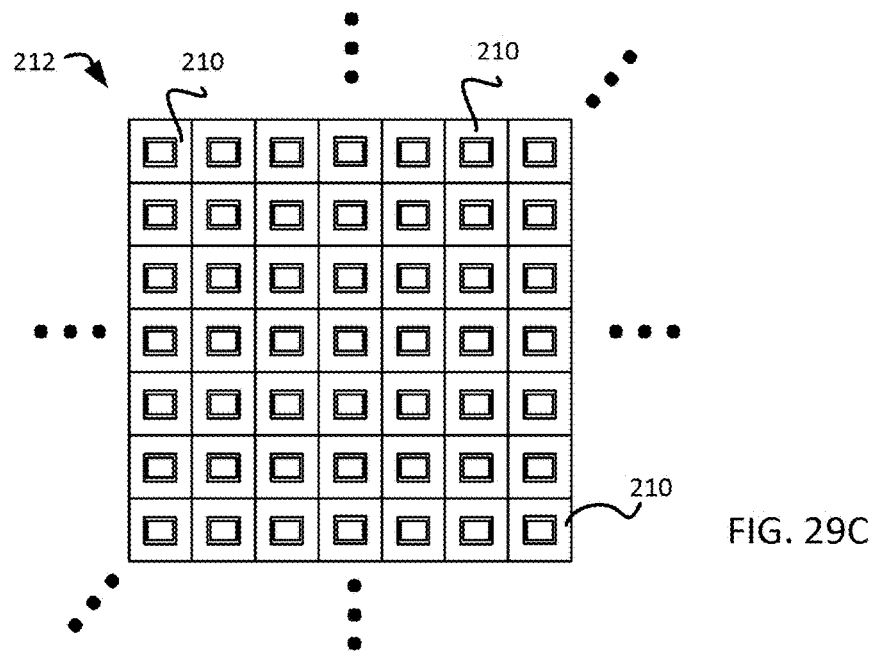
FIG. 29C shows an example implementation of a three-dimensional (3D) phononic metamaterial comprising a plurality individual unit cells.

The unit cell 210 may, for example, be repeated, periodically or randomly, in three dimensions to form a three-dimensional (3D) bulk material 212 as shown in FIG. 29C. Similarly, the unit cell may be repeated to create two-dimensional (2D) or one-dimensional structures, such as described herein. The inclusions 214, in various implementations may comprise an atomically ordered and/or disordered (e.g., amorphous) material. The inclusion material in one particular configuration, for example, may be made of a polycrystalline material or a single-crystal material. The inclusion material may be, for example, the same type of material as the base material or may be made of any other material, such as but not limited to semiconductor, metal, ceramic, polymer and/or composite material(s). The inclusion material in this particular configuration may for example be made of a polymer or partially polymeric material. In one particular implementation, for example, a base material of the unit cell may be constructed with single crystal silicon and one or more inclusion(s) may be made out of crystalline silicon or amorphous silicon or silicon oxide or any crystalline material such as germanium or gallium nitride or any other semiconducting materials or ceramic or metal or a composite comprising a combination of these materials. The inclusion material disposed at least partially within one or more outer layer 215 of compliant and/or slippable material in this configuration acts as one or more oscillators/resonators where each atom in the inclusion portion exhibits three natural frequencies/hybridizing resonances. The oscillators/resonators generate a plurality of local vibration modes that interact with a plurality of phonons moving through the base material channel(s) and may slow the group velocities of at least a portion of the interacting phonons, cause mode localization and/or increased phonon scattering. Further, thermal transport through the material may be reduced while at least substantially allowing electron transport through one or more base material channel(s) or transport regions 219. Other shapes for the inclusions may also be adapted. In analogy to the configuration shown in FIG. 10B (which is a two-dimensional version), the sites of the inclusion material may be ordered in a periodic fashion (as shown) and/or may be randomly or otherwise distributed. Similarly, the size of each inclusion (e.g., within one or more unit cells) may be uniform or may vary in groups or vary randomly or otherwise.

Figure 29D:
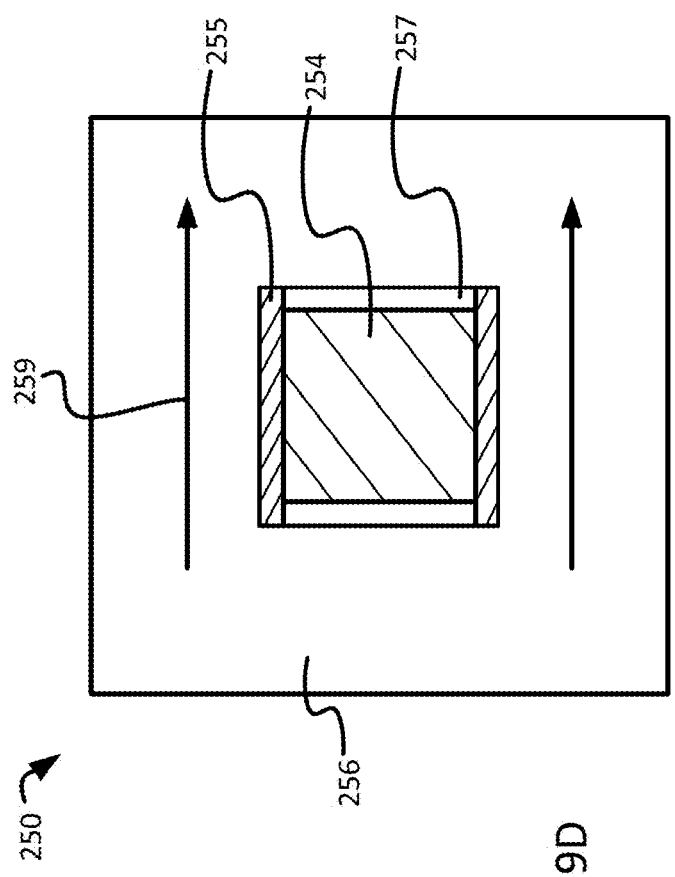
FIG. 29D shows an example implementation of a three-dimensional (3D) unit cell.

FIG. 29D shows a side view of another example implementation of a three-dimensional (3D) unit cell 250 that may be used, for example, within a bulk or other material such as a two- or one-dimensional material like a membrane or a wire, respectively, such as described above with respect to FIGS. 29A through 29C. In one implementation, for example, the unit cell 250 may comprise a unit cell of a bulk material. A three-dimensional (3D) bulk material configuration, for example, may include a periodic array of unit cells 250 each including one or more inclusions 254 (e.g., similar to the cubic inclusions 214 shown in FIG. 29A) disposed within a base material 256. FIG. 29B shows, for example, an implementation of a 3D unit cell 250 comprising a crystalline (e.g., single crystal or partially crystalline) base material 256 structure including one or more inclusions 254 disposed within the crystalline base material 256 structure. The inclusion 254 is further partially disposed within one or more layer 255 of a compliant and/or slippable material, such as graphite, rubber or polymer. In one particular implementation, for example, the compliant and/or slippable material includes a plurality of individual sub-layers (e.g., atomic-scale layers) adapted to vibrate normal to the layers or slip or vibrate parallel to the layers and with respect to one another such as described above. Although FIG. 29D shows a single inclusion 254, the unit cell may include a plurality of inclusions disposed within the crystalline structure. Further, the inclusion(s) 254 may be disposed partially within a plurality of layers of compliant and/or slippable material (e.g., partially or fully surrounded by the compliant and/or slippable material).

In the implementation shown in FIG. 29D, for example, the inclusion is partially surrounded by the layer(s) of relatively compliant, slippable, or soft material and further one or more voids 257 are also disposed between the inclusion and the base material in one or more openings where the layer(s) of relatively compliant or soft material are not disposed between the inclusion and the base material. The voids in various example implementations may include air, gas, vacuum, liquid, and/or solid and may provide room for the inclusion to move as it vibrates within the base material. In other implementations, the inclusion, where not surrounded by the layer(s) of relatively compliant or soft material, may be disposed directly adjacent to the base material 256.

Similar to described above with respect to FIGS. 29A through 29C, the unit cell 250 may, for example, be repeated, periodically or randomly, in three dimensions to form a three-dimensional (3D) bulk material. Similarly, the unit cell may be repeated to create two-dimensional (2D) or one-dimensional structures, such as described herein. The inclusions 254, in various implementations may comprise an atomically ordered and/or disordered (e.g., amorphous) material. The inclusion material in one particular configuration, for example, may be made of a polycrystalline material or a single-crystal material. The inclusion material may be, for example, the same type of material as the base material or may be made of any other material, such as but not limited to semiconductor, metal, ceramic, polymer and/or composite material(s). The inclusion material in this particular configuration may for example be made of a polymer or partially polymeric material. In one particular implementation, for example, a base material of the unit cell may be constructed with single crystal silicon and one or more inclusion(s) may be made out of crystalline silicon or amorphous silicon or silicon oxide or any crystalline material such as germanium or gallium nitride or any other semiconducting materials or ceramic or metal or a composite comprising a combination of these materials. The inclusion material disposed partially within one or more outer layer 255 of compliant and/or slippable material in this configuration acts as one or more oscillators/resonators where each atom in the inclusion portion exhibits three natural frequencies/hybridizing resonances. The oscillators/resonators generate a plurality of local vibration modes that interact with a plurality of phonons moving through the base material channel(s) and may slow the group velocities of at least a portion of the interacting phonons, cause mode localization and/or increased phonon scattering. Further, thermal transport through the material may be reduced while at least substantially allowing electron transport through one or more base material channel(s) or transport regions 259. Other shapes for the inclusions may also be adapted. In analogy to the configuration shown in FIG. 10B (which is a two-dimensional version), the sites of the inclusion material may be ordered in a periodic fashion (as shown) and/or may be randomly or otherwise distributed. Similarly, the size of each inclusion (e.g., within one or more unit cells) may be uniform or may vary in groups or vary randomly or otherwise.

Figure 30B:
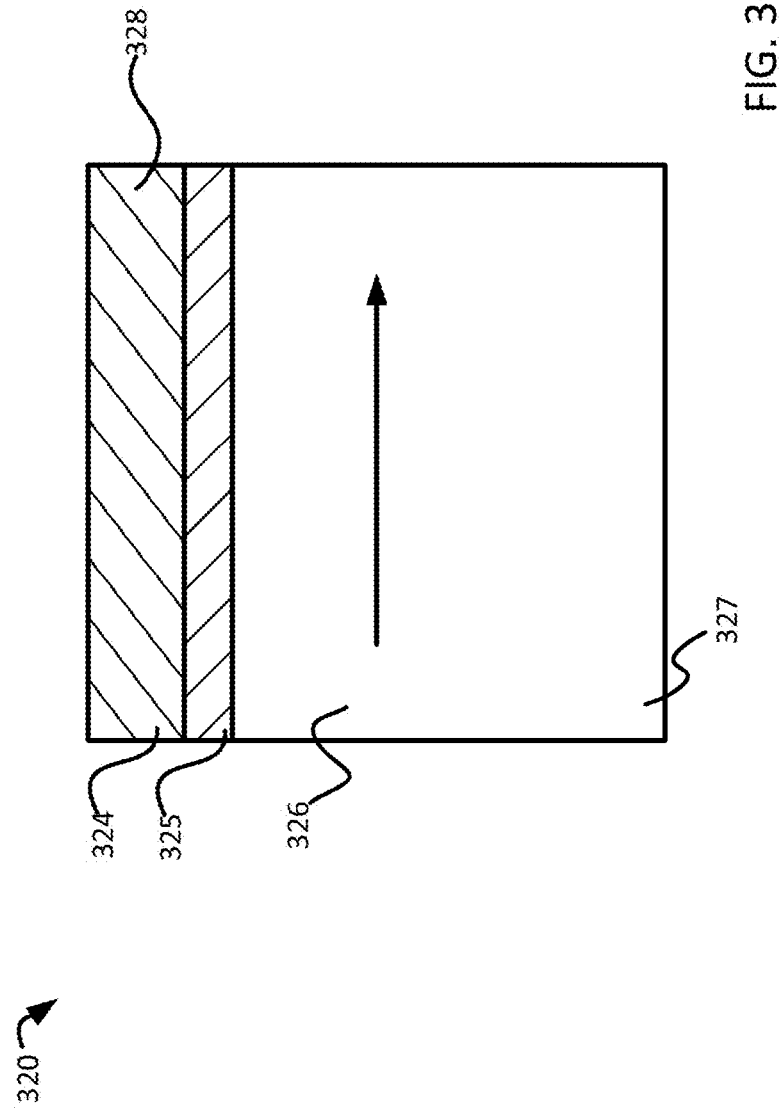

FIGS. 30A and 30B show another example implementation of a three-dimensional (3D) unit cell 320 that may be used, for example, within a bulk or other material, such as a two- or one-dimensional material like a membrane or a wire, respectively. In one implementation, for example, the unit cell 320 may comprise a unit cell of a bulk base material 326, such as a three-dimensional (3D) bulk base material configuration including an attached layer 324 of a material 328 either disposed directly adjacent to the bulk base material or disposed with one or more layers (e.g., layer(s) of soft/compliant material) disposed between the layer and the bulk base material. The attached layer 324 of material 328, for example, may comprise an atomically ordered and/or atomically disordered material (e.g., amorphous material). The attached layer 324 may be of any thickness and may fully or partially cover the base material 326. The attached layer material 328 in one particular configuration may be made of a polycrystalline material or a single-crystal material. The attached layer may be of the same type of material as the base material or can be made of any other material, such as but not limited to semiconductor, metal, ceramic, polymer and/or composite materials. The attached layer in this particular configuration may, for example, be made of a polymer or partially polymeric material. FIG. 30A shows, for example, an implementation of a 3D unit cell comprising a base material 326 comprising a crystalline material (e.g., single crystal or partially crystalline) structure 327 including one or more attached layers 324 disposed adjacent to, juxtaposed or near the crystalline structure 327. Although FIG. 30A shows a single attached layer 324 the unit cell may include a plurality of attached layers (e.g., on opposing sides of the unit cell) disposed adjacent to, juxtaposed or nearby the base material 326 comprising a crystalline structure 327. In the particular implementation shown in FIGS. 30A and 30B, a layer 325 of slippable material is disposed at least partially between the attached layer 324 and the base material 326. The layer 325 of a compliant or slippable material, for example, may comprise a plurality of atomic-scale sub-layers adapted to vibrate or slip with respect to one another. FIG. 30B shows a side view of the unit cell of FIG. 30A.

In one particular implementation, for example, the base material 326 may be constructed of single crystal silicon and the attached layer constructed of ordered (e.g., crystalline such as single-crystal or polycrystalline silicon) or disordered (e.g., amorphous silicon or silicon oxide). The attached layer 324 and interposed layer 325 of a compliant or slippable material in this configuration acts as one or more oscillators/resonators where each atom in the attached layer 324 exhibits three natural frequencies/hybridizing resonances. The oscillators/resonators generate a plurality of local vibration modes that interact with a plurality of phonons moving through the base material channel(s) and slow the group velocities of at least a portion of the interacting phonons, and, possibly, cause mode localization and/or increased phonon scattering. Further, thermal transport through the material may be reduced while at least substantially allowing electron transport through one or more base material channel(s). Other shapes, sizes, thicknesses or spatial distribution for the attached layer may be adopted. Also, the attached layer 324 and the interposed layer 325 of a compliant or slippable material disposed at least partially between the layer 324 and the base material 326 may be attached to the base material 326 on one side or more than one side. In analogy to the configuration shown in FIG. 10B (which is a 2D example), the sites of the attached layer 324 and the interposed layer 325 of a compliant or slippable material may be ordered in a periodic fashion (as shown) or may be randomly distributed or may continuously cover the surface. Similarly, the size of each attached layer 324 and interposed layer 325 may be uniform or may vary in groups or vary randomly.

Figure 31:
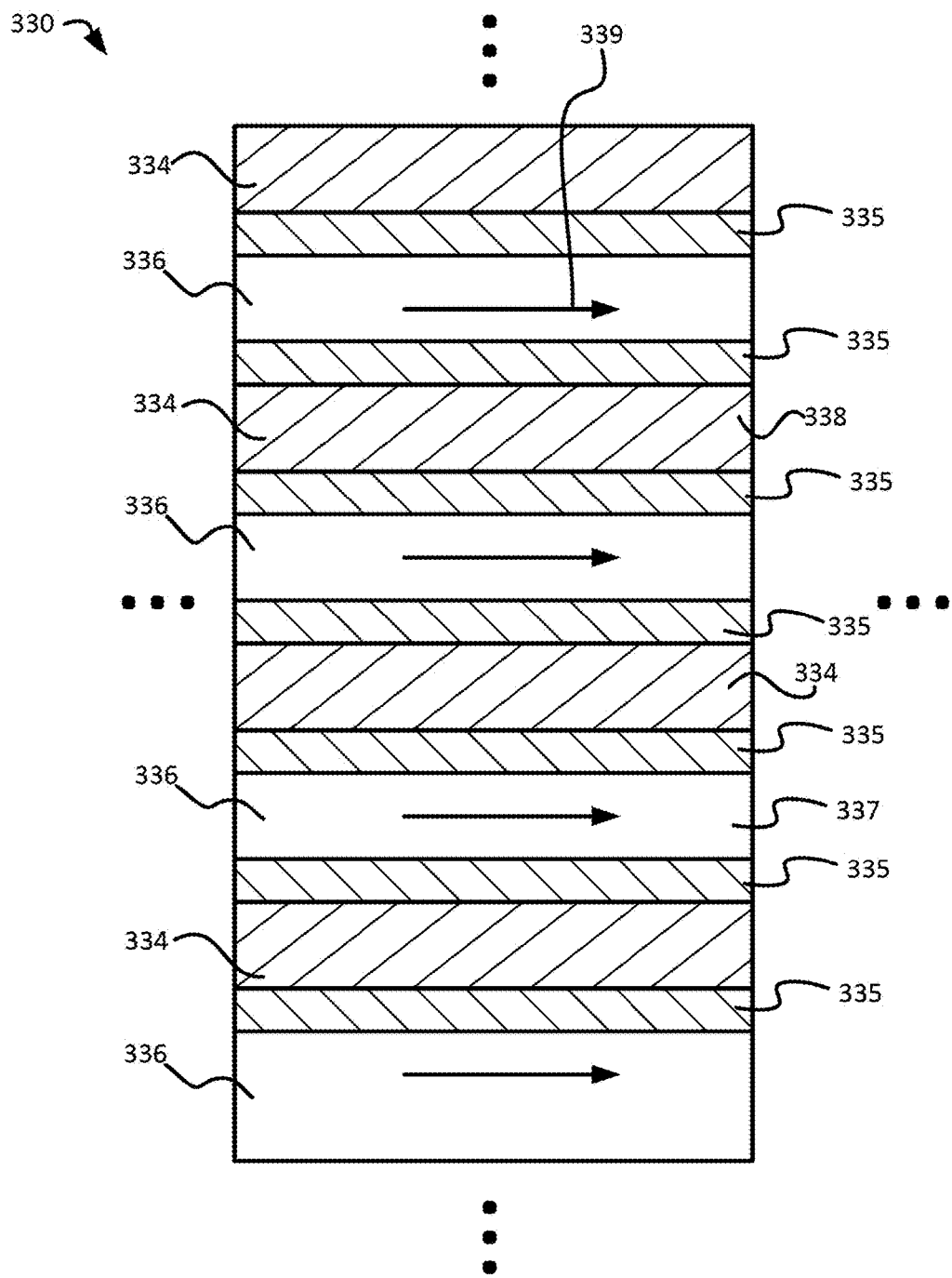
FIG. 31 shows an example of yet another example implementation of one or more unit cell(s).

FIG. 31 shows an example of yet another example implementation of one or more unit cell(s) 330 of a material including a plurality of crystalline (e.g., single crystal or partially crystalline) thermoelectric base material layers 336, such as a silicon or other at least partially crystalline material 337 configured for thermal transport through the base material 336 interposed between one or more attached layers 334 and layers 325 of a compliant or slippable material, such as graphite. The base material 336 may, for example, comprise a bulk 3D material, a 2D material or a 1D material. One or more layers 334 of atomically ordered and/or atomically disordered (e.g., amorphous) material 338 are disposed adjacent to, juxtaposed or near the crystalline thermoelectric base material components 336. In the particular implementation shown in FIG. 31, for example, the layer 334 is disposed directly adjacent to an interposed layer 335 of a compliant or slippable material, such as described above with reference to FIGS. 30A and 30B. The layer(s) 334, for example, may comprise an atomically ordered and/or atomically disordered (e.g., amorphous) material 338. The layer(s) in this particular configuration may, for example, be made of a polycrystalline material or a single-crystal material. The attached layer(s) 334 may be of the same type of material as the base material or can be made of any other material, such as but not limited to semiconductor, metal, ceramic, polymer and/or composite materials. The attached material layers 334, in this particular configuration may, for example, be made of a polymer or partially polymeric material. The unit cell, in this particular implementation, for example, comprises a plurality of crystalline thermoelectric material layers 336 configured for thermal transport through the unit cell and a plurality of attached layers 334 disposed adjacent to, juxtaposed or near one or more of the crystalline thermoelectric base material layers 336, and one or more interposed layer of a compliant or slippable material 335 disposed at least partially between the attached layer(s) 334 and the base material layer(s) 336.

In one particular implementation, for example, the base crystalline material layer(s) 336 may be constructed of single crystal silicon, the attached layer(s) or pillars or walls 334 constructed of atomically ordered or disordered material (e.g., crystalline silicon, polycrystalline silicon or other crystalline or polycrystalline material, amorphous silicon or silicon oxide, or ceramic or metal), and the interposed layer 335 constructed of graphite or other compliant material. The attached layer(s) 334 and the interposed layer 335 in this configuration act as one or more oscillators/resonators where each atom in the attached layer 334 portion exhibits three natural frequencies/hybridizing resonances. The oscillators/resonators generate a plurality of local vibration modes that interact with a plurality of phonons moving through the base material 336 channel(s) and slow the group velocities of at least a portion of the interacting phonons, and, possibly, cause mode localization and/or increased phonon scattering. Further, thermal transport through the base material 336 may be reduced while at least substantially allowing electron transport through one or more base material channel(s). Other shapes, sizes, thicknesses or spatial distribution for the attached layer 334 and interposed layer 335 may be adopted. Also, the attached layer 334 and the interposed layer 335 may be attached to the base material on one side or more than one side. In analogy to the configuration shown in FIG. 10B (which is a 2D example), the sites of the attached layer 334 and interposed layer 335 materials may be ordered in a periodic fashion (as shown) or may be randomly distributed within the base crystalline material or may take a continuous form within the base crystalline material. Similarly, the size of each attached layer may be uniform or may vary in groups or vary randomly.

In the particular implementation shown in FIG. 31, for example, a plurality of transport "channels" 339 are formed by the plurality of base material crystalline material layers 336 disposed within the unit cell between the attached layers 334 and interposed layers 335 of material disposed between two or more channels 339 of the base crystalline material 337. The attached layers 334 of material 338 and interposed layers 335 act as one or more oscillators/resonators that generate a plurality of local vibration modes (including those stemming from atomic vibrations) within the at least partially crystalline base material channel(s) and interact with a plurality of phonons moving through the base material channel(s) and slow the group velocities of at least a portion of the interacting phonons, and, possibly, cause mode localization and/or increased phonon scattering. In this manner, thermal transport through the material may be reduced while at least substantially allowing electron transport through the base material channel(s).

Figure 32:
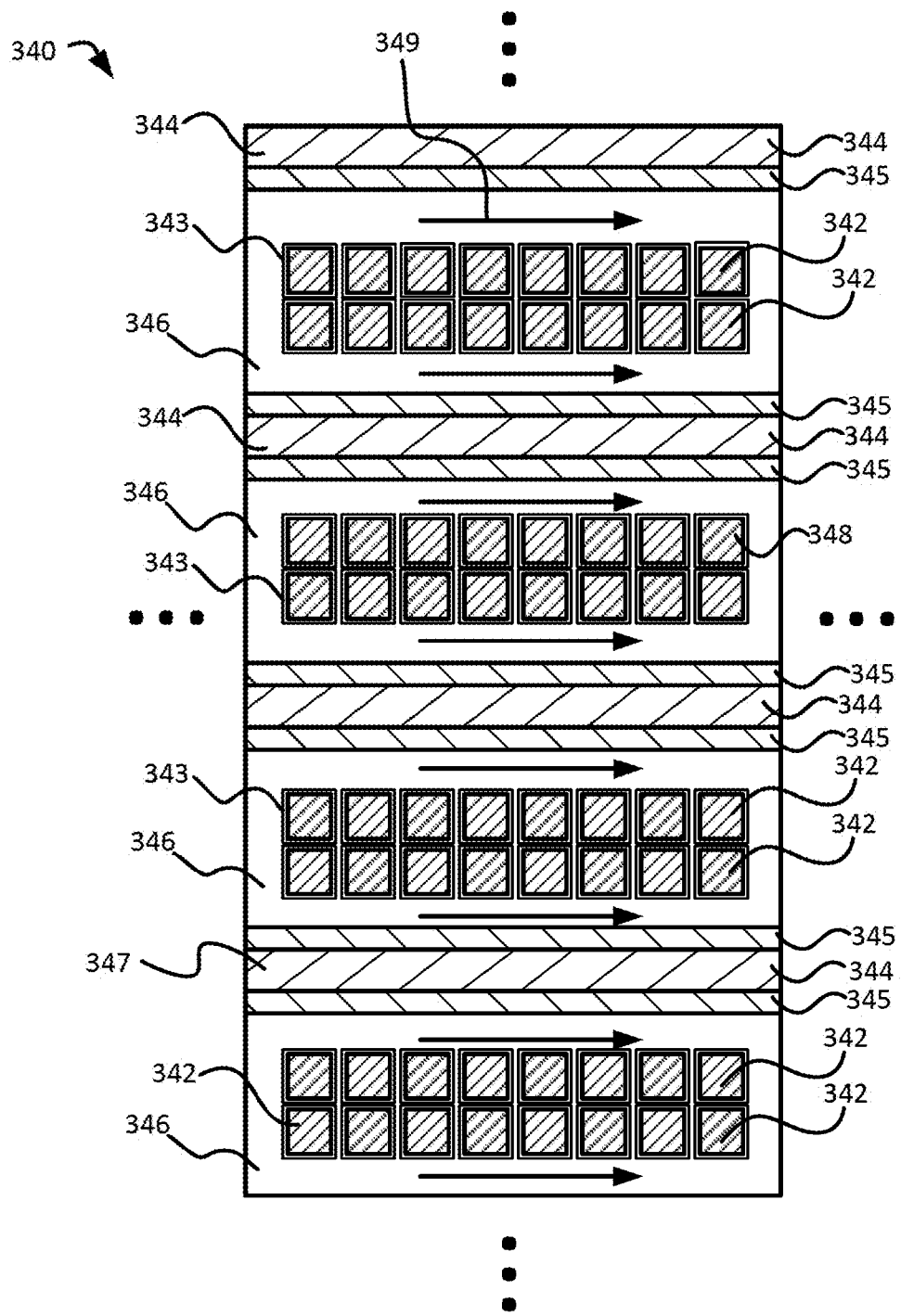
FIG. 32 shows another implementation of one or more unit cell(s).
Figure 33:
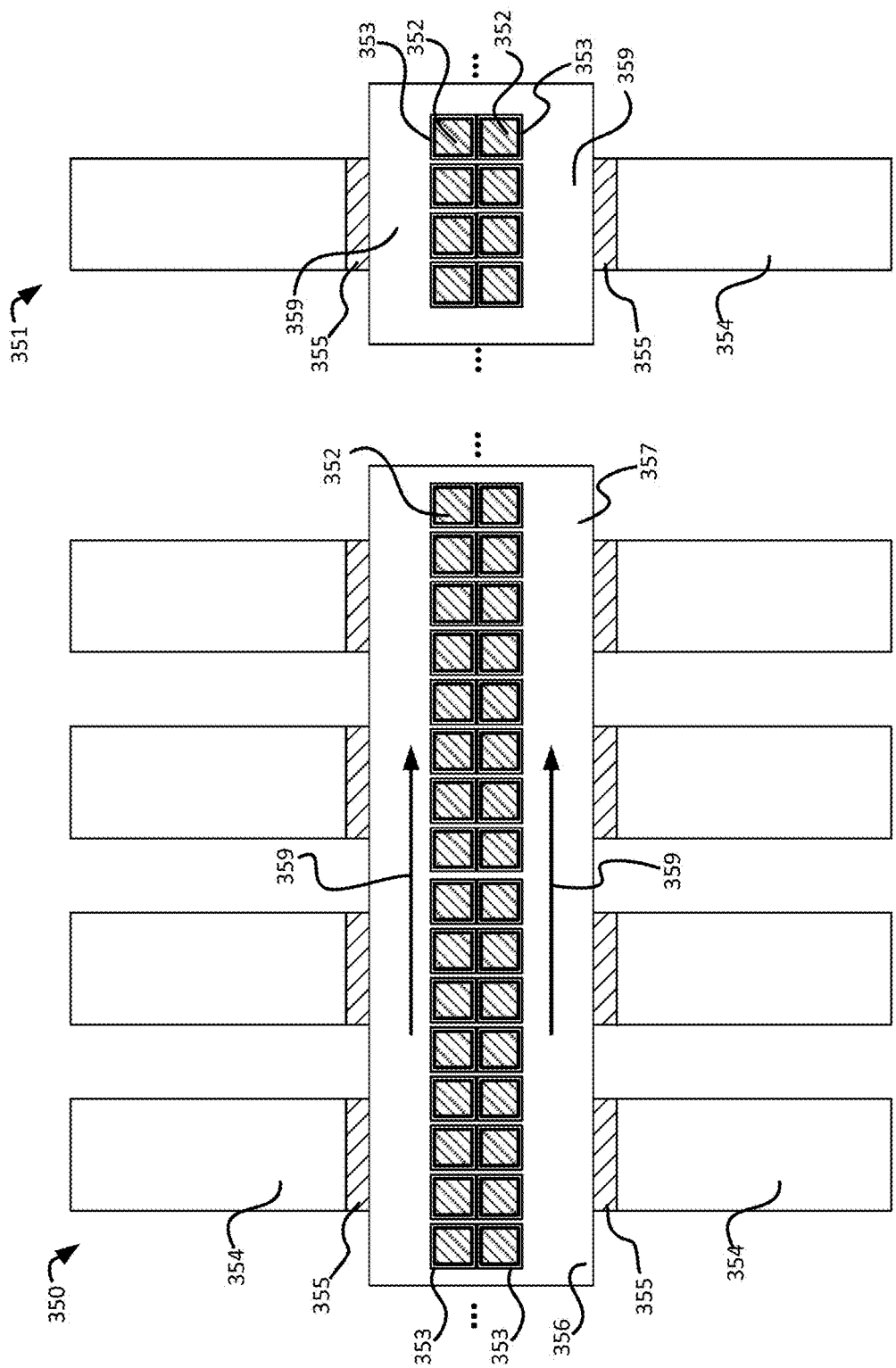
FIGS. 33A and 33B show an example implementation of a composite material adapted to slow a group velocity of one or more phonons flowing through a crystalline material.
Figure 34:
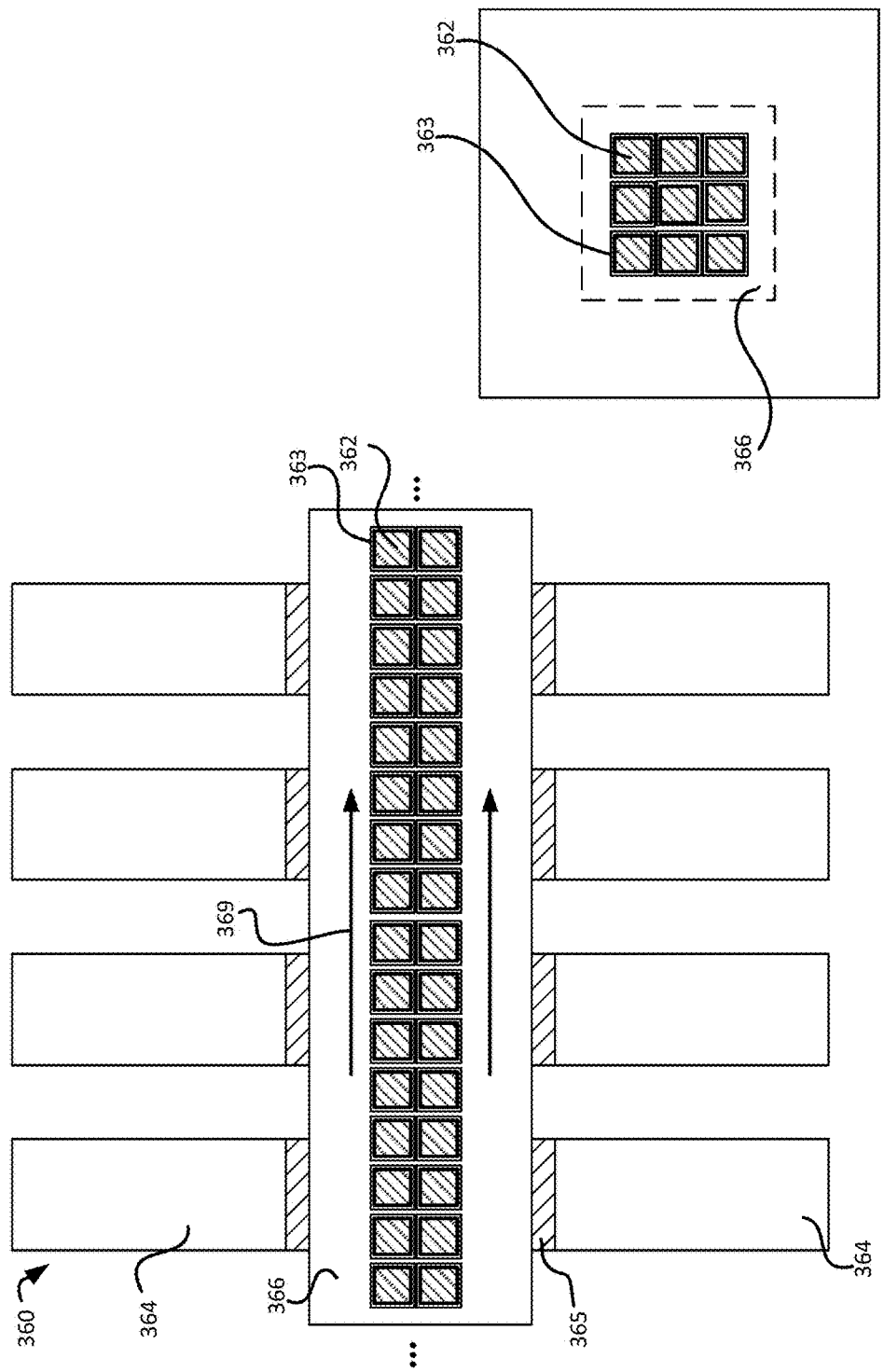
FIGS. 34A and 34B show another example implementation of a composite material adapted to slow a group velocity of one or more phonons flowing through a crystalline base material.

FIG. 32 shows another implementation of one or more unit cell(s) 340 of a material including a plurality of at least partially crystalline (e.g., single crystal or partially crystalline) thermoelectric base material layer(s) 346, such as a silicon or other material including one or more inclusions 342. In one implementation, as shown in FIG. 32 for example, the inclusions 342 are disposed at least partially within a non-transport region of the base material 346, leaving relatively open transport regions 349 for easier electron flow through the base material 346. The inclusions 342, in this implementation, are at least partially surrounded by a compliant or slippable material 343, such as shown in FIGS. 29A-29C, and further include one or more attached layer(s) 344 and interposed layers 345 disposed adjacent to, juxtaposed to or near the base material layer(s) 46, such as shown in FIGS. 30A and 30B. The base material region(s) 346, for example, may comprise a crystalline (e.g., single crystal or partially crystalline) structure including one or more inclusions 342 disposed within the crystalline structure of the base material 346 and disposed at least partially within (e.g., fully or partially surrounded by) the layer 343 of a compliant or slippable material.

The base material 346 may, for example, comprise a bulk 3D material, a 2D material or a 1D material. One or more attached layer 344 and interposed layer 345 are disposed adjacent to, juxtaposed to or near the crystalline thermoelectric base material 346 having the inclusion(s) 342 and an at least partially surrounding layer 343 of a compliant or slippable material. In one particular implementation, for example, the inclusion(s) 342 and the attached layer 344 material may also be made of a polycrystalline material or a single-crystal material. The inclusion(s) 342 and attached layer(s) 344 may be of the same type of material as the base material 346 or can be made of any other material, such as but not limited to semiconductor, metal, ceramic, polymer and/or composite materials. The unit cell, in this particular implementation, for example, comprises a plurality of at least partially crystalline thermoelectric material layers configured for thermal transport through the unit cell. One or more inclusion(s) 342 may be disposed within the thermoelectric base material layers 346 and at least partially within the layer 343 of a compliant or slippable material and one or more attached layer(s) 344 and interposed layer 345 may be disposed adjacent to, juxtaposed to or near one or more of the crystalline thermoelectric base material layers 346.

In one particular implementation, for example, the base crystalline material layer(s) 346 may be constructed of single crystal silicon and the inclusion(s) 342 and attached layer(s) 344 constructed of an atomically ordered or disordered material (e.g., single-crystal silicon, polycrystalline, amorphous silicon or silicon oxide). The inclusion(s) 342 and attached layer(s) 344 along with the layers 342 and 345, respectively, in this configuration act as one or more oscillators/resonators where each atom exhibits three natural frequencies/hybridizing resonances. Other shapes, sizes, thicknesses or spatial distribution for the attached layer may be adopted. Also, the attached layer 344 and interposed layer 345 may be attached to the base material 346 on one side or more than one side. In analogy to the configuration shown in FIG. 10B (which is a 2D example), the sites of the attached layer material may be ordered in a periodic fashion (as shown) or may be randomly or otherwise distributed within the base crystalline material or may take a continuous form within the base crystalline material. Similarly, the size of each attached layer may be uniform or may vary in groups or vary randomly or otherwise.

In the particular implementation shown in FIG. 32, for example, a plurality of transport "channels" 349 are formed by the plurality of base crystalline material layers 346 disposed within the unit cell. The inclusion(s) 342, layer(s) 343 of compliant or slippable material, attached layer(s) 344 and interposed layer(s) 345 of compliant or slippable material act as one or more oscillators/resonators that generate a plurality of local vibration modes within the at least partially crystalline base material channel(s) and interact with a plurality of phonons moving through the base material transport channel(s) and slow the group velocities of at least a portion of the interacting phonons, and, possibly, cause mode localization and/or increased phonon scattering. In this manner, thermal transport through the material may be reduced while at least substantially allowing electron transport through the base material channel(s).

FIGS. 33A and 33B show an example implementation of a composite material 350 adapted to slow a group velocity of one or more phonons flowing through a crystalline material, and, possibly, cause mode localization and/or increased phonon scattering. In this particular implementation, for example, a crystalline base material 356 (e.g., single crystal or partially crystalline material 357) defines at least one transport region 359 along with one or more pillars 354 disposed adjacent to, juxtaposed to or near the transport region 359 of the composite material 350, such as described above with respect to FIGS. 2, 3, 9, 11, 12 and 13. An interposed layer 355 of compliant or slippable material is disposed at least partially between the base material 356 and the one or more pillars 354. The one or more pillars 354 and layers 355 act as one or more oscillators/resonators that generate a plurality of local vibration modes (including those due to atomic vibrations) within the transport region 359 of the at least partially crystalline base material 356 and interact with a plurality of phonons moving through the transport region 359 and slow the group velocities of at least a portion of the interacting phonons, and, possibly, cause mode localization and/or increased phonon scattering. Further, thermal transport through the base material 356 may be reduced while at least substantially allowing electron transport through one or more base material channel(s) 359.

The composite material 350 further comprises one or more inclusions 352 disposed at least partially within (e.g., fully or partially surrounded by) a compliant or slippable material 353 within the transport region 359. As described above with respect to FIGS. 15A-15C, 18, 29A, 29B and 31 above, the inclusions 352 similarly act as one or more oscillators/resonators that generate a plurality of local vibration modes (including those due to atomic vibrations) within the transport region 359 of the at least partially crystalline base material and interact with a plurality of phonons moving through the transport region and slow the group velocities of at least a portion of the interacting phonons, and, possibly, cause mode localization and/or increased phonon scattering. In this manner, thermal transport through the transport region 359 of the composite material 350 may be reduced by the pillars 354 and/or inclusions 352 along with the compliant or slippable material layers 353 and 355 while at least substantially allowing electron transport through the transport region 359 of the composite material 350.

FIGS. 34A and 34B show another example implementation of a composite material 360 adapted to slow a group velocity of one or more phonons flowing through a crystalline base material 366, and, possibly, cause mode localization and/or increased phonon scattering. In this particular implementation, for example, crystalline base material (e.g., single crystal or partially crystalline material) defines a transport region 369 along with one or more rings or plates or pillars 364 extending away from the transport region 369 of the composite material 60, such as described above with respect to FIGS. 13, 20A and 20B. An interposed layer 365 of compliant or slippable material is disposed at least partially between the base material 366 and the one or more pillars 364. The one or more rings or plates or pillars 364 and interposed layers 365 of compliant or slippable material act as one or more oscillators/resonators that generate a plurality of local vibration modes (including those due to atomic vibrations) within the transport region of the at least partially crystalline base material 366 and interact with a plurality of phonons moving through the transport region 369 and slow the group velocities of at least a portion of the interacting phonons, and, possibly, cause mode localization and/or increased phonon scattering.

The composite material 360 further comprises one or more inclusions 362 disposed at least partially within a layer 363 of compliant or slippable material within the transport region 369. As described above with respect to FIGS. 15A-15C, 18, 29A, 29B, 31, 32A and 32B above, the inclusions 362 and layers 363 similarly act as one or more oscillators/resonators that generate a plurality of local vibration modes (including those due to atomic vibrations) within the transport region 369 of the at least partially crystalline base material 366 and interact with a plurality of phonons moving through the transport region 369 and slow the group velocities of at least a portion of the interacting phonons, and, possibly, cause mode localization and/or increased phonon scattering. In this manner, thermal transport through the transport region 369 of the composite material 360 may be reduced by the plates, rings, pillars 364 and/or inclusions 362 while at least substantially allowing electron transport through the transport region of the composite material.

Figure 35:
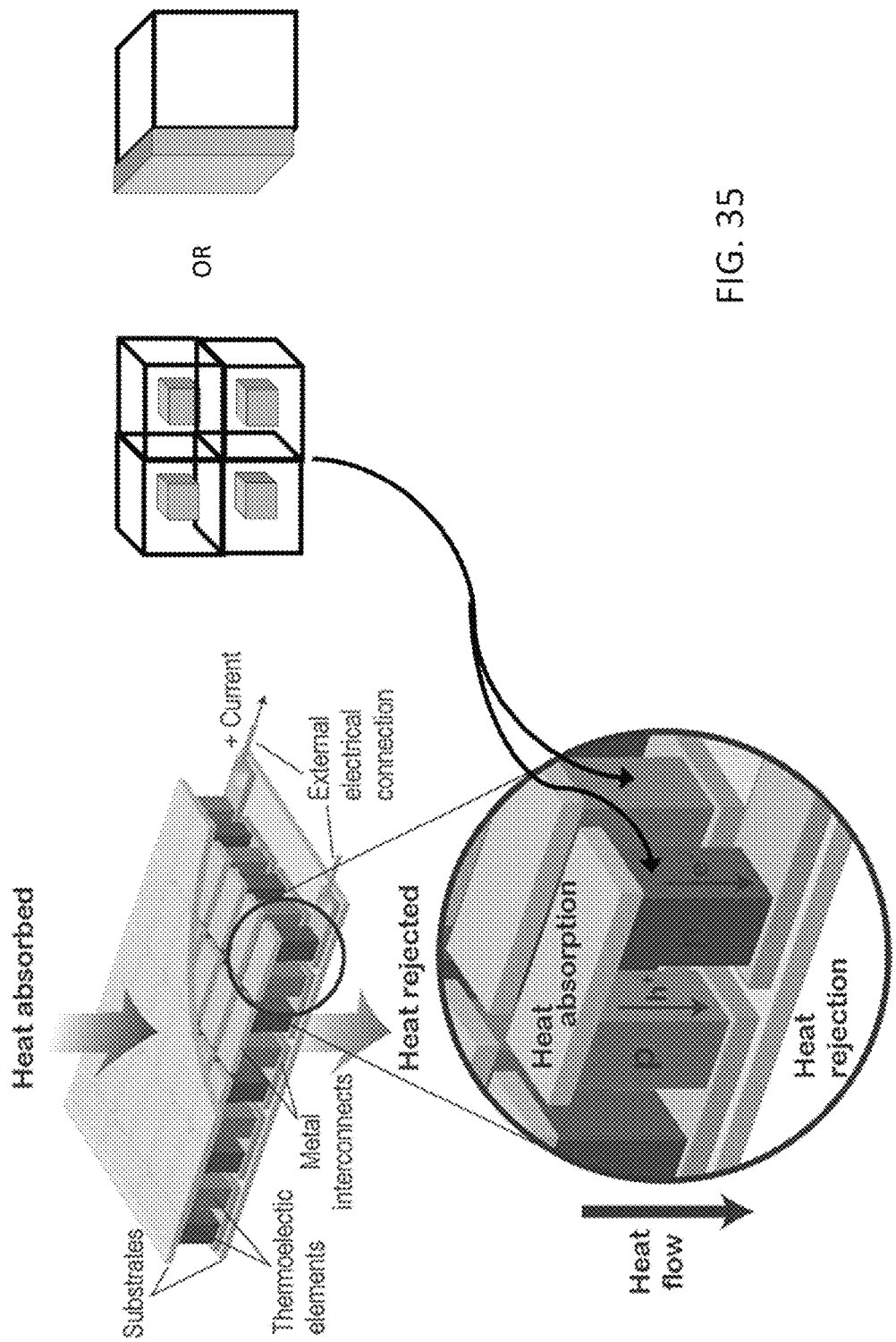
FIG. 35 shows an example implementation of a thermoelectric device using a bulk phononic metamaterial.

FIG. 35 shows an example implementation of a thermoelectric device using a bulk phononic (e.g., nanophononic) metamaterial, such as for example a single crystal silicon material with one or more periodic or non-periodic inclusions of an atomically ordered or disordered material (e.g., crystalline silicon, polycrystalline silicon, other crystalline or polycrystalline material, silicon or silicon oxide, or ceramic or metal) disposed at least partially within a layer of compliant or slippable material such as shown in FIG. 29A, 29B and/or with a single crystal silicon material with one or more attached layer(s) of an atomically ordered or disordered material (e.g., crystalline silicon, polycrystalline silicon, other crystalline or polycrystalline material, silicon or silicon oxide, or ceramic or metal) disposed at least partially within a layer of compliant or slippable material such as shown in FIG. 30 and/or with a single crystal silicon material with one or more embedded layer(s) of an atomically ordered or disordered material (e.g., crystalline silicon, polycrystalline silicon, other crystalline or polycrystalline material, silicon or silicon oxide, or ceramic or metal) disposed at least partially within a layer of compliant or slippable material such as shown in FIG. 31. In these particular implementations, for example, a bulk phononic (e.g., phononic or nanophononic) metamaterial may be doped at any level desired to improve the electrical properties forming a p-type semiconducting material and/or an n-type semiconducting material. Furthermore, the transport portion of the phononic (e.g., nanophononic) metamaterial may be alloyed with other elements to reduce the thermal conductivity further while having a minimal effect on the electrical properties such as the electrical conductivity and the Seebeck coefficient.

Figures 36A, 36B:
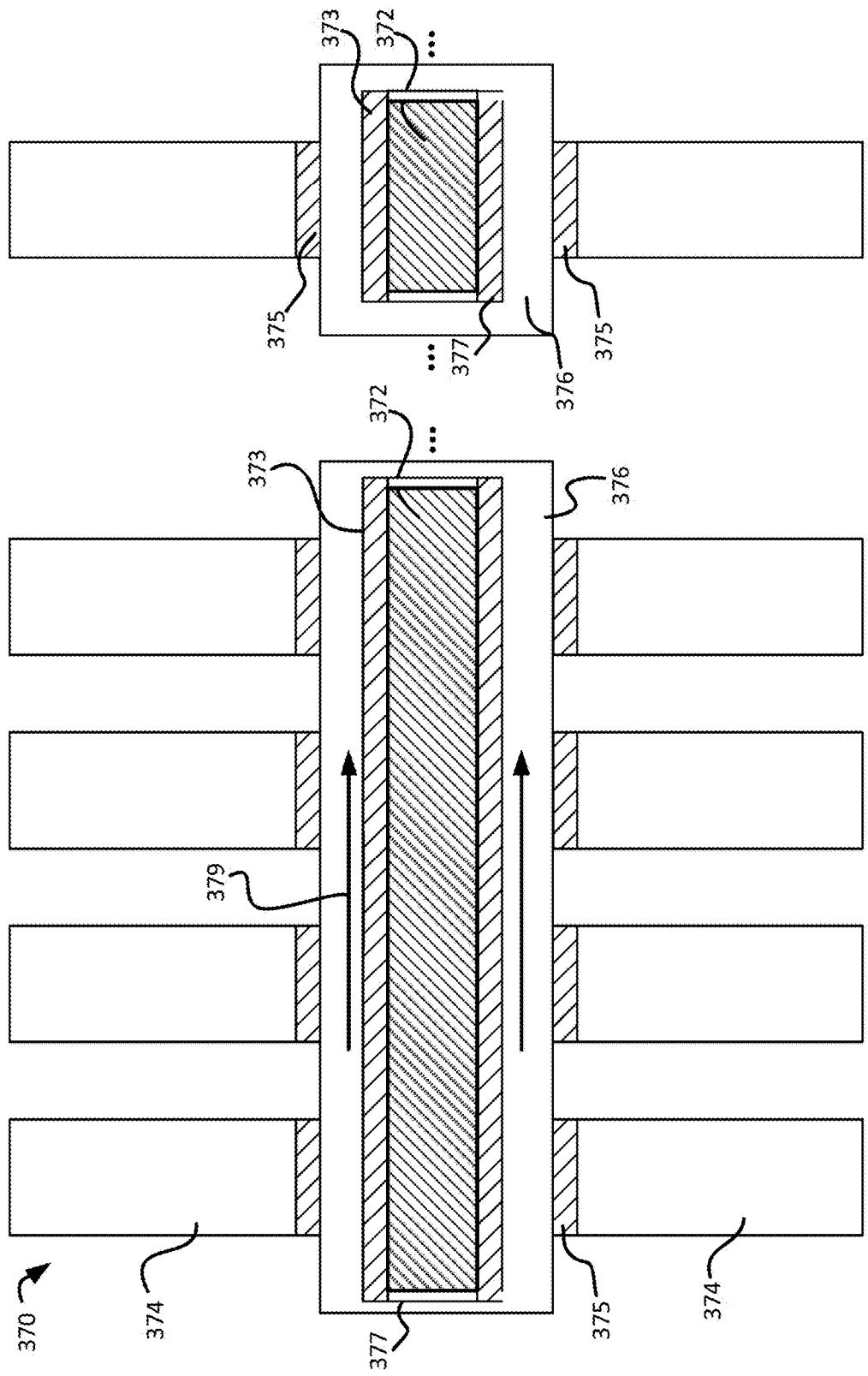

FIGS. 36A, 36B, 37A and 37B depict other example implementations of composite materials 370, 380 adapted to slow a group velocity of one or more phonons flowing through an at least partially crystalline material, and, possibly, cause mode localization and/or increased phonon scattering. In FIGS. 36A and 36B, for example, a composite material 370 includes a two-dimensional thin-film/membrane base material structure 376 with extended substructures 374 (e.g., pillars) and an interposed layer 375 of a compliant or slippable material disposed at least partially between the base material structure 376 and the extended substructures 374. FIGS. 37A and 37B show a composite material 380 including a one-dimensional (e.g., wire) base material structure 386 with extended substructures 384 (e.g., plates or rings) and an interposed layer 385 of a compliant or slippable material disposed at least partially between the base material structure 386 and the extended substructures 384. In this particular implementation, for example, the composite material 370, 380 comprises an at least partially crystalline thermoelectric base material. A thermoelectric base material includes a base material region 376, 386. The base material region 376, 386 includes an at least partially crystalline transport region 379, 389 and at least one atomically ordered or disordered oscillator/resonator region 372, 382 disposed at least partially within a layer 373, 383 of compliant or slippable material.

In FIGS. 36A, 36B, 36C and 36D, for example, the resonator region/inclusion 372 is partially surrounded by the layer 373 of compliant, slippable, or soft material, while in FIGS. 37A and 37B, the resonator region/inclusion 382 is wholly surrounded by the layer 383 of compliant, slippable, or soft material. As described above, the inclusion may be fully or partially surrounded by the layer(s) of relatively compliant, slippable, or soft material. Where the inclusion is partially surrounded by the layer(s) of relatively compliant or soft material, voids 377, such as shown in FIGS. 36A and 36B, may optionally be disposed between the inclusion and the base material in one or more openings where the layer(s) of relatively compliant or soft material are not disposed between the inclusion and the base material. The voids in various example implementations may include air, gas, vacuum, liquid, and/or solid and may provide room for the inclusion to move as it vibrates within the base material. In other implementations, the inclusion, where not surrounded by the layer(s) of relatively compliant or soft material, may be disposed directly adjacent to the base material 376, such as shown in the example implementation of FIGS. 36C and 36D.

The at least one transport region 379, 389 includes one or more transport paths (shown by arrows) through the at least partially crystalline thermoelectric base material and is configured to allow electrons flow through the thermoelectric base material at least relatively unimpeded by one or more atomically ordered or disordered materials of one or more oscillator/resonator regions 372, 382 (e.g., one or more atomically disordered inclusions) disposed at least partially within (e.g., fully or partially surrounded by) the layer of compliant or slippable material 373, 383 within the base material region 376, 386 of the base material juxtaposed the transport region(s) 379, 389. The atomically ordered or disordered oscillator/resonator region 372, 382 and respective layers of compliant or slippable material 373, 383 are adapted to provide local resonances through the movement of one or more atoms within the atomically ordered or disordered material of the oscillator/resonator region 372, 382 (e.g., one or more inclusions) and the layers 373, 383 of compliant or slippable material. The local resonances, in turn, travel into the transport region(s) 379, 389 of the at least partially crystalline thermoelectric base material and interact with one or more phonons traveling through the transport region 379, 389 reducing group velocities and the thermal conductivity of the composite material 370, 380, and, possibly, cause mode localization and/or increased phonon scattering. In this particular implementation, for example, the atomically ordered or disordered oscillator/resonator region 372, 382 may comprise a continuous inclusion of atomically ordered or disordered material disposed within the at least partially crystalline thermoelectric base material or may include a plurality of individual inclusions of atomically ordered or disordered material. The inclusion(s) may also be disposed at least partially within one or more layer of compliant or slippable material within the at least partially crystalline base material. Although FIGS. 36A, 36B, 37A and 37B show a single continuous inclusion forming the oscillator/resonator region, a plurality of continuous or discontinuous inclusions may also be used to form one or more atomically ordered or disordered oscillator/resonator regions disposed at least partially within a layer of compliant or slippable material within the thermoelectric base material region. However, local resonances of atoms within the inclusion(s) and layer(s) of compliant or slippable material extend into the transport region(s) and interact with phonons passing through the region. Thus, the base material region may be configured to allow electrons to pass through the transport region(s) without being substantially impeded by the inclusion(s) while still allowing the local resonances of the inclusions and layer(s) of compliant or slippable material to interact with one or more phonons passing through the same transport region.

The composite materials shown in FIGS. 36A, 36B, 37A and 37B further include one or more extending substructures 374, 384 extending outwardly away from a surface of the thermoelectric base material region 376, 386 (e.g., the 2D thin-film/membrane base material of FIG. 22 or the 1D wire base material of FIG. 23) along with one or more interposed layers 375, 385 of a compliant or slippable material disposed at least partially between the extending substructures 374, 384 and the surface of the thermoelectric base material region 376, 386. The extending substructures 374, 384, for example, may comprise any structure that extends away from the at least partially crystalline base material region, such as but not limited to pillars, walls, rings, plates, layers or the like. In the particular implementation shown in FIGS. 36A, 36B, 37A and 37B, for example, a plurality of extending substructures 374, 384 extend away from a surface of the thermoelectric base material region 376, 386 along with one or more interposed layers 375, 385 of a compliant or slippable material and provide local oscillators/resonators adapted to create local resonances that extend into one or more transport regions 379, 389 of the base material through the movement of one or more atoms of the extending substructures. The local resonances of the extending substructures and interposed layers similarly interact with phonons passing through the transport region(s) of the base material region and decrease the group velocities of the phonons and may reduce the thermal conductivity of the composite material, and, possibly, cause mode localization and/or increased phonon scattering. Although FIGS. 36A, 36B, 37A and 37B show particular types of substructures (e.g., pillars/walls/plates/rings) and interposed layers extending away from a surface of the base material region including the transport region being formed of an at least partially crystalline material, which may be the same or a different material as the at least partially crystalline thermoelectric base material, some or all of the extending substructures may likewise be formed of an atomically ordered or disordered material as described herein.

Figure 38:
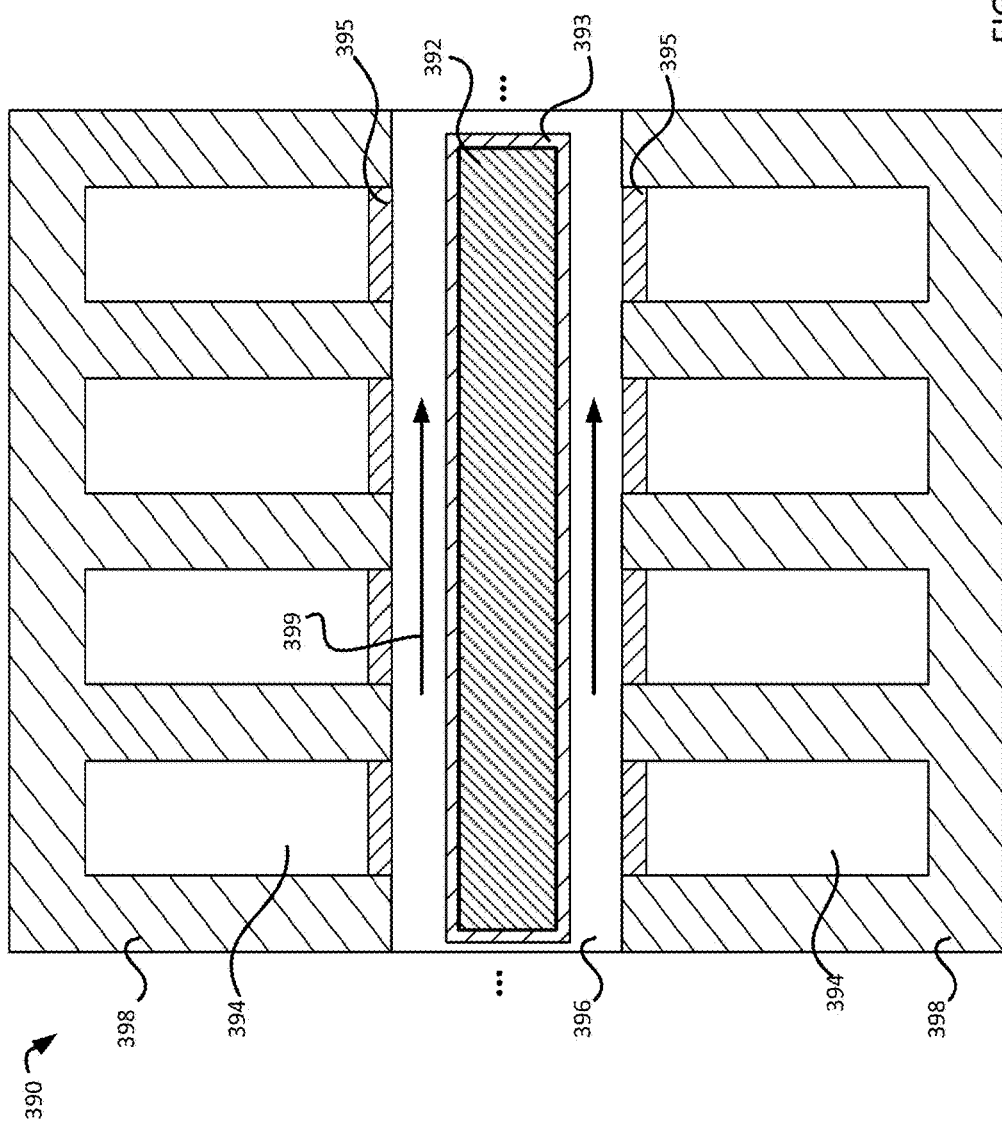
FIG. 38 depicts yet another example implementation of a bulk composite material including a phononic metamaterial.

FIG. 38 depicts yet another example implementation of a bulk composite material 390 including a phononic metamaterial. In this particular implementation, for example, the composite material 390 comprises a base material region 396 including an at least partially crystalline thermoelectric transport region 399 and at least one atomically ordered or disordered oscillator/resonator region 392. The transport region 399 includes one or more transport regions of the base material region 396. The at least partially crystalline base material region 396 provides one or more transport regions 399 for electron and phonon flow through the thermoelectric structure via one or more transport paths (shown by arrows) extending through the at least partially crystalline thermoelectric base material. The transport region(s) 399 are configured to allow electrons to flow through the thermoelectric base material at least relatively unimpeded by one or more atomically ordered or disordered materials of one or more oscillator/resonator regions 392 (e.g., one or more inclusions) disposed at least partially within a layer of compliant or slippable material 393 disposed within the base material region 396 of the base material juxtaposed the transport region(s). The composite material further comprises at least one extending substructure 394 (e.g., layers, pillars, walls, rings, plates) and an interposed layer 395 that extend away from a surface of the base material region 396. In the particular implementation shown in FIG. 38, for example, the composite material 390 includes a plurality of extending substructures 394 and interposed layers 395 of a compliant or slippable material extending in at least two directions away from a surface of the base material region 396 including the at least partially crystalline transport region 399 and a continuous inclusion 392 of atomically ordered or disordered (e.g., amorphous) material disposed within the transport region 399 adjacent to two opposite transport regions. These extending substructures 394, for example, may comprise any structure that extends away from the base material region, such as but not limited to pillars, walls, rings, plates, layers or the like.

The composite material 390, in this particular implementation, includes a bulk composite structure including the base material region 396 from which the extending substructures 394 and layers 395 of compliant or slippable material extend. The at least partially crystalline transport region 399 and the extending substructures 394/layers 395 of compliant or slippable material, for example, may comprise the same or different at least partially crystalline material(s) (e.g., single crystal silicon or other thermoelectric material), such as shown in FIG. 38. Similarly, the extending substructures 394 395 may comprise the same or a different atomically ordered or disordered material as the atomically ordered or disordered oscillator/resonator region 392.

In this particular implementation, the base material region 396 and the one or more extending substructures 394 may be further disposed within a matrix 398 of atomically ordered or disordered material (e.g., an amorphous matrix) In one particular implementation, for example, a matrix 398 of amorphous material may comprise a soft amorphous material within which the base material region and the one or more extending substructures are disposed (e.g., encased, surrounded or the like), although other implementations are also contemplated. In various implementations, for example, the base material region 396 and extending substructures 394 may be surrounded in one, two or three-dimensions (e.g., surrounded at least in part or fully surrounded).

The surrounding matrix 398 material in this configuration may further act as one or more oscillators/resonators where each atom in the atomically disordered (e.g., amorphous) surrounding material exhibits three natural frequencies/hybridizing resonances. The oscillators/resonators formed by the surrounding atomically disordered material may generate a plurality of local vibration modes that interact with a plurality of phonons moving through the base material channel(s) and slow the group velocities of at least a portion of the interacting phonons, and, possibly, cause mode localization and/or increased phonon scattering. Further, thermal transport through the base material may be reduced while at least substantially allowing electron transport through one or more base material channel(s).

The surrounding matrix 398 material, regardless of whether it is a crystalline, at least partially crystalline or atomically disordered material, may further be used to convert a reduced dimension structure (e.g., a 2D or 1D base material) into a 3D bulk phononic metamaterial that may be used in standard thermoelectric devices, such as the one shown in FIG. 35. Where the surrounded composite material includes extending substructures adapted to move to provide one or more hybridizing resonances, the surrounding matrix material may comprise a relatively soft, flexible or other material, such as a polymer material for example, adapted to allow those extending substructures to move at least at an atomic scale.

Although one particular structure of the base material region and extending substructures are shown in FIG. 38 similar to the structure shown in FIG. 36, any of the other structures disclosed herein (e.g., FIGS. 2, 3, 9, 10, 11, 12, 13, 16, 17, 18, 19, 20, 22, 23), may similarly be disposed within one or more matrix of amorphous or soft material.

In these implementations, for example, the outer matrix(ces) may provide local resonances (stemming from atomic and structural motion) that further interact with phonons passing through the transport region of the base material that may decrease the group velocities of the phonon(s) and reduce the thermal conductivity of the composite material, and, possibly, cause mode localization and/or increased phonon scattering.

Figure 39:
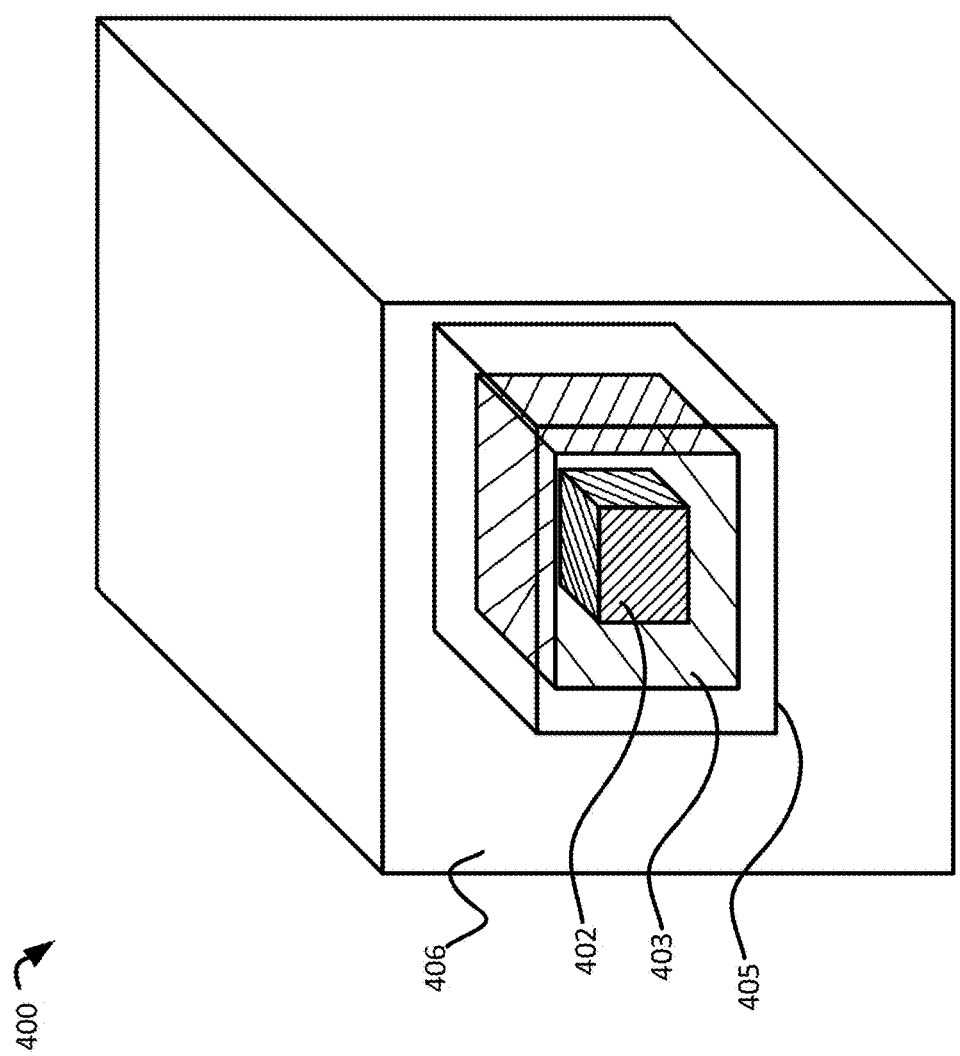
FIGS. 39, 40A and 40B depict another example implementation of a bulk composite material including a phononic metamaterial.
Figure 40A:
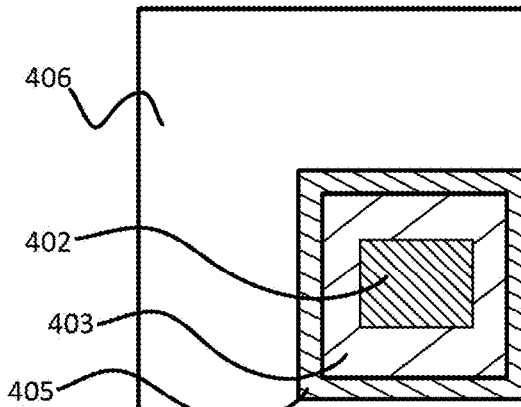
Figure 40B:
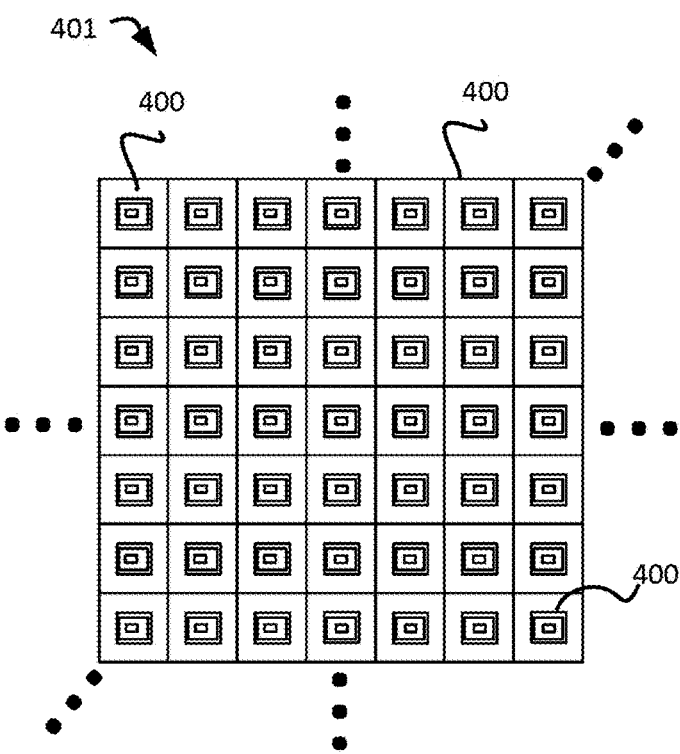

FIGS. 39, 40A and 40B depict another example implementation of a bulk composite material 400 including a phononic metamaterial. In this particular implementation, for example, the composite material 400 comprises an at least partially crystalline base material 406 and one or more complex inclusion 401 disposed within the base material 406. In one implementation, such as shown in FIGS. 39, 40A and 40B, the complex inclusion 401 comprises an inner inclusion 402 and an outer inclusion 403, although any number of materials, configurations, layers, etc. are possible. The complex inclusion 401, comprising inner and outer components 402, 403, is at least partially surrounded by one or more outer layer 405 or disposed at least partially surrounding the complex inclusion 403. Similarly, an additional layer(s) may be disposed between two or more layers or materials of the complex inclusion 403. In one example implementation, for example, the complex inclusion may comprise a plurality of inclusion materials that together form the equivalent of a mass in a spring resonator as described herein. In other implementations, for example, the outer inclusion (e.g., rubber or polymer) may assist an outer layer 405 to perform the role of a spring in a spring resonator.

The outer layer(s) 405 may include graphite or a similar compliant or slippable material where one or more layer of atoms can slip with respect to each other (e.g., with relatively low force). Graphite, for example, comprises atoms strongly bonded together in one or more direction and weakly bonded (e.g., by van der Waal bonds) in one or more other direction. This combination of bonding features gives the graphite outer layer or inclusion a relatively high melting temperature (e.g., higher than polymers) while also high compliance or softness along certain directions due to the weak, e.g., van der Waal, bonds. The weak bonds enable individual atomic-scale layer(s) of the outer layer(s)/inclusion(s) to slip with respect to other atomic-scale layer(s) of the outer layer(s)/inclusion(s) via compliance or slippage between layers of atoms which gives rise to high compliance or softness. In one example implementation, for example, graphite has these characteristics because it comprises a stack of electrically conducting graphene layers held together by weak van der Waals bonds. These properties allow the outer layer(s)/inclusion(s) to act as a spring holding the complex inclusion 401 which act as a one or more mass. Such a configuration, for example, may give rise to one or more internal resonances within the host (matrix) material of the composite 400. In principle, the number of resonances may be as many as the number of atoms in the inner inclusion(s) multiplied by three (i.e., the number of degrees of freedom per atom). The outer layer(s) 405 and outer inclusion(s) 403 within which the internal inclusion(s) 402 are disposed, for example, may be adapted to alter one or more characteristic of the inner inclusion(s) 402. For example, one or more atomic movements within the complex inclusion 401 and/or outer layer(s)/coating(s)/, which comprises one or more internal inclusion(s) 402 and one or more outer inclusion(s) 403. The complex inclusion may be altered by the inner component inclusion(s) 402 and the outer component inclusion(s) 403 or the interaction therebetween. In one implementation, for example, the internal inclusion(s) 402 may be relatively heavier or denser than the surrounding outer layer(s)/inclusion(s) 403. The outer inclusion(s) and the internal inclusion(s) 402 may be atomically ordered or disordered materials. The complex inclusion may further be at least partially surrounded by a layer 405 of compliant/slippable material, such as graphite, rubber or polymer. As an alternative to an outer layer being made out of graphite or a material with similar atomic compliance or slippage (weak bonds between atomic layers) characteristics, the outer layer(s) 405 and/or outer inclusion(s) 403 may be a soft material such as rubber or other polymers. The internal inclusion(s) 402 and outer layer(s) 405 and outer inclusion(s) 405 can take any shape, such as but not limited to cubes, spheres, or the like. The internal inclusion(s) 402 and outer layer(s) 405 and outer inclusion(s) 403 may alter (e.g., lower or increase) a frequency of resonances stemming from and/or facilitated by the effective spring-mass effect due to the combination of internal inclusion(s) 402 and outer layer(s) 405 and outer inclusion(s) 403. In one particular implementation, for example, the internal inclusion(s) 402 may be relatively heavier or denser than the outer layer(s) 405 and outer inclusion(s) 403 in which it is supported and the outer layer(s) 405 and outer inclusion(s) 403 may comprise a material softer than the internal inclusion(s) 402.

In this particular implementation, a heavier material suspended within a soft material may lead to a lowering of the frequencies of local resonances. Thus, the composite structure(s) (internal inclusion(s) 402, outer inclusion(s) 403 and outer layer(s) 405) may be used to alter one or more hybridizing resonances, which in some implementations, may further increase the effectiveness of reducing thermal conductivity in the surrounding (matrix) transport material by targeting one or more phonons that carry relatively more heat. Further, in some implementations, the combination of the internal inclusion(s) 402, outer inclusion(s) 403 and outer layer(s) 405 may be optimized to produce a distribution of resonances from the internal inclusion(s) 402 and, sometimes, outer inclusion(s) 403 that are effective to reduce thermal conductivity of the surrounding (matrix) transport material and the system as a whole by resonance hybridizations.

In some implementations, for example, one or more material (ordered or disordered) may be disposed within an at least partially crystalline layer, pillar, wall, plate, ring or other structure. The internal inclusions, for example, may be adapted to alter an atomic movement within the at least partially crystalline extending substructure. In other implementations, the extending structures can be made entirely from one or more heavy materials. A relatively heavy or dense material, such as a metal material, for example, may be used to lower a frequency of one or more atomic motion within the extending substructure and, thus, alter hybridizing resonance(s) produced.

Figure 41:
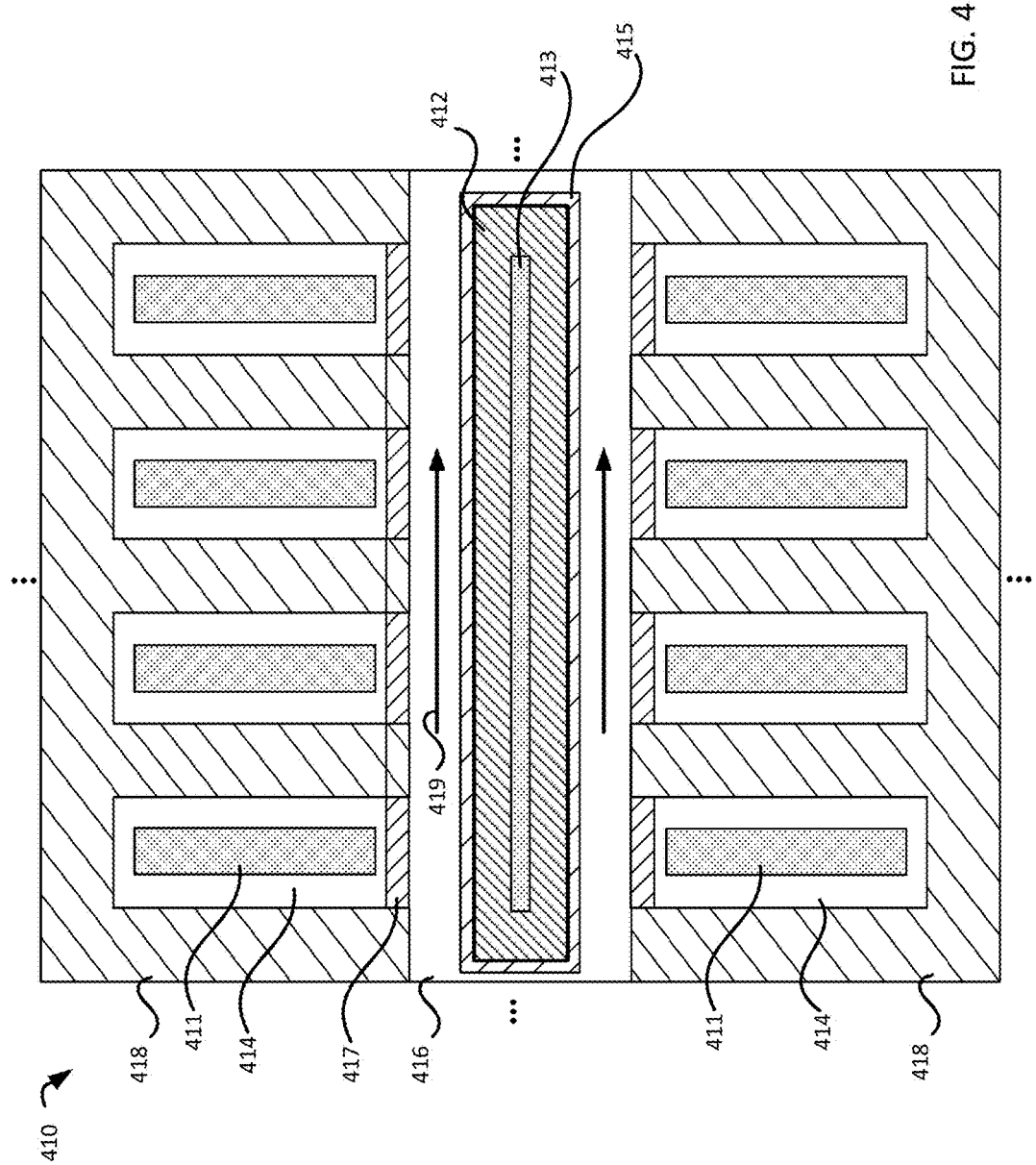
FIG. 41 depicts yet another example implementation of a bulk composite material including a phononic metamaterial.

FIG. 41 depicts yet another example implementation of a bulk composite material 410 including a phononic metamaterial that illustrates a combination of a surrounding atomically ordered or disordered matrix shown in FIG. 38 and the internal inclusions shown in FIGS. 39 and 40 disposed within a continuous atomically ordered or disordered outer inclusion in this implementation. The inclusion(s) are disposed at least partially within a layer 415 of compliant or slippable material. Thus, in this implementation, the composite material 410 includes a base material region 416 comprising an at least partially crystalline transport region 419 defining one or more transport paths (shown by arrows) for carrying electron and phonon flow through the composite material 410. One or more inclusions 412 are disposed at least partially within a layer 415 of compliant or slippable material within the base material region at least generally outside the transport region(s) 419 so as to reduce physical interference with electron flow within the transport region(s) due to the physical interference of the inclusion(s) 412 and layers 415, 417. One or more additional internal inclusions 413 (e.g., additional inclusion(s) disposed inside one or more outer inclusion(s)) are provided. The internal inclusions 413, in this particular implementation, are disposed within a continuous outer inclusion 412 and may be adapted, for example, to alter one or more characteristic of the continuous outer inclusion 412. The internal inclusions 413 disposed within the continuous outer inclusion 112 and a corresponding layer 415 of compliant or slippable material may be adapted to alter one or more atomic movements within the outer inclusions 412. In one implementation, for example, the internal inclusion(s) 413 may be relatively heavier or denser than the surrounding outer inclusion 412. The internal inclusion(s) 413 may be atomically ordered or disordered materials. Similarly, the outer inclusion(s) 403 may be atomically disordered or ordered materials. The outer inclusion may be a soft material such as rubber or other polymers. The internal and outer inclusions can take any shape such as cubes, spheres, or the like. The internal inclusion(s) 413 may alter (e.g., lower or increase) a frequency of resonances stemming from and/or facilitated by the outer inclusions 412 of the composite material. Thus, the composite structure(s) (internal inclusion(s) 413 within an outer inclusion 412) may be used to alter one or more hybridizing resonances, which in some implementations, may further increase the effectiveness of reducing thermal conductivity in the base transport material by targeting one or more phonons that carry relatively more heat. Further, in some implementations, the internal inclusions 413 may be optimized to produce a distribution of resonances from the outer inclusion(s) that are effective to reduce thermal conductivity of the base transport material and the system as a whole by resonance hybridizations.

Further, in some implementations, the inclusions 411 disposed within the extending substructures 414 (e.g., pillar, wall, plate, ring, layer) may be optimized along with one or more respective layers of compliant or slippable material to produce a distribution of resonances that are effective to reduce thermal conductivity of the base transport material and the system as a whole by resonance hybridizations. In other implementations, the extending structures can be made entirely from one or more heavy materials. As can be further seen in FIG. 41, the base material region 416 and extending substructures 414 (e.g., pillars/walls) are also disposed within a matrix 418 of atomically ordered or disordered material In one particular implementation, for example, the matrix 418 of atomically ordered or disordered material may comprise a crystalline, polycrystalline or soft amorphous material within which the base material region and extending substructures (e.g., pillars/walls) are disposed, although other implementations are also contemplated.

The surrounding matrix material in this configuration may further act as one or more oscillators/resonators where each atom in the atomically ordered or disordered surrounding material exhibits three natural frequencies/hybridizing resonances. The oscillators/resonators formed by the surrounding atomically ordered or disordered material may generate a plurality of local vibration modes that interact with a plurality of phonons moving through the base material channel(s) and slow the group velocities of at least a portion of the interacting phonons, and, possibly, cause mode localization and/or increased phonon scattering. Further, thermal transport through the base material may be reduced while at least substantially allowing electron transport through one or more base material channel(s).

In the particular implementation of FIG. 27, for example, the bulk composite material provides hybridizing resonances from extended substructures, atomically ordered or disordered inclusions that may be altered by one or more additional internal inclusions with a layer of compliant and/or slippable material as well as additional hybridizing resonances from the surrounding outer matrix.

FIG. 42 shows yet another implementation of an example bulk composite material 420 including a phononic metamaterial. In this particular implementation, for example, the bulk composite material 420 includes a base material region 426 comprising an at least partially crystalline transport region 429 defining one or more transport paths (shown by arrows) for carrying electron and phonon flow through the composite material 420. One or more atomically ordered or disordered inclusions 422 are disposed at least partially within a layer 425 of a compliant or slippable material and within the base material region 426 at least generally outside the transport region(s) 449 so as to reduce physical interference with electron flow within the transport region(s) 429 due to the physical interference of the inclusion(s) 422 and the layer 425. In this particular implementation, for example, a complex inclusion comprises one or more additional internal inclusions 423 (e.g., a relatively dense or heavy material such as metal, ceramic, nonmetal, etc.) are also disposed within the one or more outer inclusions 422 such as shown in FIG. 41. As discussed above, the internal inclusions 423 and/or inclusions 422 within which the internal inclusions 423 are disposed may be designed to alter (e.g., lower or increase) a frequency of resonances stemming from and/or facilitated by the atomically disordered inclusions of the composite material 420. Similarly, the outer inclusion(s) 403 may be atomically ordered or disordered materials. The outer inclusion may be a soft material such as rubber or other polymers. The internal and outer inclusions can take any shape such as cubes, spheres, or the like. Thus, the composite structure may be used to alter one or more hybridizing resonances to reduce the group velocities of phonons traveling through the transport region of the composite material, and, possibly, cause mode localization and/or increased phonon scattering, which in some implementations, may further increase the effectiveness of reducing thermal conductivity in the base transport material by targeting one or more phonons that carry relatively transport heat.

In this particular implementation, for example, the base material region is disposed within (e.g., between or surrounded by) a matrix 428 of an atomically ordered or disordered material that forms a matrix of atomically ordered or disordered material surrounding the base material region. In this particular implementation, for example, the matrix 428 may comprise a soft material within which the base material region is disposed, although other implementations are also contemplated.

As described above with respect to FIGS. 38 and 41, for example, the outer matrix material may further act as one or more oscillators/resonators where each atom in the atomically ordered or disordered surrounding material exhibits three natural frequencies/hybridizing resonances. The oscillators/resonators formed by the surrounding atomically ordered or disordered material may generate a plurality of local vibration modes that interact with a plurality of phonons moving through the base material channel(s) and slow the group velocities of at least a portion of the interacting phonons, and, possibly, cause mode localization and/or increased phonon scattering. Further, thermal transport through the base material may be reduced while at least substantially allowing electron transport through one or more base material channel(s).

Further, although in some implementations, the surrounding matrix material may comprises an atomically disordered material, for example, the surrounding matrix material may comprise a crystalline or at least partially crystalline material that adapts a 2D or 1D composite material into a bulk 3D composite material such as described above with respect to FIGS. 38 and 41. Further, as shown in FIG. 42, the bulk composite material may comprise a plurality of repeated cells (e.g., unit cells), such as having the structures shown in FIG. 42. Thus, a one, two or three-dimensional composite material structure may be formed by individual unit cells repeated in one, two or three dimensions.

Various features and concepts have been introduced in different Figures for ease of illustration and discussion. One of ordinary skill in the art, based on the present disclosure, would recognize that individual features and concepts shown and described with reference to one or more Figures may similarly be used in combination with other features and concepts described with reference to one or more other Figures. In FIGS. 22-28, for example, combinations or subcombinations of the features may be combined in one or more additional implementations.

Further descriptions of phononic metamaterials and methods for slowing group velocity of phonons traveling within a base material are further described in detail in: B. L. Davis and M. I. Hussein, *Physical Review Letters* 112, 055505 (2014), which is herein incorporated by reference in its entirety as if fully set forth herein. Additional descriptions of nanophononic metamterials and methods for slowing group velocity of phonons traveling within a base material are further described in detail in Honarvar, H. and Hussein, M. I., *Physical Review B,* 93, 081412(R), 2016; Honarvar, H., Yang, L. and Hussein, M. I., *Applied Physics Letters,* 108, 263101, 2016; and Honarvar, H. and Hussein, M. I., "Two orders of magnitude thermal conductivity reduction in silicon membranes by resonance hybridizations," arXiv: 1606.08591.

Although particular applications of phononic metamaterials are described with respect to reducing thermal transport through a base material are described in detail herein, the phononic metamaterials can be used in many other applications. For example, such phononic metamaterials may be used in applications such as, but not limited to applied for thermoelectric energy conversion and other possible applications that utilize the effects induced by the local resonances. Examples of additional applications includes sensors, heat concentrators, heat dissipaters, thermal emitters, semiconductors, superconductors, photovoltaic materials, optomechanical materials, antennas, photonic materials, optical absorbers, lasers, infrared materials, quantum computing, among others.

Although multiple implementations of this invention have been described above with a certain degree of particularity, those skilled in the art could make numerous alterations to the disclosed implementations without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A method for reducing thermal conductivity through an at least partially crystalline base material, the method comprising:
generating a plurality of local vibration modes by oscillation of at least one atom within at least one of:
an inclusion at least partially surrounded by at least one layer of compliant or soft material disposed within the at least partially crystalline base material; and
a substructure comprising at least one material and extending from a surface of the at least partially crystalline base material, wherein at least one layer of compliant or soft material is disposed between the substructure and the at least partially crystalline base material; and interacting at least one of the local vibration modes created by the inclusion or extending substructure with a plurality of phonons moving within the base material to provide at least one of the group comprising: (1) group velocity reduction of heat carrying phonons in the at least partially crystalline base material, (2) mode localization within a resonating region that leads to localizing heat rather than transporting it across the at least partially crystalline base material, and (3) reduction of phonon lifetimes near resonance coupling regions in a phonon band structure.

2. The method of claim 1 wherein the at least one layer of compliant or soft material comprises at least one of the group comprising: graphite, at least one of a rubber material and a polymer material.

3. The method of claim 1 wherein the inclusion is surrounded by at least one of the group comprising: the at least one layer and the at least one layer and one or more voids.

4. The method of claim 1 wherein the plurality of local vibration modes interact with an underlying lattice dispersion of the at least partially crystalline base material and the interaction of the at least one vibration mode and the plurality of phonons reduce the group velocities of the at least a portion of the interacting phonons at and near a coupling in a frequency between each of the vibration modes and the plurality of phonons.

5. The method of claim 1 wherein the slowing of group velocities of at least a portion of the interacting phonons improves a thermoelectric energy conversion figure of merit, ZT.

6. The method of claim 1 wherein the at least partially crystalline base material comprises a plurality of repeated unit cells, each repeated unit cell having at least one inclusion or extending substructure.

7. The method of claim 6 wherein each repeated cell unit comprises at least a plurality of inclusions or extending substructures, the plurality of inclusions or extending substructures varying in at least one of the group comprising: height, cross-sectional area, shape, orientation, material, material composition, material distribution and surface roughness.

8. The method of claim 1 wherein the plurality of inclusions and the at least partially surrounding layers are disposed randomly within the at least partially crystalline base material.

9. The method of claim 1 wherein the base material comprises at least one transport region relatively free of barriers to electron flow through the base material.

10. The method of claim 1 wherein at least one feature size includes one or more of the group comprising a thickness of a thin film, a thickness of a membrane, a cross-sectional size of a wire, a cross-sectional size of a rod, a size of the locally resonant oscillators and a spacing distance between the locally resonant oscillators is at least one of the group comprising: on the order of 1 nanometer to 1 cm or within a mean free path range in the base material.

11. The method of claim 1 wherein the base material and inclusion or extending substructure are surrounded at least in part by an outer matrix to provide a bulk thermoelectric material.

12. The method of claim 1 wherein the inclusion comprises an internal inclusion disposed within the inclusion.

13. A phononic metamaterial structure comprising:
an at least partially crystalline base material configured to allow a plurality of phonons to move to provide thermal conduction through the base material;
at least one of:
an inclusion at least partially surrounded by at least one layer of compliant or soft material disposed within the at least partially crystalline base material, and
a substructure extending from the at least partially crystalline base material, wherein at least one layer of compliant or soft material is disposed between the substructure and the at least partially crystalline base material;
wherein the at least one inclusion or extending substructure is configured to generate at least one vibration mode by oscillation of at least one atom within at least one of the inclusion or extending substructure to provide at least one of the group comprising: (1) group velocity reduction of heat carrying phonons in the at least partially crystalline base material, (2) mode localization within a resonating region that leads to localizing heat rather than transporting it across the at least partially crystalline base material, and (3) reduction of phonon lifetimes near resonance coupling regions in a phonon band structure.

14. The phononic metamaterial structure of claim 13 wherein the at least one layer of compliant or soft material comprises at least one of the group comprising: graphite, a rubber material, and a polymer material.

15. The method of claim 13 wherein the inclusion is surrounded by at least one of the group comprising: the at least one layer and the at least one layer and one or more voids.

16. The phononic metamaterial structure of claim 13 wherein the plurality of local vibration modes interact with an underlying lattice dispersion of the at least partially crystalline base material and the interaction of the at least one vibration mode and the plurality of phonons reduce the group velocities of the at least a portion of the interacting phonons at or near a coupling in a frequency between the vibration modes and the plurality of phonons.

17. The phononic metamaterial structure of claim 13 wherein the at least one inclusion or extending substructure is configured to improve a thermoelectric energy conversion figure of merit, ZT.

18. The phononic metamaterial structure of claim 13 wherein the at least partially crystalline base material comprises a plurality of repeated unit cells, each repeated unit cell having at least one inclusion or extending substructure.

19. The phononic metamaterial structure of claim 18 wherein each repeated cell unit comprises at least a plurality of inclusions or extending substructures, the plurality of inclusions or extending substructures varying in at least one of the group comprising: height, cross-sectional area, shape, orientation, material, material composition, material distribution and surface roughness.

20. The phononic metamaterial structure of claim 13 wherein the plurality of inclusions are disposed randomly within the at least partially crystalline base material.

21. The phononic metamaterial structure of claim 13 wherein the base material comprises at least one transport region relatively free of barriers to electron flow through the base material.

22. The phononic metamaterial structure of claim 13 wherein the metamaterial comprises at least one inclusion disposed within the base material and at least one extending substructure juxtaposed to the base material.

23. The phononic metamaterial structure of claim 13 wherein the base material and inclusion or extending substructure are surrounded at least in part by an outer matrix to provide a bulk thermoelectric material.

24. The phononic metamaterial structure of claim 13 wherein the inclusion comprises an internal inclusion disposed within an outer inclusion and the internal inclusion comprises a material relatively heavier than the outer inclusion that alters one or more frequencies of the local vibration modes.

25. The phononic metamaterial structure of claim 13 wherein the extending substructure comprises a material having a relatively different weight from the base material.

* * * * *